(12) United States Patent
Tamaki et al.

(10) Patent No.: US 8,598,657 B2
(45) Date of Patent: Dec. 3, 2013

(54) SEMICONDUCTOR DEVICE

(75) Inventors: Tomohiro Tamaki, Kanagawa (JP); Yoshito Nakazawa, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/075,834

(22) Filed: Mar. 30, 2011

(65) Prior Publication Data
US 2011/0241111 A1 Oct. 6, 2011

(30) Foreign Application Priority Data

Mar. 31, 2010 (JP) ................................. 2010-081905

(51) Int. Cl.
*H01L 29/66* (2006.01)
(52) U.S. Cl.
USPC .................................. 257/342; 257/E29.256
(58) Field of Classification Search
USPC .......................................... 257/342, E29.256
See application file for complete search history.

(56) References Cited

U.S. PATENT DOCUMENTS

| 6,844,592 B2 * | 1/2005 | Yamaguchi et al. ........... 257/341 |
| 7,420,245 B2 | 9/2008 | Yamashita et al. |
| 7,642,597 B2 | 1/2010 | Saito |
| 2004/0056306 A1 | 3/2004 | Saito et al. |
| 2006/0043481 A1 | 3/2006 | Yamashita et al. |
| 2008/0017897 A1 | 1/2008 | Saito et al. |
| 2008/0135930 A1 | 6/2008 | Saito |
| 2008/0237774 A1 | 10/2008 | Ono et al. |
| 2008/0246079 A1 | 10/2008 | Saito et al. |

FOREIGN PATENT DOCUMENTS

| JP | 2004-119611 A | 4/2004 |
| JP | 2006-066421 A | 3/2006 |
| JP | 2007-300034 A | 11/2007 |
| JP | 2008-091450 A | 4/2008 |
| JP | 2008-124346 A | 5/2008 |
| JP | 2008-258442 A | 10/2008 |

* cited by examiner

*Primary Examiner* — Timor Karimy
(74) *Attorney, Agent, or Firm* — Miles & Stockbridge P.C.

(57) ABSTRACT

Investigation of problems of the device structure of a power MOSFET and mass production of it in relation to high breakdown voltage and low ON resistance when an epitaxy trench filling system is employed has revealed that it has the following problem, that is, a high breakdown voltage as expected cannot be achieved because a P-column region does not have an ideal rectangular parallelepipedal shape but has an inverted trapezoidal shape narrower at the bottom thereof and at the same time, has a concentration distribution lower at the bottom. In order to overcome the problem, the present invention provides a semiconductor device including a power MOSFET portion equipped, in an active cell region thereof, a super junction structure formed by a trench filling system, wherein a base epitaxial layer has a multistage structure with the upper portion having a higher impurity concentration.

17 Claims, 64 Drawing Sheets

SEMICONDUCTOR DEVICE

CROSS-REFERENCE TO RELATED APPLICATIONS

The disclosure of Japanese Patent Application No. 2010-81905 filed on Mar. 31, 2010 including the specification, drawings and abstract is incorporated herein by reference in its entirety.

BACKGROUND OF THE INVENTION

The present invention relates to a technology effective when applied to the device structure and manufacturing process of a power semiconductor device (or semiconductor integrated circuit device).

There is disclosed in Japanese Patent Laid-Open No. 2008-124346 (Patent Document 1) or U.S. Pat. No. 7,642,597 (Patent Document 2) an example of a power MOSFET (metal oxide semiconductor field effect transistors) having a so-called semi-super junction structure, that is, a structure manufactured using a multi-epitaxy system or an epitaxy trench filling system and having a super junction structure introduced halfway through a drift region. According to the description on this example, by creating an impurity profile in which an impurity concentration gradually reduces downward in a P-column region constituting a semi-super junction structure, electric field concentration can be relaxed at the lower end portion of a trench field plate and thereby high breakdown voltage and low ON resistance can be achieved.

There is disclosed in Japanese Patent Laid-Open No. 2004-119611 (Patent Document 3) an example of a power MOSFET having a semi-super junction structure manufactured using mainly a multi-epitaxy system. According to the description on this example, by creating an impurity profile in which an impurity concentration increases gradually downward in an N-column region constituting a semi-super junction structure, a decline in breakdown voltage due to a charge imbalance between the N-column region and P-column region can be reduced.

There is disclosed in Japanese Patent Laid-Open No. 2008-258442 (Patent Document 4) or U.S. Patent Publication No. 2008-246079 (Patent Document 5) an example of a power MOSFET having a semi-super junction structure manufactured using mainly a multi-epitaxy system. According to the description on the example, by creating an impurity profile having a peak at the center portion thereof in an N-column region and a P-column region constituting a semi-super junction structure, depletion at the upper and lower ends is facilitated and thereby electric field concentration is relaxed.

There is disclosed in Japanese Patent Laid-Open No. 2008-91450 (Patent Document 6) or U.S. Patent Publication No. 2008-237774 (Patent Document 7) an example of a power MOSFET having a semi-super junction structure manufactured using mainly a multi-epitaxy system. According to the description on this example, by creating an impurity profile in which an impurity concentration shows a stepwise decrease downward in an N-column region and a P-column region constituting a semi-super junction structure, high breakdown voltage and low ON resistance can be achieved.

There is disclosed in Japanese Patent Laid-Open No. 2007-300034 (Patent Document 8) or U.S. Patent Publication No. 2008-17897 (Patent Document 9) an example of a power MOSFET having a semi-super junction structure manufactured using mainly an epitaxy trench filling system. According to the description on this example, by differentiating the upper width and the lower width between an N-column region and a P-column region constituting a semi-super junction structure (more specifically, by thinning the lower width of the P-column region), diffusion of boron at the lower portion of the column is suppressed and an increase in the ON resistance can be prevented.

There is disclosed in Japanese Patent Laid-Open No. 2006-66421 (Patent Document 10) or U.S. Pat. No. 7,420,245 (Patent Document 11) an example of a power MOSFET manufactured using a multi-epitaxy system and having a so-called full-super junction structure (which may also be called "super junction structure" simply), that is, having a super junction structure introduced therein in such a manner that it penetrates through a drift region. According to the description on this example, each of an N-column region and a P-column region constituting the super junction structure has upper and bottom sections and by increasing the concentration of the upper section, a decrease in breakdown voltage due to a charge imbalance between the N-column region and the P-column region can be reduced.

[Patent Document 1] Japanese Patent Laid-Open No. 2008-124346

[Patent Document 2] U.S. Pat. No. 7,642,597

[Patent Document 3] Japanese Patent Laid-Open No. 2004-119611

[Patent Document 4] Japanese Patent Laid-Open No. 2008-258442

[Patent Document 5] U.S. Patent Publication No. 2008-246079

[Patent Document 6] Japanese Patent Laid-Open No. 2008-91450

[Patent Document 7] U.S. Patent Publication No. 2008-237774

[Patent Document 8] Japanese Patent Laid-Open No. 2007-300034

[Patent Document 9] U.S. Patent Publication No. 2008-17897

[Patent Document 10] Japanese Patent Laid-Open No. 2006-66421

[Patent Document 11] U.S. Pat. No. 7,420,245

SUMMARY OF THE INVENTION

With regards to the drift region of a power MOSFET or the like, development of a high breakdown voltage FET (for example, having a source-drain breakdown voltage of about 650 V or greater) having a low ON resistance, while circumventing restrictions due to a conventional silicon limit is a priority issue. Various methods have therefore been developed for introducing into the drift region a super junction structure having alternately an N-column region and a P-column region each in the slab form and having a relatively high concentration. There are roughly three methods for introducing the super junction structure. They are a multi-epitaxy system, a trench insulating film filling system, and an epitaxy trench filling system (trench filling system or epitaxy trench filling system). Of these, a multi-epitaxy system in which epitaxial growth and ion implantation are repeated many times has a high degree of freedom in process and design, which however requires complicated steps and therefore raises its cost. The trench insulating film filling system, on the other hand, is a system in which after oblique ion implantation in a trench, the trench (a trench for filling a P-column region therein) is filled with a CVD (chemical vapor deposition) insulating film. It is a simple process, but is disadvantageous in view of the area occupied by the trench.

In the epitaxy trench filling system, on the other hand, after formation of a trench in an epitaxial layer (which is called "base epitaxial layer") serving as a base, a column region having a conductivity type opposite thereto is formed therein by trench filling epitaxial growth. Although the degree of freedom in process and design is relatively low due to restrictions of the epitaxy trench filling conditions, the system is advantageous in that its steps are simple. With a view to achieving a high breakdown voltage and low ON resistance in the epitaxy trench filling system, the present inventors therefore studied problems relating to the device structure of a power MOSFET and mass production of it. As a result, it has been elucidated that since the P-column region does not have an ideal rectangular parallelepiped but has an inverted trapezoid narrower toward the bottom and at the same time, has a concentration distribution lower toward the bottom, the withstand voltage does not become so high as expected.

The invention of the application has been made in order to overcoming these problems.

An object of the present invention is to provide a semiconductor device such as a power solid active device having a high breakdown voltage and low ON resistance.

These and other objects and novel features of the invention will become apparent from the description herein and accompanying drawings.

Typical inventions disclosed in the present application will next be outlined briefly.

In one mode of the invention of the application, there is provided a semiconductor device (power MOSFET, IGBT, or the like) with a power MOSFET portion having in an active cell region thereof a super junction structure formed by using a trench filling system, wherein a base epitaxial layer has a multi-stage structure (including a two-stage structure) in which an upper stage has a high impurity concentration.

An advantage available by the typical invention disclosed herein will next be described briefly.

Described specifically, in a semiconductor device including a power MOSFET portion having, in an active cell portion thereof, a super junction structure formed using a trench filling system, the imbalance of an impurity concentration between the upper portion and the lower portion of the column can be reduced by forming a base epitaxy layer having a multistage structure (including a two-stage structure) with the upper portion thereof higher in the impurity concentration.

DETAILED DESCRIPTION OF THE PREFERRED EMBODIMENTS

Figure 1:
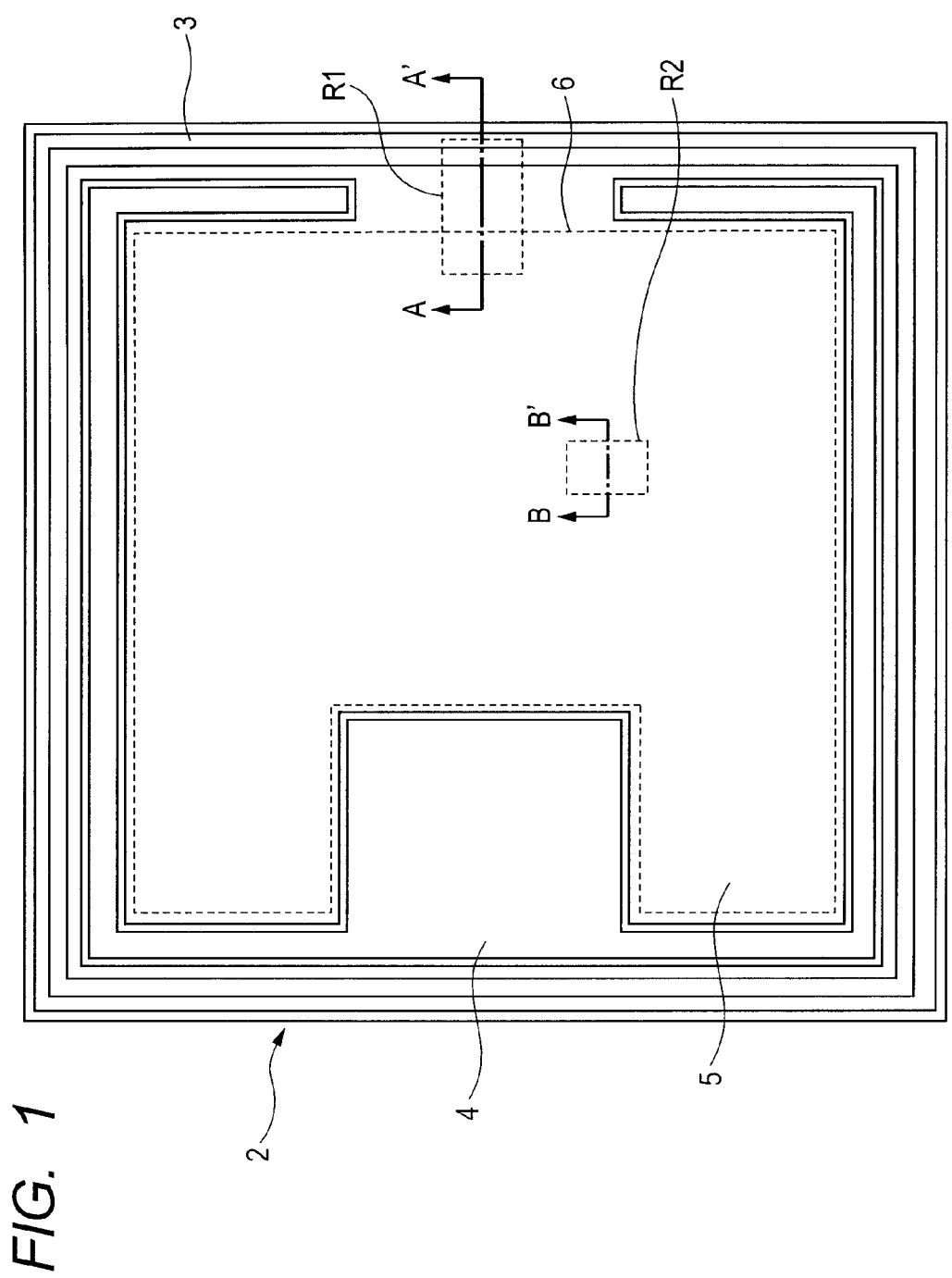
FIG. 1 is an overall top view of a semiconductor chip according to a first embodiment (common to each embodiment) of the present application.

Typical embodiments of the present invention disclosed in the present application will next be summarized.

1. A semiconductor device having: (a) a semiconductor chip having a first main surface and a second main surface and including a power MOSFET; (b) a source electrode of the power MOSFET provided on the first main surface side of the semiconductor chip; (c) a drift region of the power MOSFET provided in the surface of the semiconductor chip on the first main surface side and having a first conductivity type; (d) a plurality of trenches penetrating through the drift region from the first main surface side of the semiconductor chip; (e) a plurality of second conductivity type column regions embedded in the trenches by epitaxial growth, respectively, and having a second conductivity type opposite to the first conductivity type; (f) a plurality of first conductivity type column regions provided between any two of the second conductivity type column regions, constituting a super junction structure together with the second conductivity type column regions, and having the first conductivity type; wherein each of the first conductivity type column regions has; (f1) a lower layer region having a first impurity concentration and (f2) an upper layer region present between the lower layer region and the first main surface and having a second impurity concentration higher than the first impurity concentration.

2. The semiconductor device as described above in 1, wherein the drift region is a conventional epitaxial layer.

3. The semiconductor device as described above in 1 or 2, wherein each of the first conductivity type column regions further includes: (f3) a middle layer region present between the lower layer region and the upper layer region and having a third impurity concentration between the first impurity concentration and the second impurity concentration.

4. The semiconductor device as described above in any of 1 to 3, wherein supposing that the first conductivity type column region is a single region, the first impurity concentration is a concentration at which the second conductivity type column region and the first conductivity type column region keep a charge balance.

5. The semiconductor device as described above in 1 or 2, wherein supposing that the first conductivity type column region is a single region, the first impurity concentration is lower than a concentration at which the second conductivity type column region and the first conductivity type column region keep a charge balance.

6. The semiconductor device as described above in any one of 1 to 5, wherein the concentration of the upper layer region is increased by implanting therein impurity ions having the first conductivity type.

7. The semiconductor device as described above in any one of 1 to 6, wherein the semiconductor chip has a silicon-based member as a principal constituent.

8. The semiconductor device as described above in any one of 1 to 7, wherein the first conductivity type is an N type.

9. The semiconductor device as described above in any one of 1 to 8, wherein the semiconductor chip constitutes a simple or composite power active device.

10. The semiconductor device as described above in any one of 1 to 9, wherein the semiconductor chip constitutes a simple power MOSFET device.

11. The semiconductor device as described above in any one of 1 to 10, wherein the power MOSFET is a planar type.

12. The semiconductor device as described above in any one of 1 to 10, wherein the power MOSFET is a trench type.

13. The semiconductor device as described above in any one of 1 to 12, wherein the second conductivity type column region has an inverted trapezoidal shape wider on the first main surface side.

14. The semiconductor device as described above in any one of 1, 2, and 4 to 13, wherein the lower layer region is thicker than the upper layer region.

15. The semiconductor device as described above in any one of 1, 2, and 4 to 13, wherein the lower layer region is thinner than the upper layer region.

16. The semiconductor device as described above in any one of 1 to 15, further includes: (g) a second conductivity type body region formed in the surface region of the drift region on the first main surface side of the semiconductor chip and constituting a channel region of the power MOSFET; (h) a gate insulating film formed over the surface of the second conductivity type body region on the first main surface side of the semiconductor chip; and (i) a gate electrode formed on a side opposite to the second conductivity body region with the gate insulating film therebetween and having a polysilicon film as a main constituent.

17. The semiconductor device as described above in 16, wherein the second conductivity type body region is introduced prior to the formation of the polysilicon film.

18. A semiconductor device having: (a) a semiconductor chip having a first main surface and a second main surface and including a power MOSFET; (b) a source electrode of the power MOSFET provided on the first main surface side of the semiconductor chip; (c) a drift region of the power MOSFET provided in the surface of the semiconductor chip on the first main surface side and having a first conductivity type; (d) a plurality of second conductivity type column regions penetrating through the drift region from the first main surface side of the semiconductor chip and having a second conductivity type opposite to the first conductivity type; (e) a plurality of first conductivity type column regions provided between the second conductivity type column regions, constituting a super junction structure together with the second conductivity type column regions, and having the first conductivity type; (f) a second conductivity type body region formed in the surface region of the drift region on the first main surface side of the semiconductor chip, having the second conductivity type, and constituting a channel region of the power MOSFET; (g) a gate insulating film formed over the surface of the second conductivity type body region on the first main surface side of the semiconductor chip, and (h) a gate electrode formed on a side opposite to the second conductivity type body region with the gate insulating film therebetween and having a polysilicon film as a main constituent, wherein the second conductivity type body region is introduced prior to the formation of the polysilicon film.

19. The semiconductor device as described above in 18, wherein the first conductivity type column regions each including: (e1) a lower layer region having a first impurity concentration, and (e2) an upper layer region present between the lower layer region and the first main surface and having a second impurity concentration higher than the first impurity concentration.

20. The semiconductor device as described above in 18 or 19, wherein the drift region is a conventional epitaxial layer.

[Explanation of Description Manner, Basic Terms, and Usage in the Present Application]

1. In the present application, a description in the embodiments may be made after divided in plural sections if necessary for convenience's sake. These plural sections are not independent of each other, but they may each be a part of a single example or one of them may be a partial detail of the other or a modification example of a part or whole of the other one unless otherwise specifically indicated. In principle, a description on a portion similar to that described before is not repeated. Moreover, when a reference is made to constituent elements in the embodiments, they are not essential unless otherwise specifically indicated, limited to the number theoretically, or principally apparent from the context that it is not.

Further, the term "semiconductor device" as used herein means mainly a simple or composite power active device (meaning usually a device capable of treating electricity of several W or greater) obtained by integrating various transistors (active elements) alone or integrating, with these transistors as a main component, resistors, capacitors, and the like over a semiconductor chip or the like (for example, a device in the form of a rectangular sheet or the like having a silicon-based member such as single crystal silicon substrate as a base material). Typical examples of the various transistors include MISFET (metal insulator semiconductor field effect transistor) typified by MOSFET (metal oxide semiconductor field effect transistor). Typical examples of a simple transistor include power MOSFET and IGBT (insulated gate bipolar transistor).

The power MOSFET is roughly classified into a vertical one and a lateral one (which can also be applied to IGBT principally). This vertical power MOSFET or the like can be classified further into a planar one and a trench one. In the present application, the planar power MOSFET and the trench power MOSFET will be described specifically.

2. Similarly, with regard to any material, any composition or the like in the description of the embodiments, the term "X made of A" or the like does not exclude X having, as one of the main constituents thereof, an element other than A unless otherwise specifically indicated or principally apparent from the context that it is not. For example, the term "X made of A" means that "X has A as a main component thereof". It is needless to say that, for example, the term "silicon member" is not limited to a member made of pure silicon but also a member containing a SiGe alloy, a member containing another multi-element alloy having silicon as a main component, such a member containing an additive, or the like. Similarly, it is needless to say that the term "silicon oxide film", "silicon oxide insulating film", or the like means not only a relatively pure undoped silicon dioxide film but also an FSG (fluorosilicate glass) film, a TEOS-based silicon oxide film, an SiOC (silicon oxycarbide) film, or a carbon-doped silicon oxide film, a thermal oxide film such as OSG (organosilicate glass) film, PSG (phosphorus silicate glass) film, or BPSG (borophosphosilicate glass) film, a CVD oxide film, a silicon oxide film obtained by the method of application such as SOG (spin on glass) film or nano-clustering silica (NSC) film, a silica-based low-k insulating film (porous insulating film) obtained by introducing pores into a member similar to the above-mentioned ones, and a composite film comprised of the above-mentioned film as a principal constituent and another silicon insulating film.

In addition, examples of silicon insulating films conventionally used in the semiconductor field include, as well as silicon oxide insulating films, silicon nitride insulating films. Materials which belong to these silicon nitride insulating films include SiN, SiCN, SiNH, and SiCNH. The term "silicon nitride" as used herein means both SiN and SiNH unless otherwise specifically indicated that it is not. Similarly, the term "SiCN" means both SiCN and SiCNH unless otherwise specifically indicated that it is not.

Incidentally, SiC and SiN have similar properties, but in many cases, SiON should be classified rather as a silicon oxide insulating film.

3. Preferred examples of the shape, position, attribute, and the like will be shown, however, it is needless to say that they are not strictly limited to the preferred examples unless otherwise specifically indicated or apparent from the context that they are not.

4. When a reference is made to a specific number or amount, the number or amount may be greater than or less than the specific number or amount unless otherwise specifically indicated, limited to the specific number or amount theoretically, or apparent from the context that it is not.

5. The term "wafer" usually means a single crystal silicon wafer over which a semiconductor device (which may be a semiconductor integrated circuit device or an electronic device) is to be formed. It is however needless to say that it embraces a composite wafer of a semiconductor layer and an insulating substrate such as epitaxial wafer, SOI substrate, or LCD glass substrate.

6. The term "super junction structure" usually means a structure having, in a semiconductor region of a certain conductivity type, columnar or plate-like column regions having a conductivity type opposite thereto introduced at almost equal intervals to keep a charge balance. In the present application, when a reference is made to "a super junction structure" formed using a trench filling system, it means, in principle, a structure having, in a semiconductor region of a certain conductivity type, "column regions" having a conductivity type opposite thereto and in the plate form (usually, in the flat plate form but may be in the bent or refracted plate form) introduced at almost equal intervals to keep a charge balance. In the embodiments, a structure having, in an N type semiconductor layer (for example, a drift region) thereof, P-columns at equal intervals and in parallel to each other will be described.

In the present application, with regard to a resurf (reduced surface field) structure or a junction edge termination structure, the term "junction edge extension" or "surface resurf region" (specifically, "P-resurf region") means a region formed in the surface region of a drift region, linked to the end portion of a P-body region (P-well region) constituting a channel region, and having the same conductivity type and a lower impurity concentration than that of the P-body region. It is usually formed in the ring form so as to surround a cell portion. In the present application, an N type is called "first conductivity type", while a P type is called "second conductivity type".

[Details of Embodiments]

Embodiments will next be described more specifically. In all the drawings, the same or like members will be identified by the same or like symbols or reference numerals and overlapping descriptions will be omitted in principle.

In the accompanying drawings, hatching is sometimes omitted even from a cross-sectional view when it makes the view complicated or discrimination from the void is apparent. In this context, even when a hole is closed in a planar view, the profile line of the background of the hole may be omitted if it can be understood clearly from the description or the like. Further, hatching is sometimes used to clearly show that it is not a void even in a view other than a cross-section.

In each drawing, the number of P-columns, for example, in a peripheral side region, is from about 3 to 5 for convenience of illustration, but it sometimes exceeds about 10 in practice. A description will be made with a product having a breakdown voltage of several hundred volts as an example. Products having a breakdown voltage of about several hundred volts (specifically, for example, 200 V or 600 V) will next be described as the example.

Prior patent application disclosing a power MOSFET using a super junction structure is, for example, Japanese Patent Application No. 2009-263600 (filed on Nov. 19, 2009 in Japan).

In the embodiments described below, it is intended to manufacture a vertical power device having an increased breakdown voltage in the following manner. Described specifically, in introducing a super junction structure into a drift region through a trench filling system (it is principally difficult to constitute a buried epitaxial region from many vertically stacked layers by using trench filling), an epitaxial layer (not a buried epitaxial layer but an ordinary epitaxial layer, that is, an ordinary epitaxial layer or a base epitaxial layer) of an epitaxial wafer is formed as a multilayer (having an upper layer with a higher concentration) in advance or as a single epitaxial layer having, in the upper portion thereof, an increased concentration by doping an impurity into the upper portion selectively, whereby an electric field strength distribution with a plurality of peaks is formed in the drift region and a high breakdown voltage can therefore be achieved. The total number of layers of the multilayer structure is usually from about 2 to 5 in consideration of the limitation in step, but the concentration may be changed continuously.

From another viewpoint, the structure shown herein can correct a charge imbalance inevitably resulting from the cross-section of the column region, which does not have an ideal rectangular parallelepiped but has a trapezoid or an inverted trapezoid, by forming a base epitaxial layer as a multilayer. Taking an N type base epitaxial layer as an example, an N-column region is trapezoidal, a P-column region is inverted trapezoidal, and the concentration in the lower portion of the P-column region decreases further due to diffusion caused by heat treatment in a trench filling epitaxy step. Accordingly, the horizontal density of a charge amount in the column region shows, from the upper portion to the lower portion, a relationship between a monotonous increase and a monotonous decrease and there is a charge balance only at the center portion. The electric field strength distribution shows a transversely-situated triangle and the breakdown voltage decreases greatly compared with an ideal rectangular distribution. In each example shown below, therefore, the electric field strength distribution is made close to a rectangular distribution by forming the N-column region as a multilayer (including a single layer having concentrations changed continuously therein, but the change in concentration is preferably not continuous), thereby obtaining an electric field strength distribution with a plurality of peaks. It is however recommended to locate the peaks in the internal region because forming a high electric field region in the vicinity of the upper and lower end portions is disadvantageous in consideration of the breakdown voltage.

1. Description of a device structure (N+/N two-stage conventional epitaxy system) of a planar power MOSFET, which is an example of the semiconductor device according to the first embodiment of the present application, (mainly from FIG. 1 to FIG. 6). In this example, a planar power MOSFET fabricated over a silicon semiconductor substrate and having a source-drain breakdown voltage of about 600 V will be described specifically (a planar power MOSFET is similar to it in the following sections). It is however needless to say that the description can be applied to a power MOSFET or another device having a breakdown voltage different from the above one.

Figure 2:
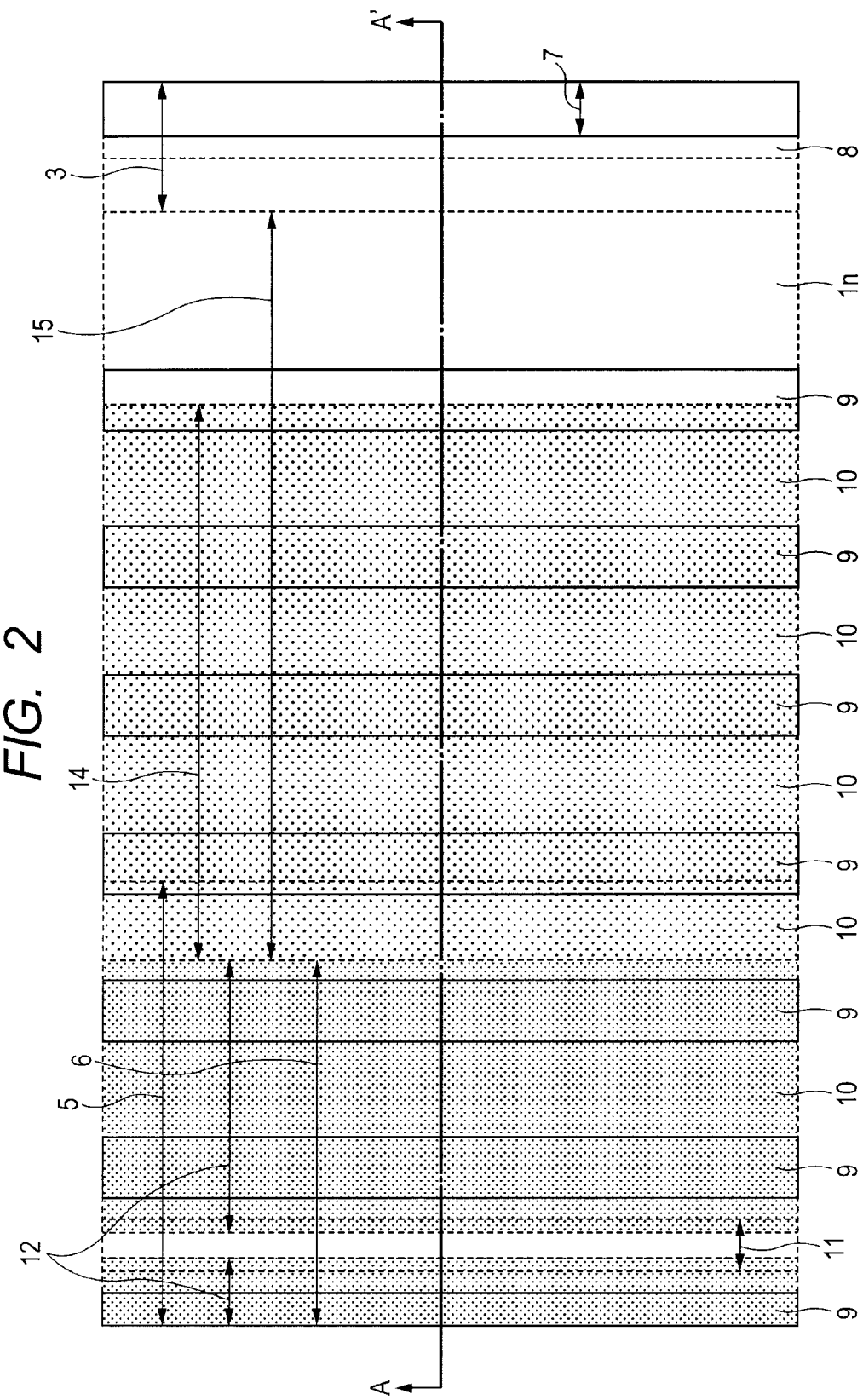
FIG. 2 is an enlarged plan view of an internal structure corresponding to a cutout portion R1 of the regions of an active cell end portion and a chip peripheral portion illustrated in FIG. 1.
Figure 3:
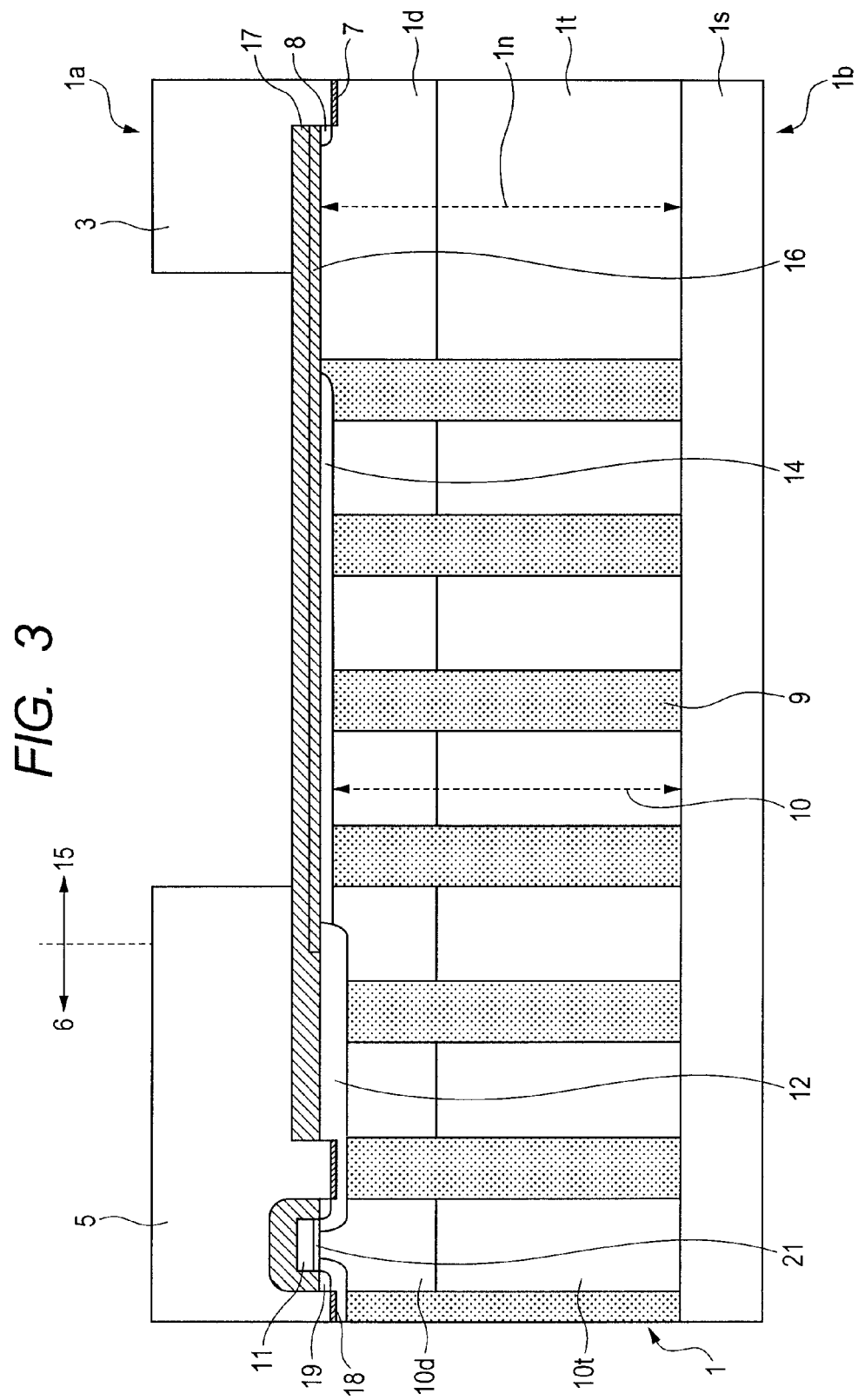
FIG. 3 is a device cross-sectional view corresponding to the A-A' cross-section of FIG. 1 and FIG. 2.
Figure 4:
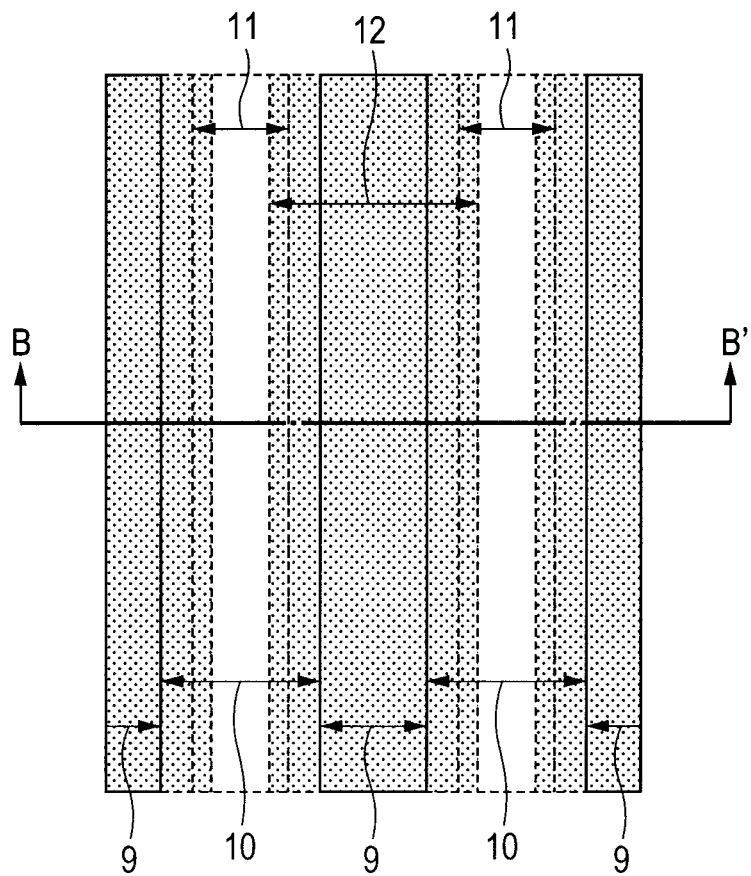
FIG. 4 is an enlarged plan view of an internal structure corresponding to a cutout portion R2 at the center portion of the active cell illustrated in FIG. 1.
Figure 5:
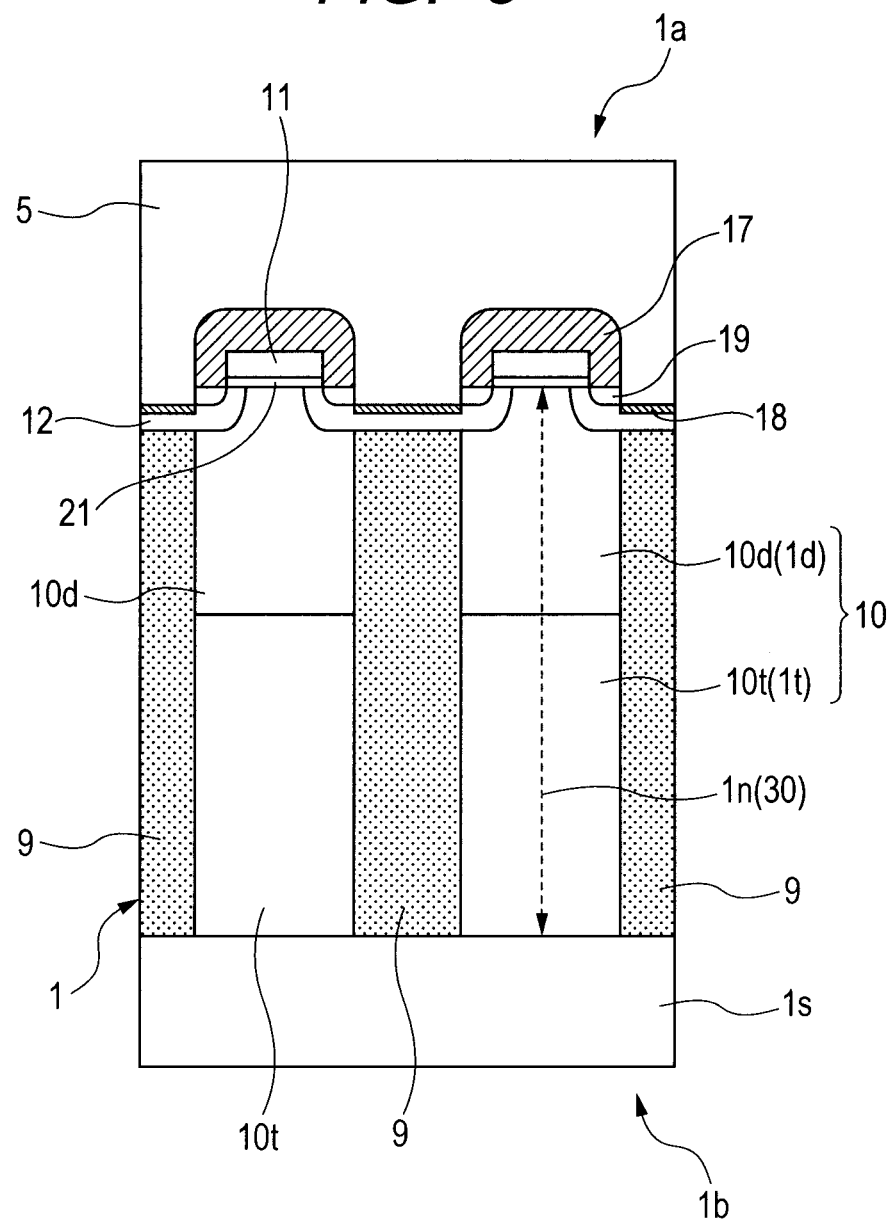
FIG. 5 is a device cross-sectional view corresponding to the B-B' cross-section of FIG. 1 and FIG. 2.
Figure 6:
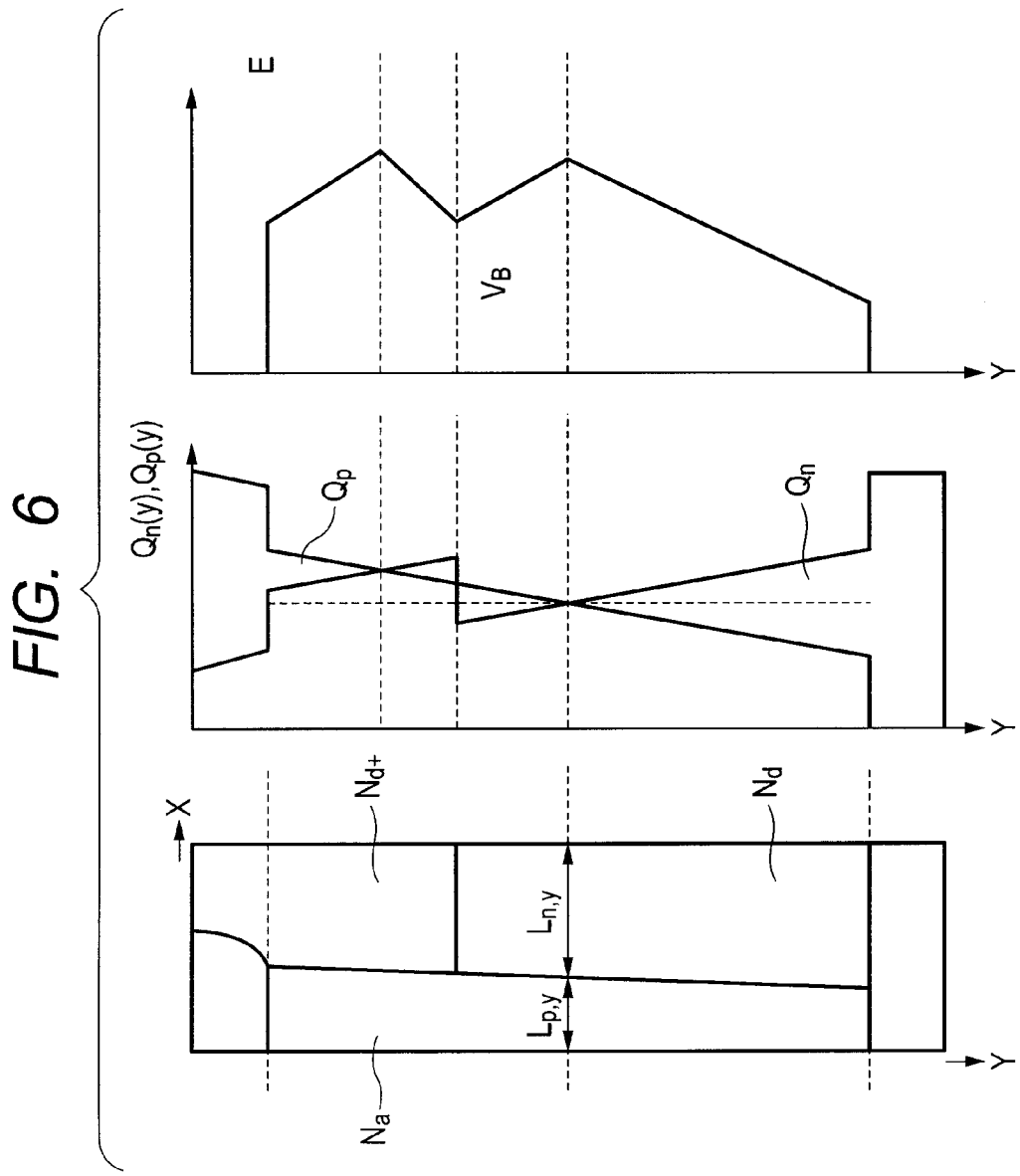
FIG. 6 is an explanatory view (an impurity region structure in the semiconductor substrate is illustrated on the left side, each charge distribution in the direction y is illustrated in the center, and the distribution of an absolute value of an electric field strength in the direction y is illustrated on the right side) of a charge distribution or the like of a super junction structure, corresponding to a half pitch portion thereof, of a drift region in the active cell region illustrated in FIG. 5.

FIG. 1 is an overall top view of a semiconductor chip (silicon-based member chip) according to a first embodiment (common to each embodiment) of the present application. FIG. 2 is an enlarged plan view of an internal structure corresponding to a cutout portion R1 of the regions of an active cell end portion and a chip peripheral portion illustrated in FIG. 1. FIG. 3 is a device cross-sectional view corresponding to the A-A' cross-section of FIG. 1 and FIG. 2 (the P-column region has, in fact, an inverted trapezoidal shape and has a side surface inclined at from 89 to 89.5 degree relative to a perpendicular line). FIG. 4 is an enlarged plan view of an internal structure corresponding to a cutout portion R2 at the center portion of the active cell illustrated in FIG. 1. FIG. 5 is a device cross-sectional view corresponding to the B-B' cross-section of FIG. 1 and FIG. 2. FIG. 6 is an explanatory view (an impurity region structure in the semiconductor substrate is illustrated on the left side, each charge distribution in the direction y is illustrated in the center, and the distribution of an absolute value of an electric field strength in the direction y is illustrated on the right side) of a charge distribution or the like of a super junction structure, corresponding to a half pitch portion, of a drift region in the active cell region illustrated in FIG. 5. Referring to these drawings, the device structure (N+/N two-stage conventional epitaxy system) of a planar power MOSFET, an example of the semiconductor device according to the first embodiment of the present application will next be described.

First, an overall layout of a chip (simple or composite power active device) will be described referring to FIG. 1. As illustrated in FIG. 1, the chip 2 has, at the peripheral portion thereof, a guard ring 3 and a gate metal electrode 4 is provided inside the guard ring. The chip 2 is, at the center portion thereof, occupied with a source metal electrode 5 and an active cell region 6 is formed in almost the whole area below the source metal electrode 5.

Next, an enlarged view of the planar structure of the surface region of the semiconductor substrate, below the source metal electrode 5, of the cutout portion R1 of the regions of the cell end portion and the chip peripheral portion of the chip 2 illustrated in FIG. 1 is illustrated in FIG. 2. As illustrated in FIG. 2, the guard ring 3 has, on the outer portion thereof, an outermost P+ region 7 and is usually coupled to a drain potential via an N+ channel stopper region 8. A region inner than the guard ring 3 is separated into the active cell region 6 and an edge termination region 15 (cell peripheral region) and in an N type silicon epitaxial layer 1n in these regions, a P-column region 9 and an N-column region 10 are provided alternately with certain intervals. The edge termination region 15 has, in the surface layer portion thereof, a P-resurf region 14 (of course, they are not essential) for reducing an electric field concentration in the surface. On the other hand, on the surface of the semiconductor substrate in the active cell region 6, a polysilicon gate electrode 11 is placed. A P-body region 12 constituting a channel region or the like is provided so as to partially overlap with the polysilicon gate electrode 11.

Next, a device cross-sectional view corresponding to the A-A' cross-section of FIG. 2 is illustrated in FIG. 3. As illustrated in FIG. 3, the semiconductor substrate 1 over which this device is to be formed has a conventional epitaxial layer 1n composed of two layers, that is, an N type lower-layer silicon epitaxial layer 1t and an N type upper-layer silicon epitaxial layer 1d over an N+ type single-crystal silicon substrate is (on the back surface side 1b of the semiconductor substrate 1). Accordingly, the N type upper-layer column region 10d constituting the N-column region 10 is a part of the N type upper-layer silicon epitaxial layer 1d and similarly, the N type lower-layer column region 10t constituting the N-column region 10 is a part of the N type lower-layer silicon epitaxial layer 1t. The semiconductor substrate 1 has, on the surface 1a side thereof, a field insulating film 16 and a gate insulating film 21 and the gate insulating film 21 has thereover the polysilicon gate electrode 11. The field insulating film 16 and the polysilicon gate electrode 11 are covered with the interlayer insulating film 17. In the surface region on the surface 1a side of the semiconductor substrate 1, an N+ source region 19 is formed in self alignment with the polysilicon gate electrode 11 (incidentally, the N+ channel stopper region 8 is usually formed simultaneously in this step). The semiconductor substrate 1 has, in the surface region on the surface side 1a thereof, a P+ body contact region 18 corresponding to a contact hole made in the interlayer insulating film 17 at the periphery of the polysilicon gate electrode 11. The outermost P+ region 7 is usually formed in this step simultaneously. Further, the interlayer insulating film 17 has thereover the guard ring 3, the source metal electrode 5, and the like comprised of a barrier metal film, an aluminum-based metal electrode film, and the like. A region outside the vicinity of the outer end portion of the P body region 12, which is at the end portion of the active cell region 6, is the cell peripheral region 15.

Next, an enlarged view of the planar structure of the surface region of the semiconductor substrate below a cutout portion R2 at the center portion of the cell of the chip 2 illustrated in FIG. 1 is shown in FIG. 4. As illustrated in FIG. 4, layout of the active cell region 6t is formed with parallel symmetry (periodicity) in a horizontal direction. A plurality of linear or strip-shaped P-column regions 9 and N-column regions 10, a P-body region 12, and polysilicon gate electrodes 11 are provided in repetition.

Next, the B-B' cross-section of FIG. 4 is illustrated in FIG. 5. As illustrated in FIG. 5, a semiconductor substrate 1 has, over an N+ type single-crystal silicon substrate is thereof, an N type silicon epitaxial layer 1n (a drift region 30 in terms of the function as a device) and the N type silicon epitaxial layer 1n is embedded with a plurality of P-column regions 9 penetrating therethrough. The N type silicon epitaxial layer 1n between two P-column regions 9 adjacent to each other acts as an N-column region 10 and each N-column region 10 is comprised of an N type lower-layer column region 10t and an N type upper-layer column region 10d. In this example, the impurity concentration of the N type lower-layer column region 10t is set so as to roughly keep a charge balance with the P-column region 9 (this donor concentration is represented by "Nd", but this does not apply to the concentration notation of members other than the column). On the other hand, the impurity concentration of the N type upper-layer column region 10d is set at a donor concentration a little higher than the impurity concentration of the N type lower-layer column region 10t (this donor concentration is represented by "Nd+", but this does not apply to the concentration notation of a member other than the column). The impurity concentration Na of the P-column region 9 is usually set at a predetermined value. In fact, however, it tends to be lower at the lower portion of the region, depending on the heat treatment time.

Next, an electrical structure of the semiconductor substrate 1 in the cell structure illustrated in FIG. 5 is shown in FIG. 6. In FIG. 6, an impurity structure (half pitch of a repetition cycle) is illustrated on the left side, a charge distribution (half pitch of a repetition cycle) is illustrated at the center, and an electric field strength distribution (absolute value of an electric field strength in the vicinity of a boundary between the P-column region 9 and the N-column region 10 and in the vicinity of the extension of the boundary) is illustrated on the right side of the drawing. As illustrated in FIG. 6, the width Lp,y of the P-column region 9 has a tapered shape narrowing toward the bottom thereof. The width Ln,y of the N-column region 10 has, on the contrary, a tapered shape narrowing toward the top. As a result, the distribution Qn(y) of a donor and the distribution Qp(y) of an acceptor (areas of portions surrounded with a polygonal line and the Y axis are a total amount Qn of the donor and a total amount Qp of the acceptor) in the minimum target unit region (left side of FIG. 6) between the vertical center plane of the P-column region 9 and the vertical center plane of the N-column region 10 adjacent thereto, which are symmetrical each other, are as shown in the center of FIG. 6. It can be found that there are two points at which a correct charge balance can be kept. As illustrated on the right side of FIG. 6, two maximum points (peak points) corresponding to these two points appear in the distribution of an electric field strength E. Compared with the case where the distribution has only one peak point (meaning that the N-column region 10 is composed of a region having only one concentration), a source-drain breakdown voltage Vb (the area of a portion surrounded with the polygonal line and the Y axis) can be improved.

2. Description of the major part of a wafer process in a manufacturing method of the semiconductor device according to the first embodiment of the present application (mainly, from FIG. 7 to FIG. 21 and from FIG. 22 to FIG. 34). In this section, the major part of a wafer processing process will be described with the device cross-section illustrated in FIG. 3.

Figure 7:
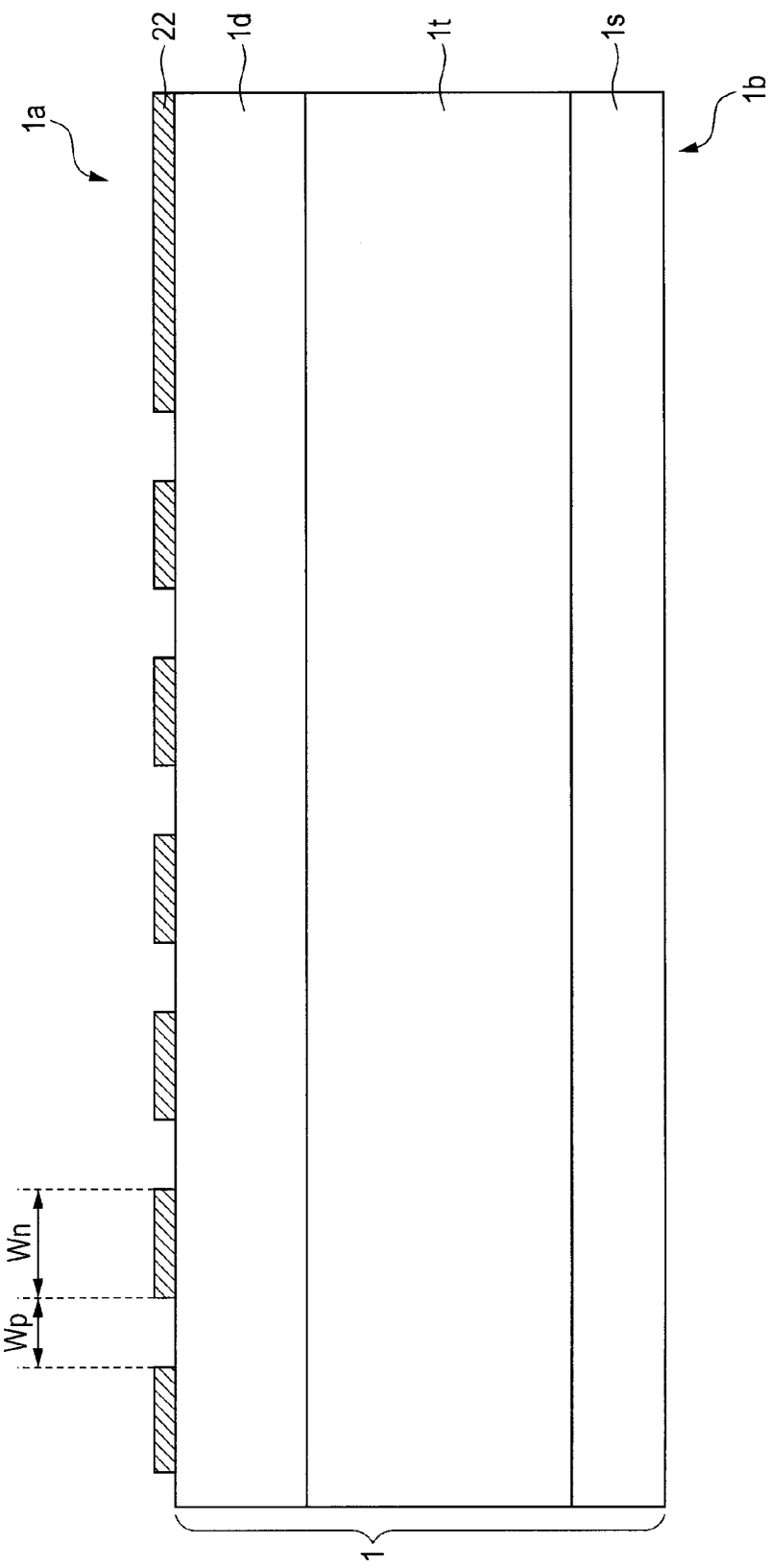
FIG. 7 is a device cross-sectional view (a step of patterning a hard mask film for opening a P-column trench) illustrating a process flow corresponding to the device cross-section illustrated in FIG. 3.
Figure 8:
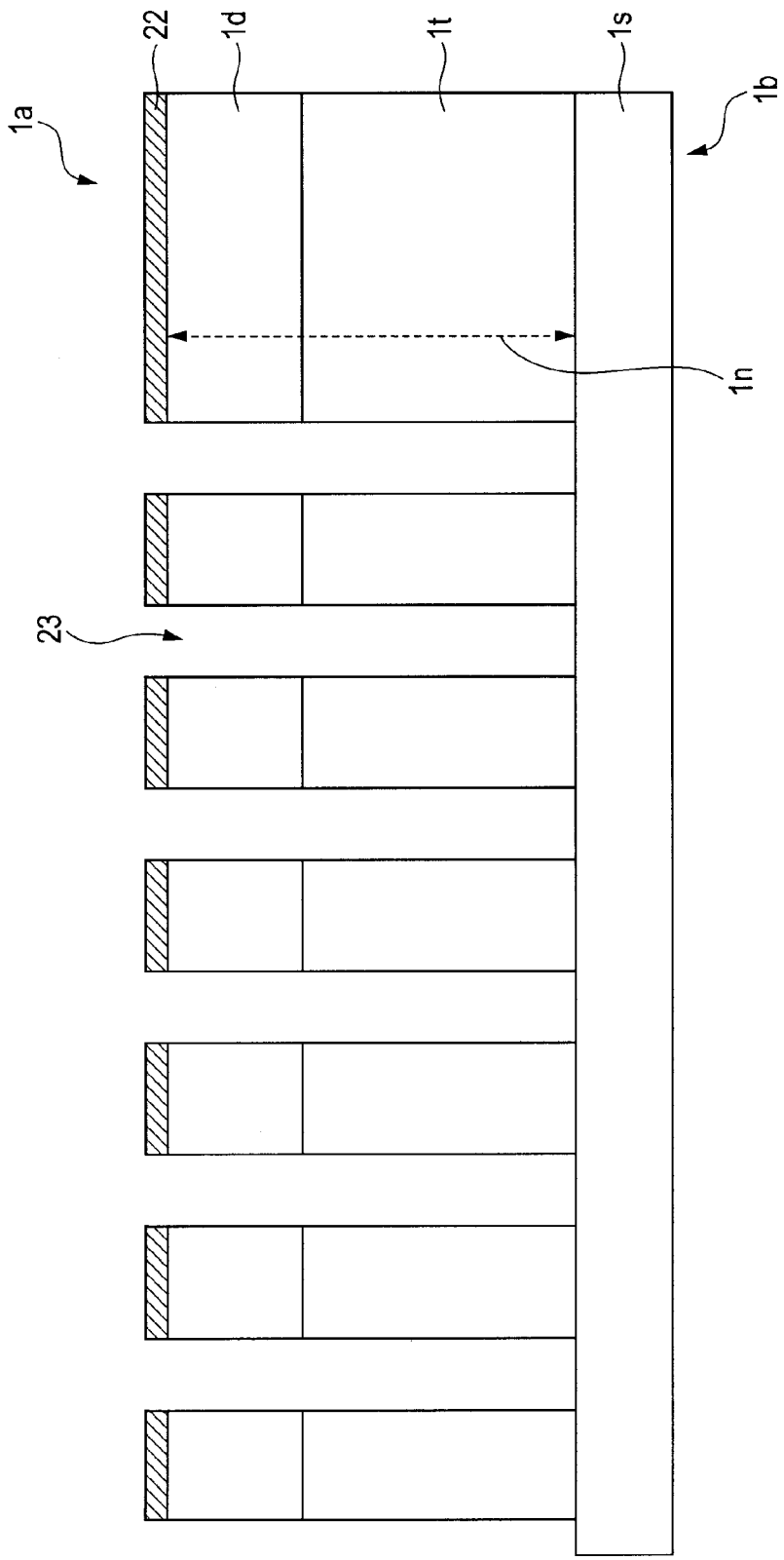
FIG. 8 is a device cross-sectional view (a step of opening the P-column trench) illustrating the process flow corresponding to the device cross-section illustrated in FIG. 3.
Figure 9:
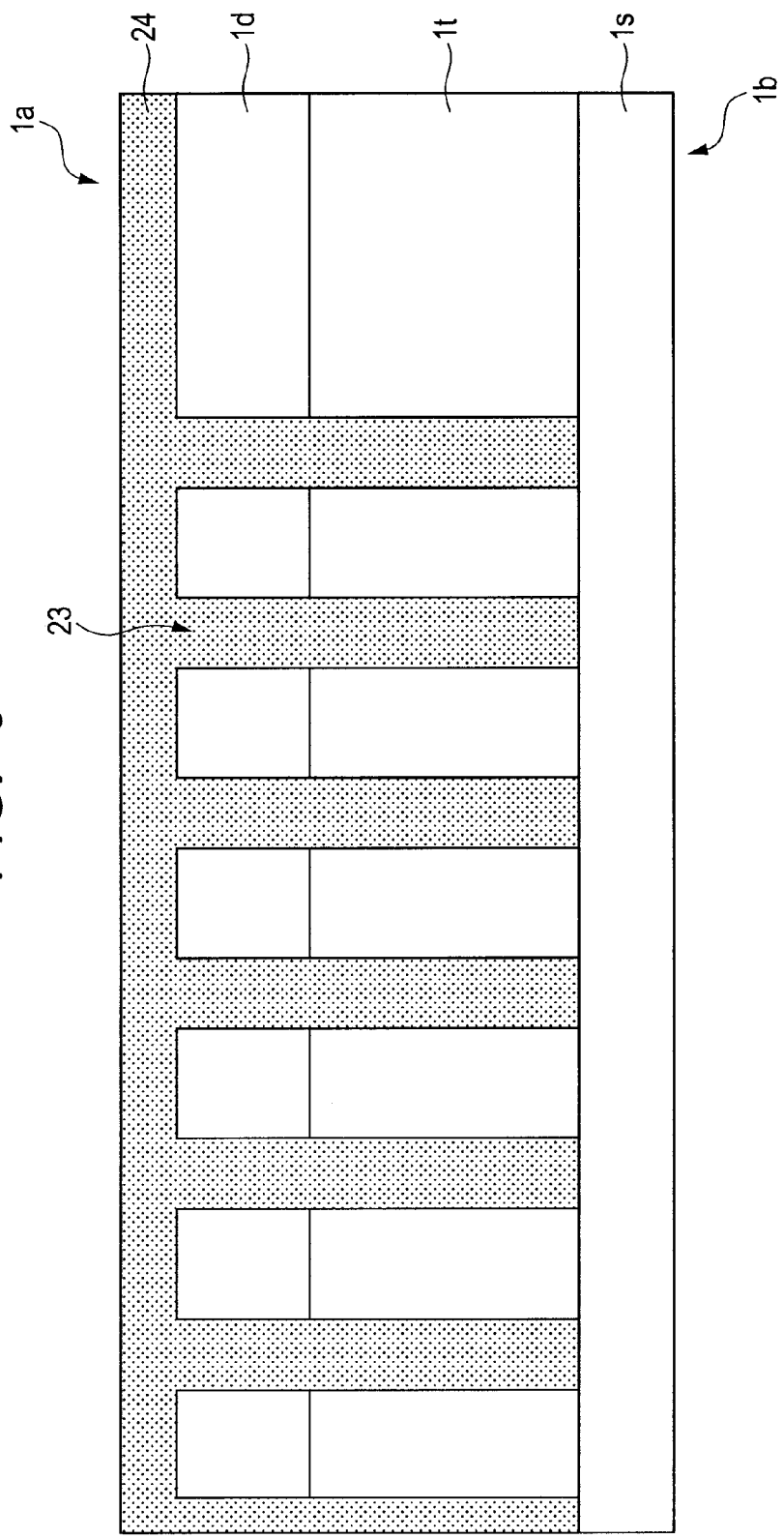
FIG. 9 is a device cross-sectional view (an epitaxy trench filling step) illustrating the process flow corresponding to the device cross-section illustrated in FIG. 3.
Figure 10:
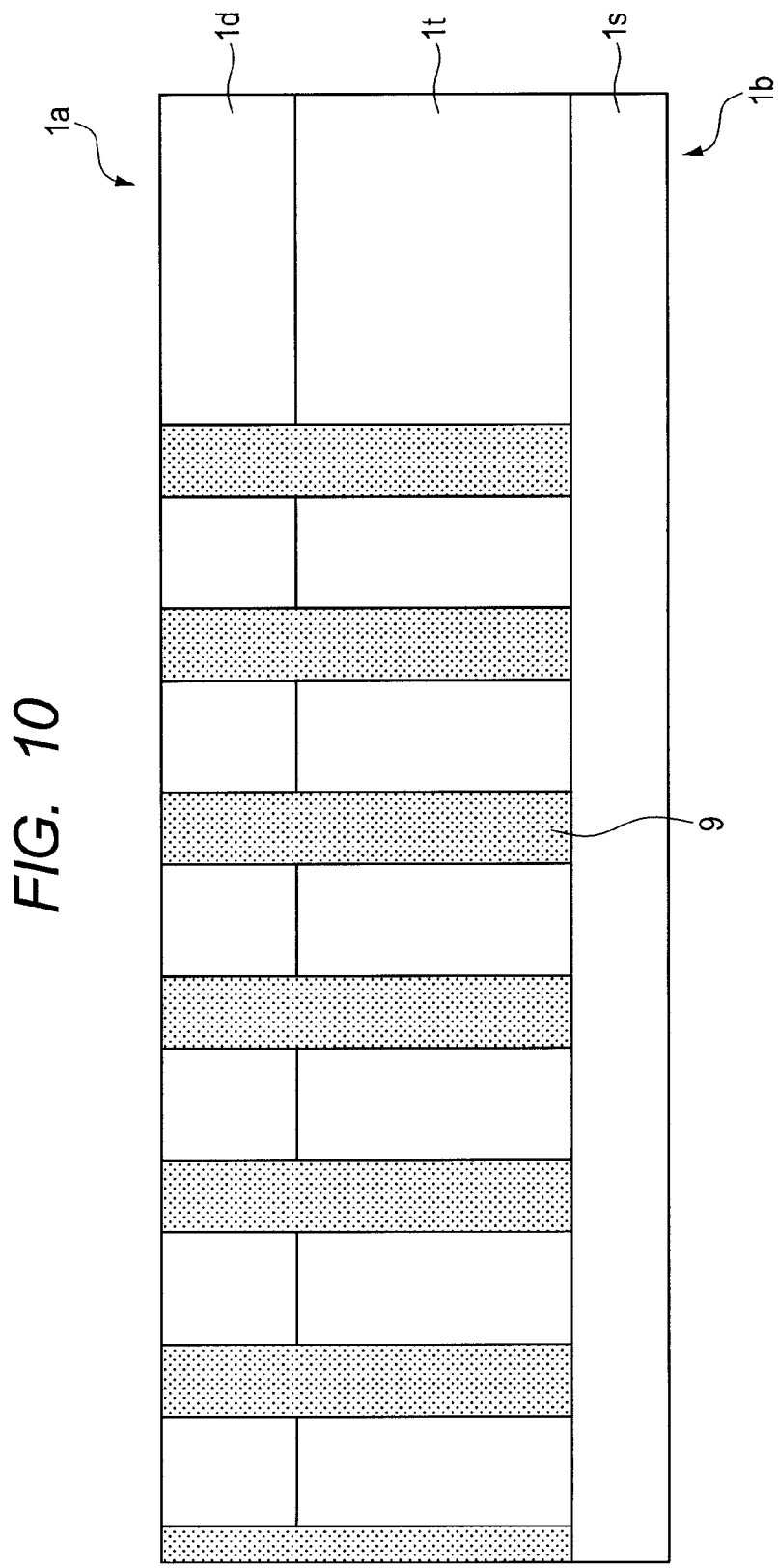
FIG. 10 is a device cross-sectional view (a planarization step) illustrating the process flow corresponding to the device cross-section illustrated in FIG. 3.
Figure 11:
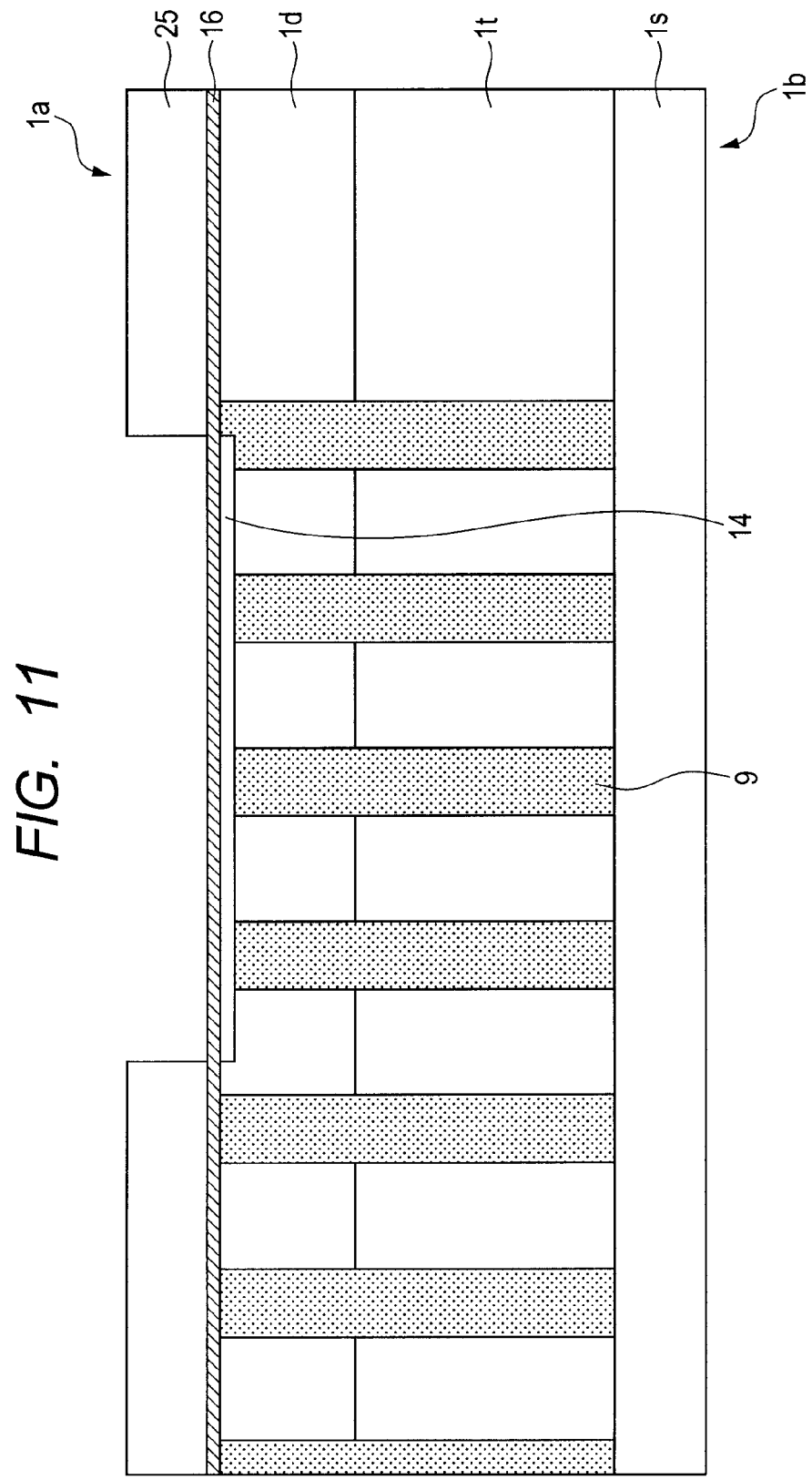
FIG. 11 is a device cross-sectional view (a step of introducing a P-resurf region) illustrating the process flow corresponding to the device cross-section illustrated in FIG. 3.
Figure 12:
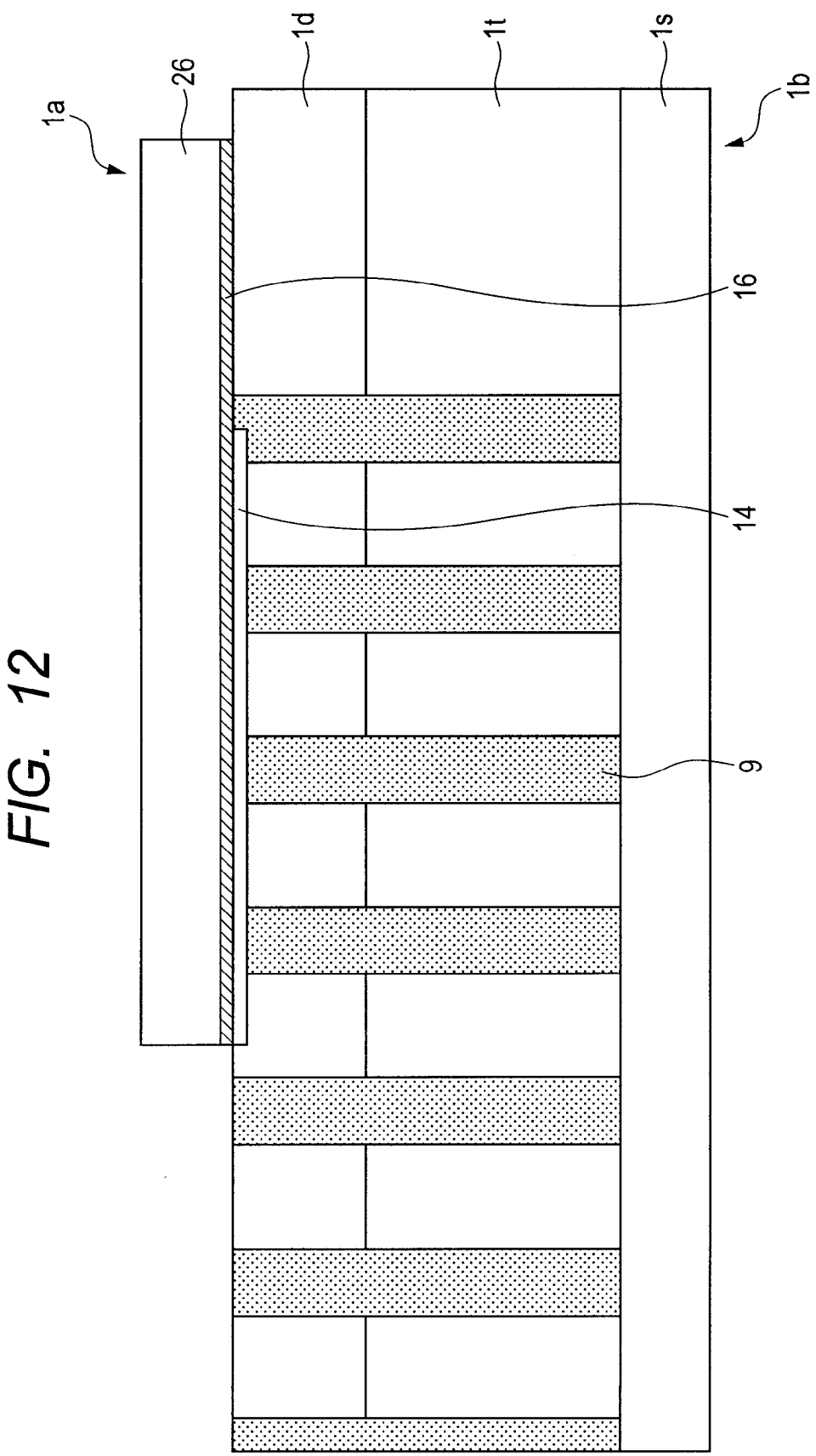
FIG. 12 is a device cross-sectional view (a step of etching a field insulating film) illustrating the process flow corresponding to the device cross-section illustrated in FIG. 3.
Figure 13:
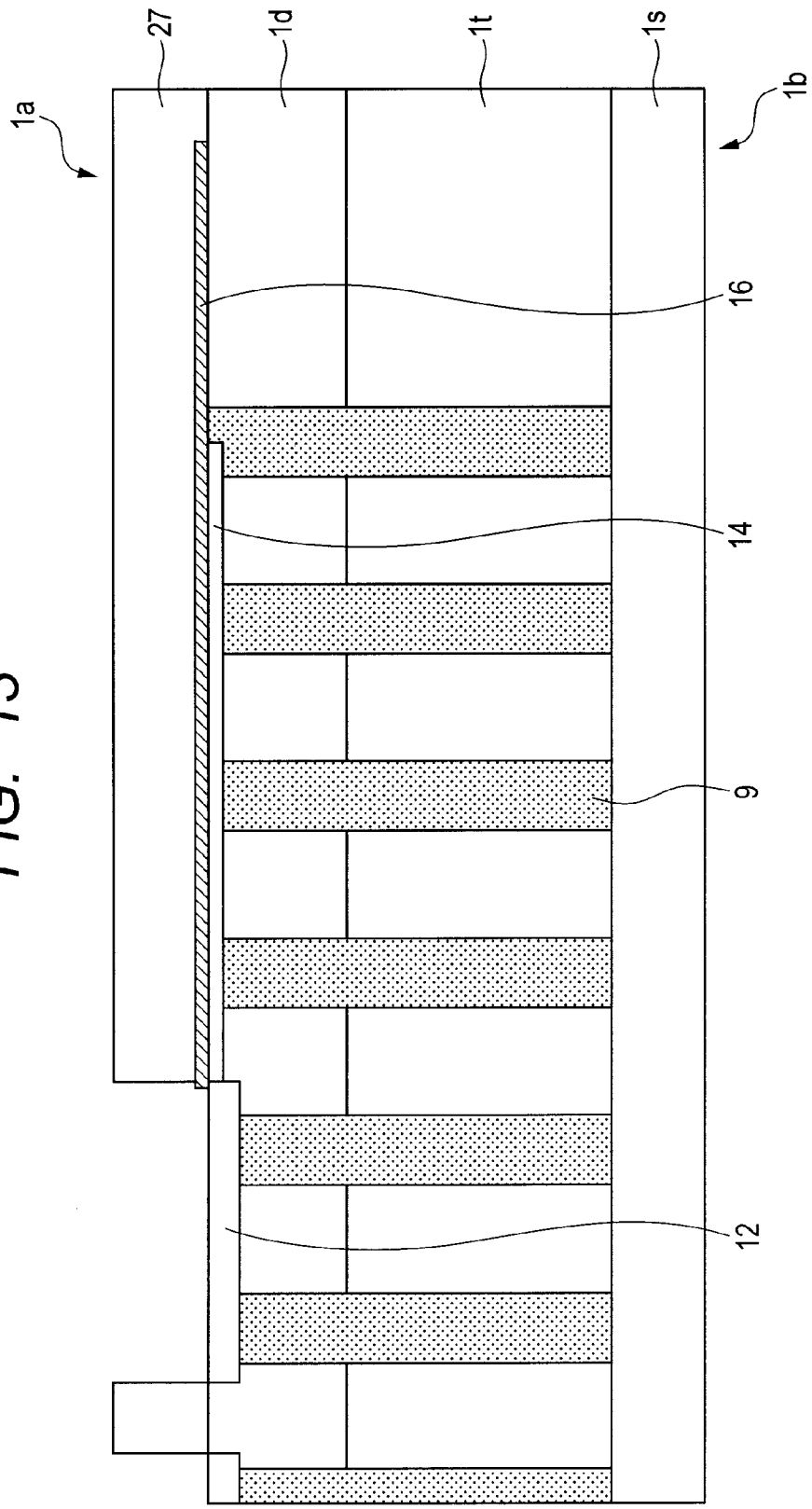
FIG. 13 is a device cross-sectional view (a step of introducing a P-body region) illustrating the process flow corresponding to the device cross-section illustrated in FIG. 3.
Figure 14:
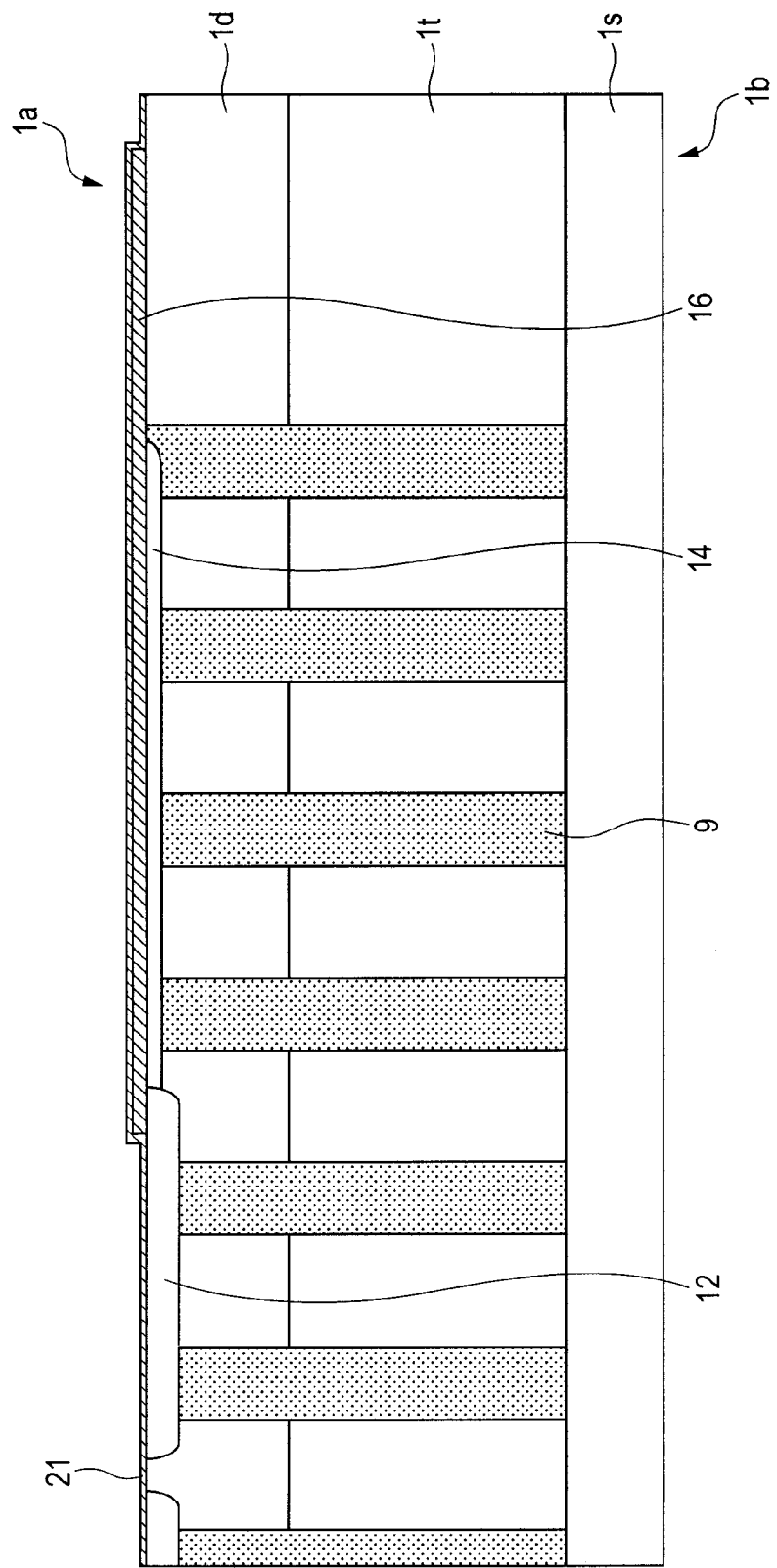
FIG. 14 is a device cross-sectional view (a gate oxidation step) illustrating the process flow corresponding to the device cross-section illustrated in FIG. 3.
Figure 15:
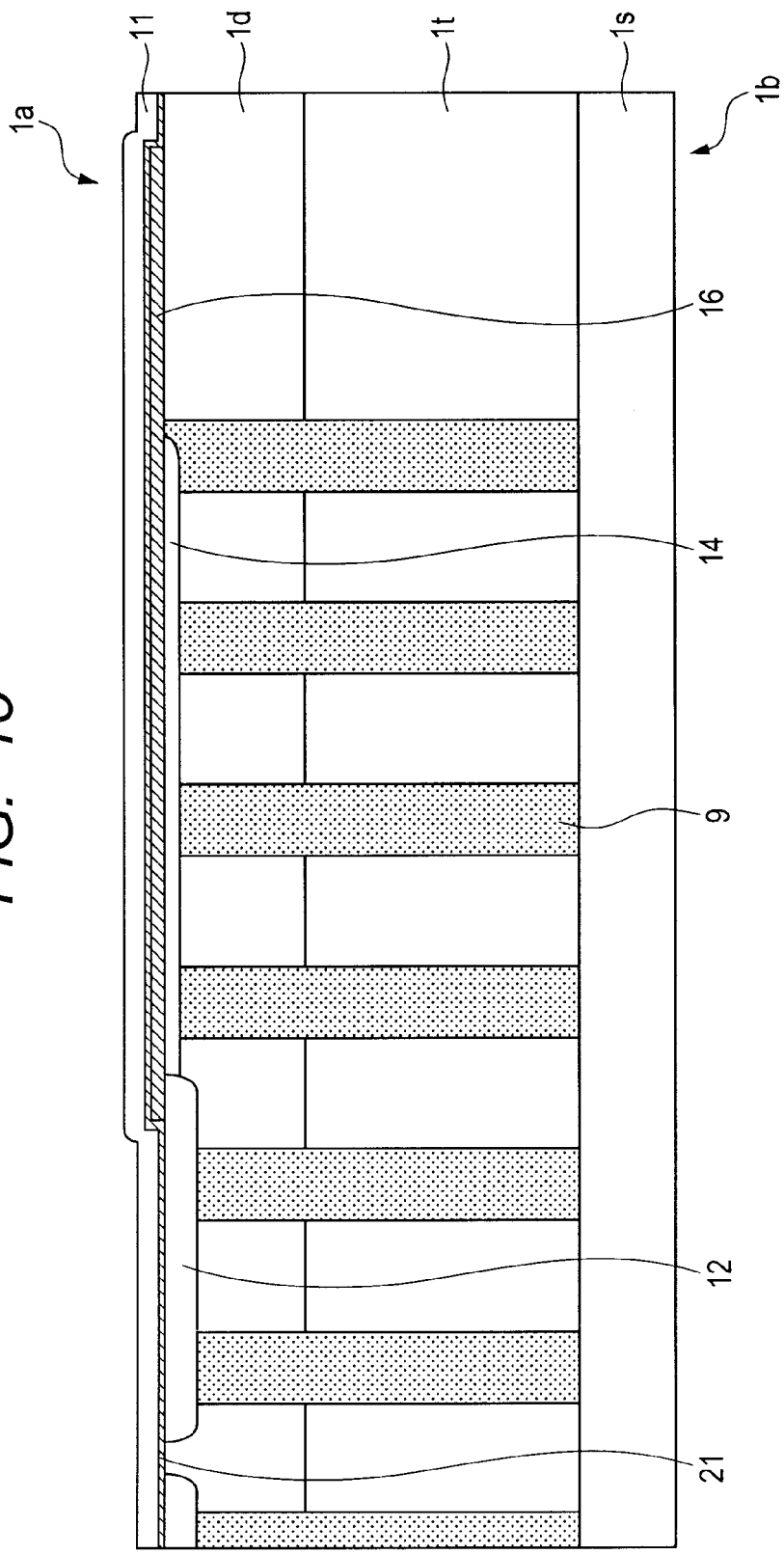
FIG. 15 is a device cross-sectional view (a step of forming a gate polysilicon film) illustrating the process flow corresponding to the device cross-section illustrated in FIG. 3.
Figure 16:
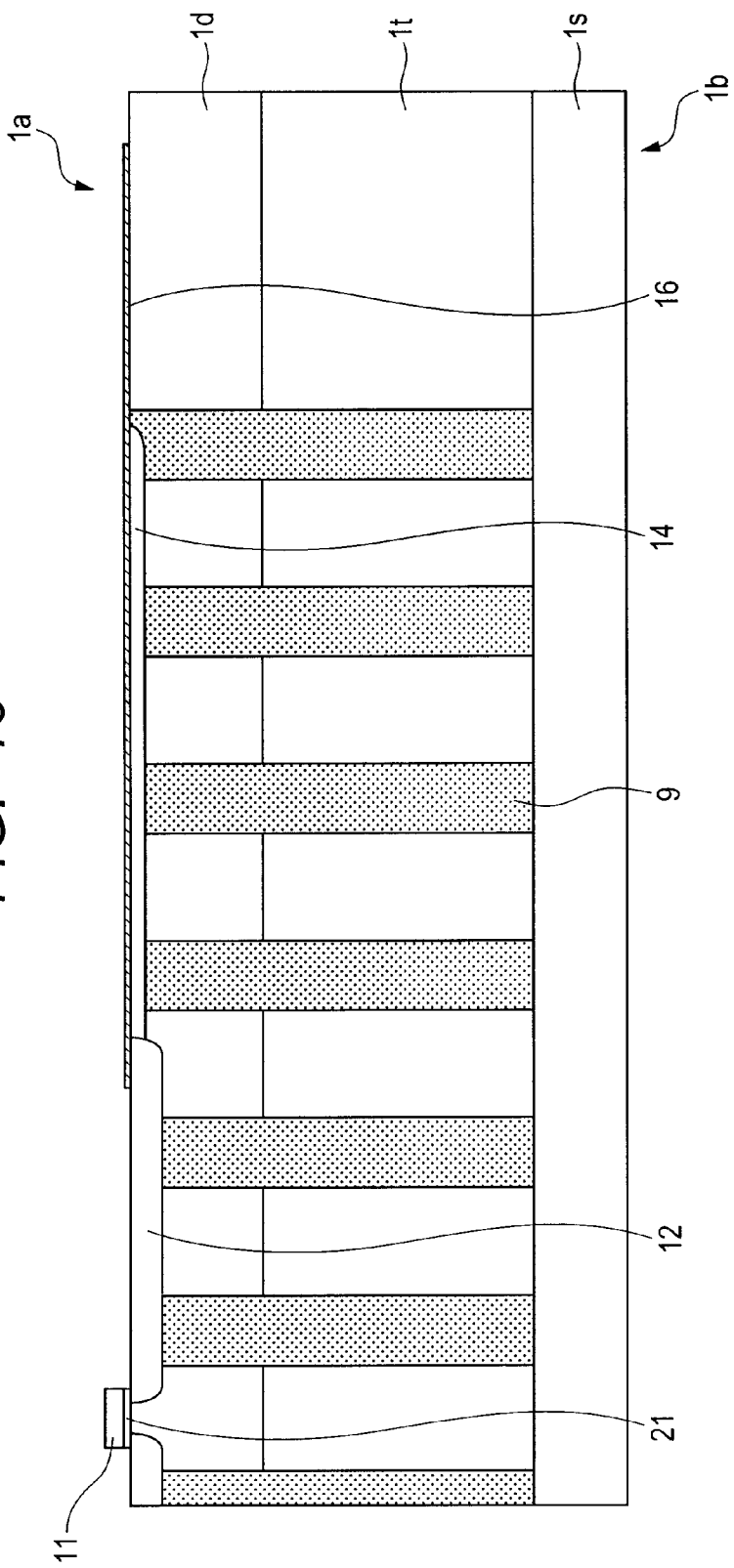
FIG. 16 is a device cross-sectional view (a step of patterning the gate polysilicon film) illustrating the process flow corresponding to the device cross-section illustrated in FIG. 3.
Figure 17:
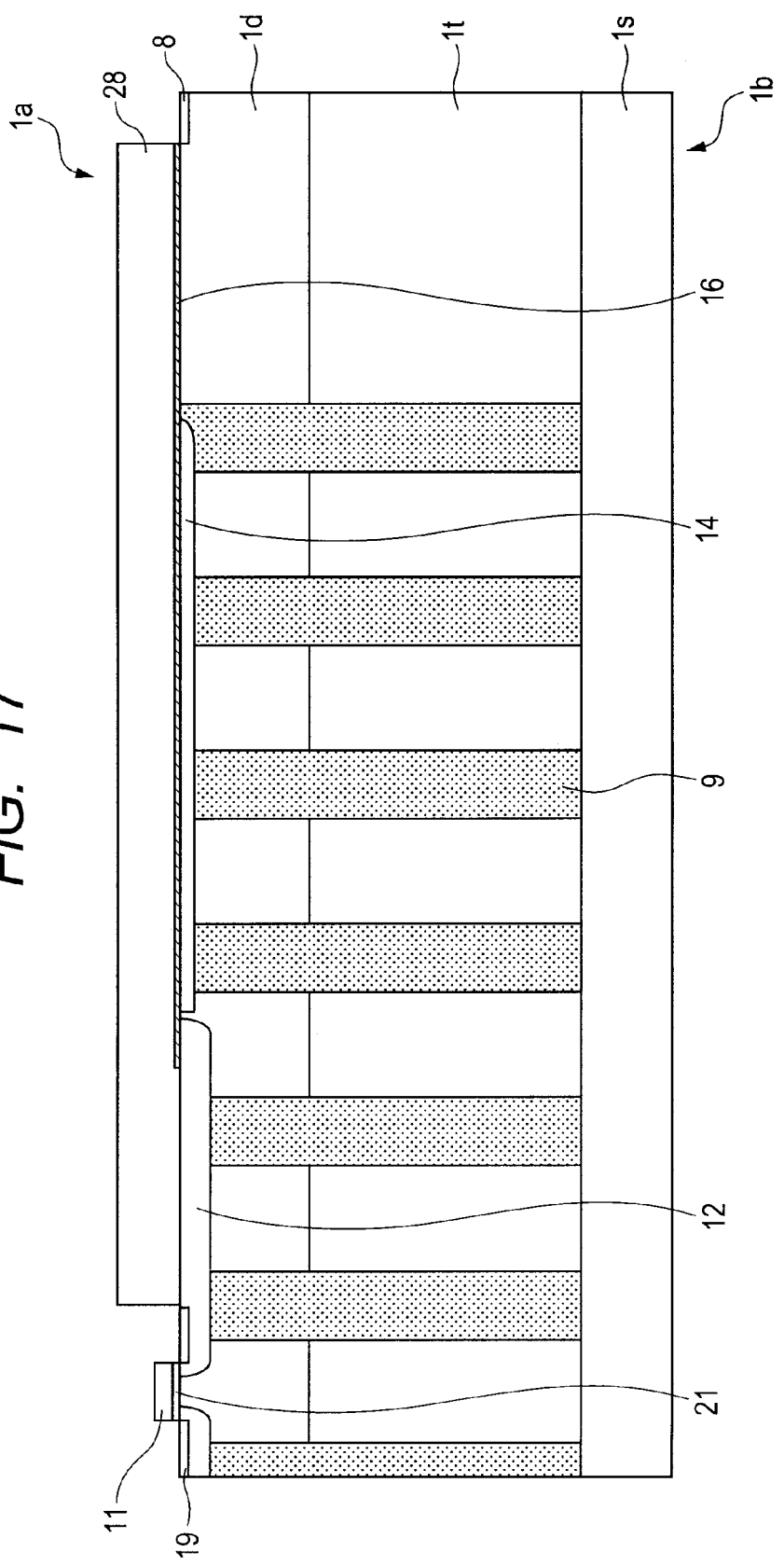
FIG. 17 is a device cross-sectional view (a step of introducing an N+ source region) illustrating the process flow corresponding to the device cross-section illustrated in FIG. 3.
Figure 18:
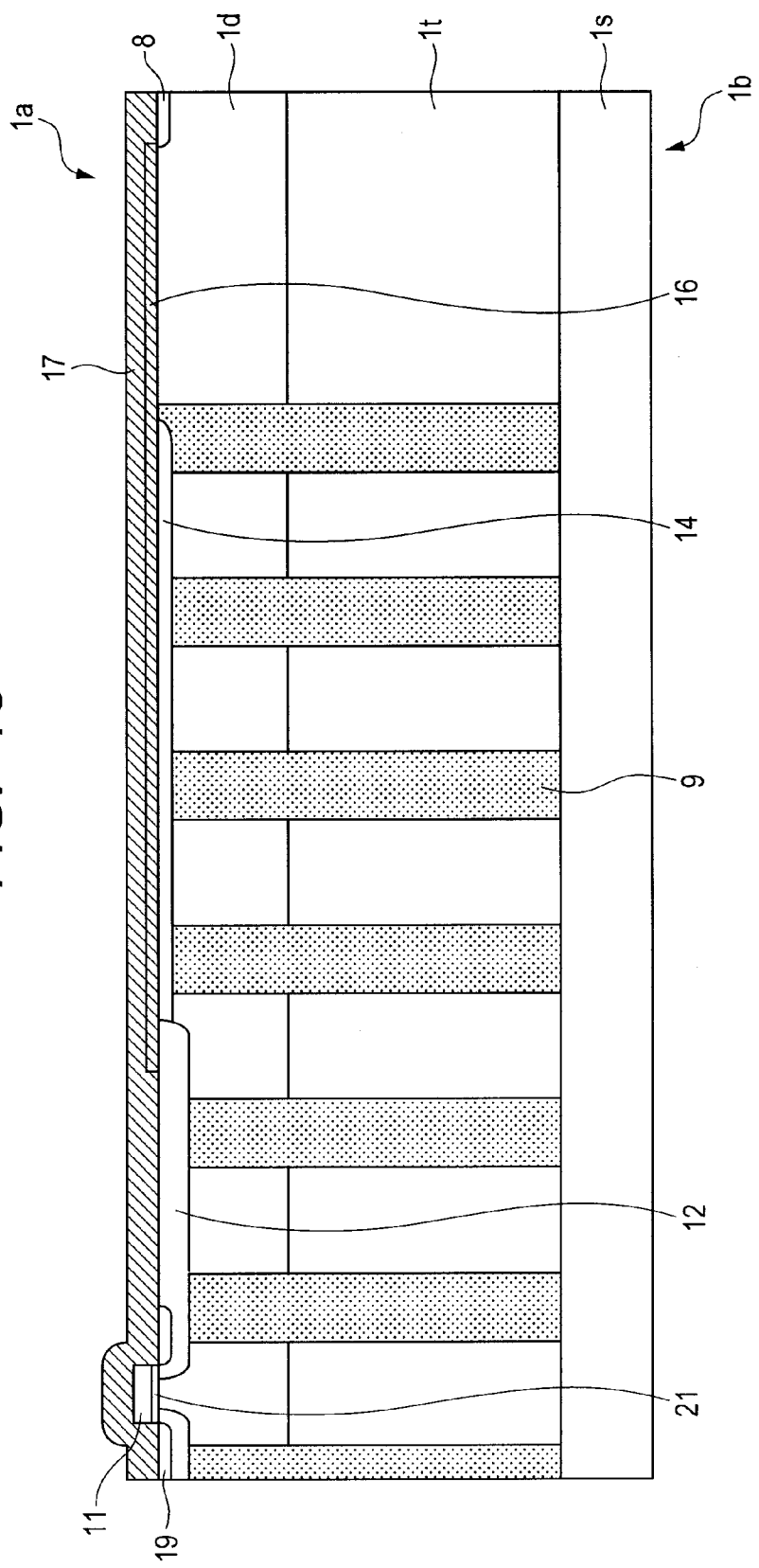
FIG. 18 is a device cross-sectional view (a step of forming an interlayer insulating film) illustrating the process flow corresponding to the device cross-section illustrated in FIG. 3.
Figure 19:
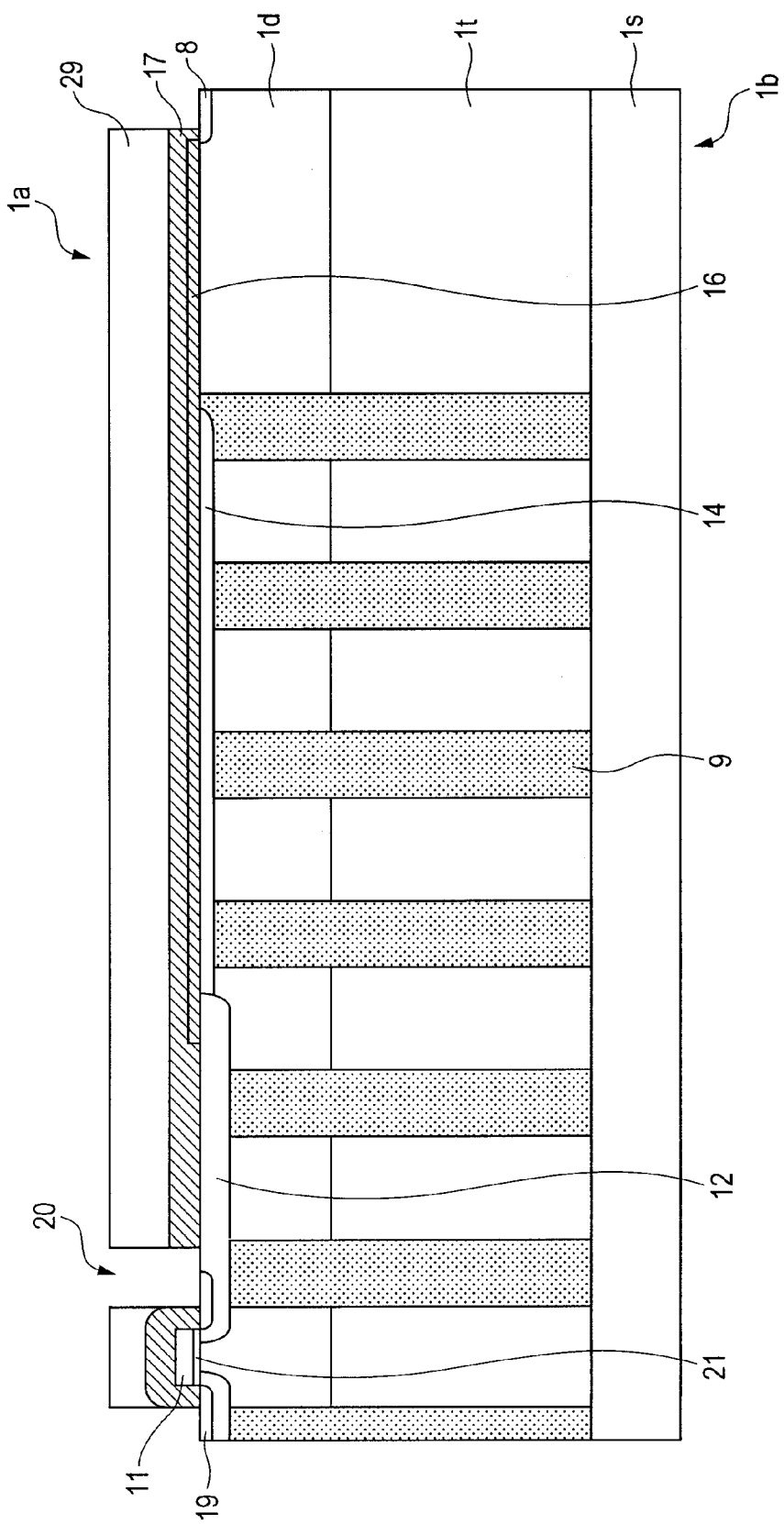
FIG. 19 is a device cross-sectional view (a step of forming a contact hole) illustrating the process flow corresponding to the device cross-section illustrated in FIG. 3.
Figure 20:
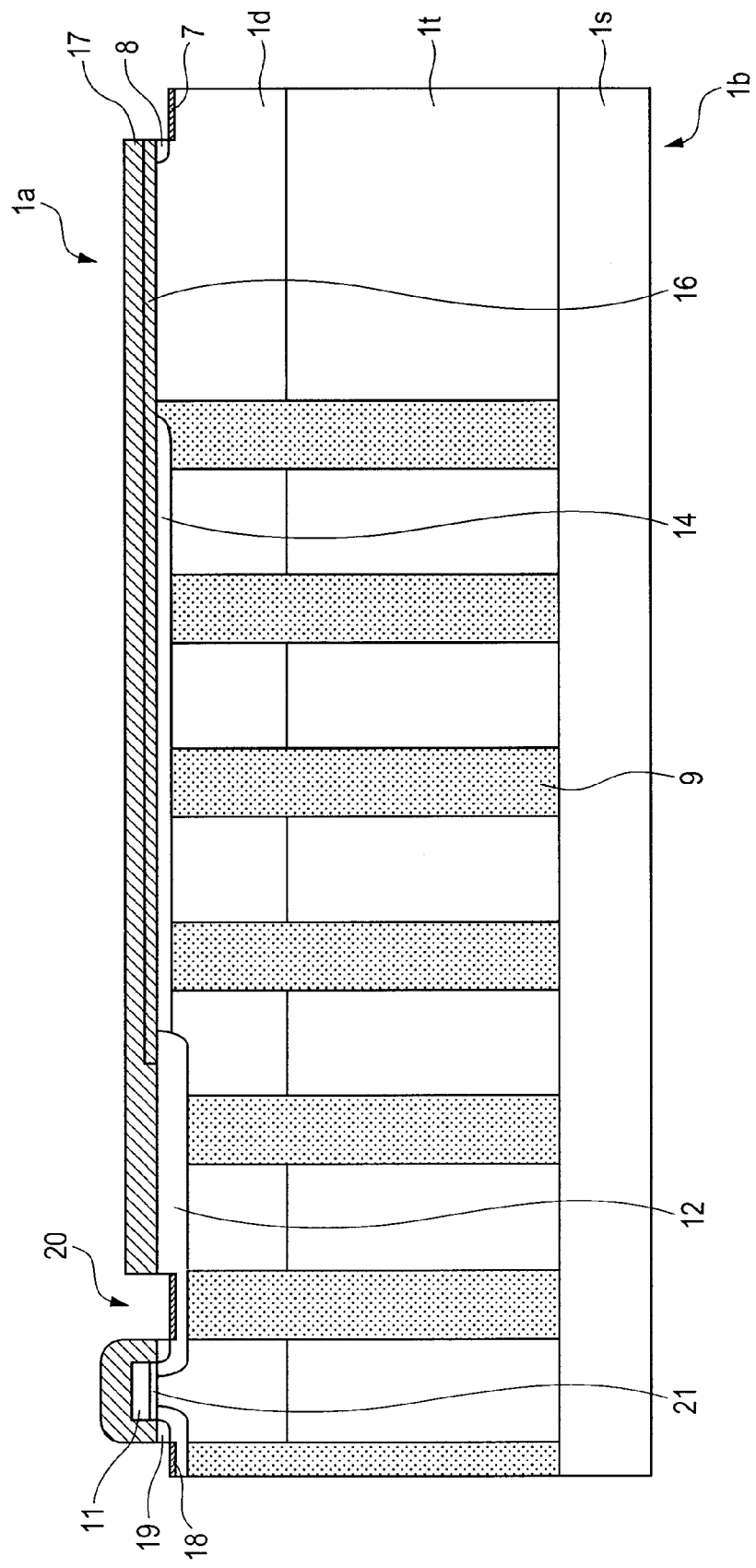
FIG. 20 is a device cross-sectional view (a step of introducing a P+ body contact region) illustrating the process flow corresponding to the device cross-section illustrated in FIG. 3.
Figure 21:
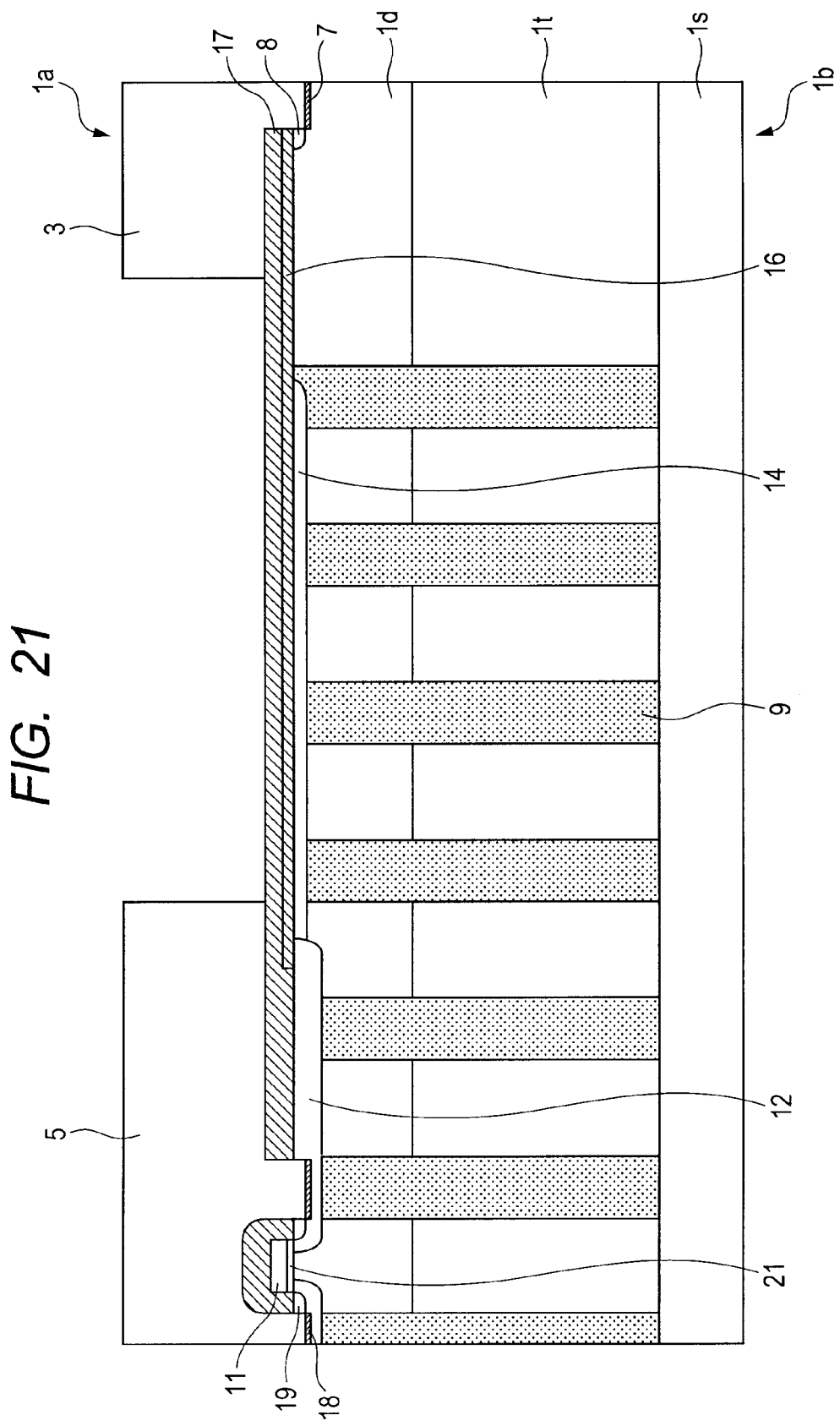
FIG. 21 is a device cross-sectional view (a step of forming an aluminum-based metal electrode) illustrating the process flow corresponding to the device cross-section illustrated in FIG. 3.
Figure 22:
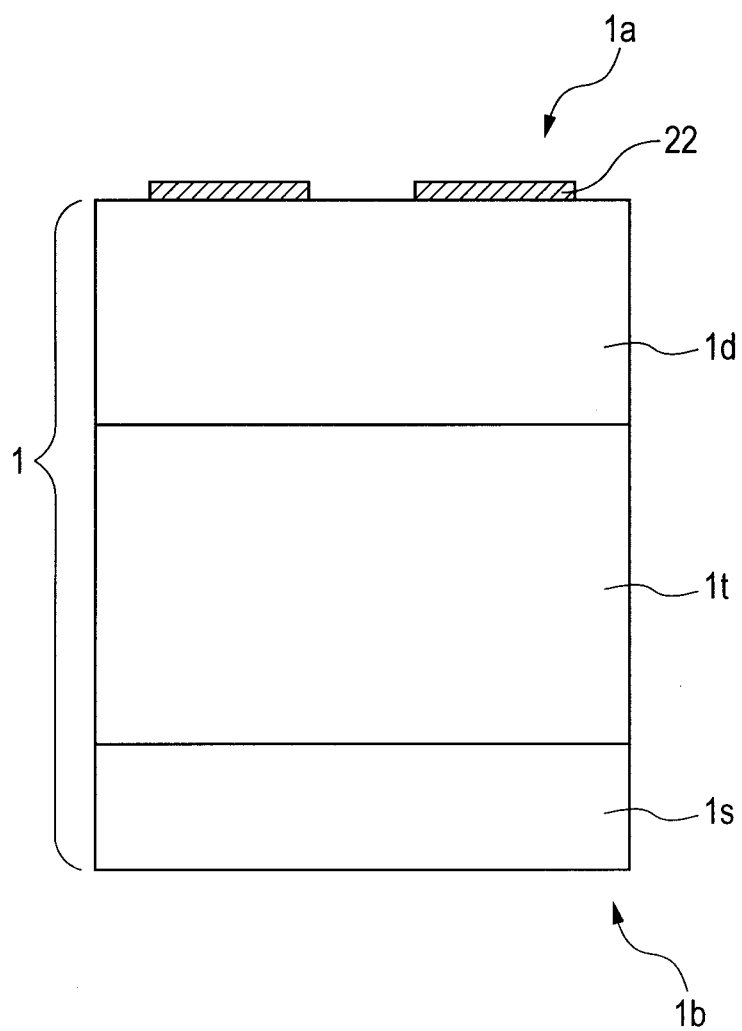
FIG. 22 is a device cross-sectional view (a step of patterning a hard mask film for opening a P-column trench) illustrating a process flow corresponding to the device cross-section illustrated in FIG. 5.
Figure 23:
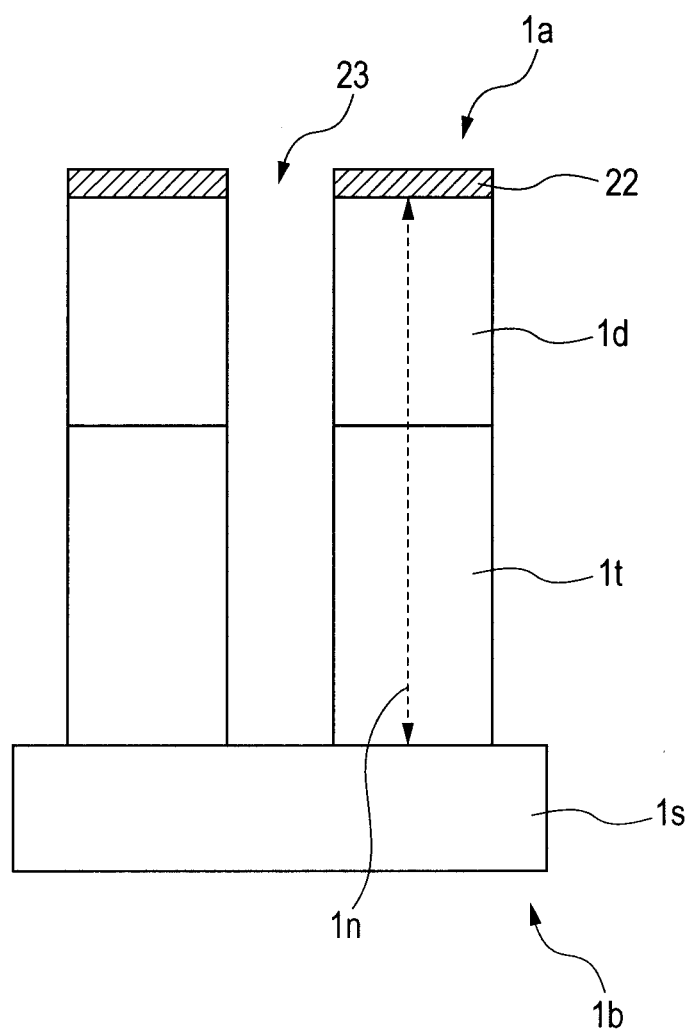
FIG. 23 is a device cross-sectional view (a step of opening the P-column trench) illustrating the process flow corresponding to the device cross-section illustrated in FIG. 5.
Figure 24:
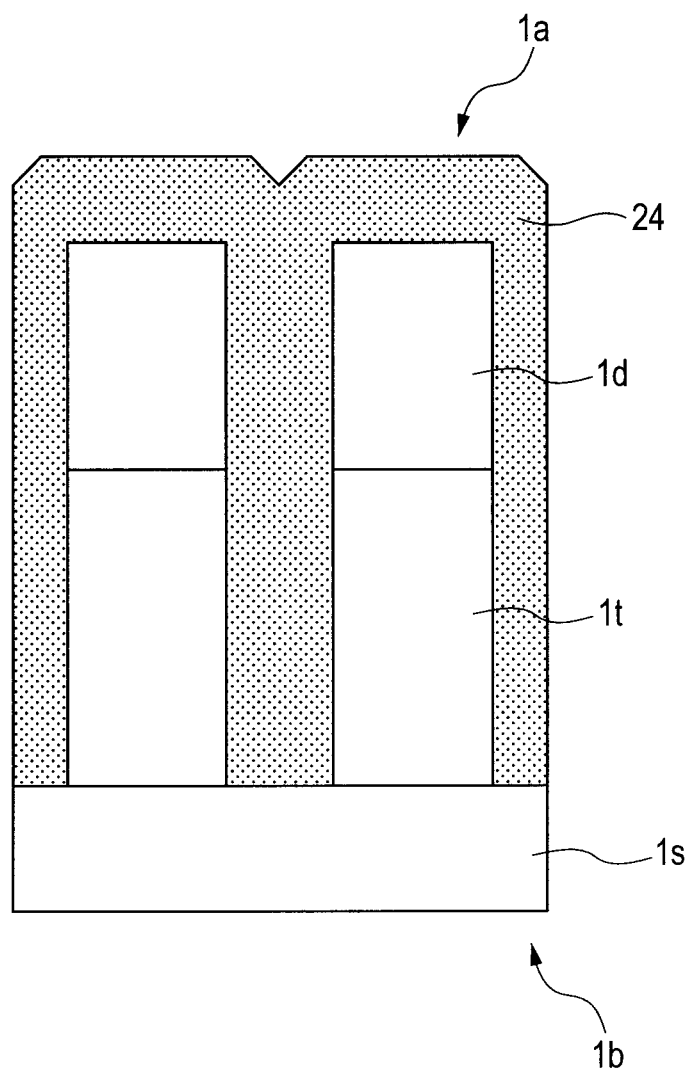
FIG. 24 is a device cross-sectional view (an epitaxy trench filling step) illustrating the process flow corresponding to the device cross-section illustrated in FIG. 5.
Figure 25:
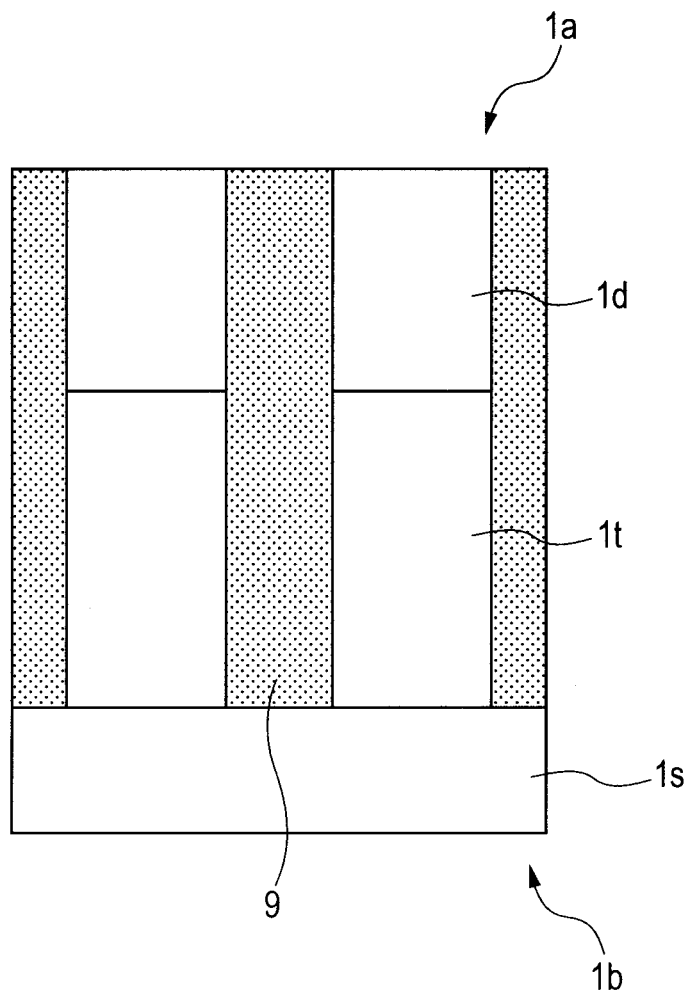
FIG. 25 is a device cross-sectional view (a planarization step) illustrating the process flow corresponding to the device cross-section illustrated, in FIG. 5.
Figure 26:
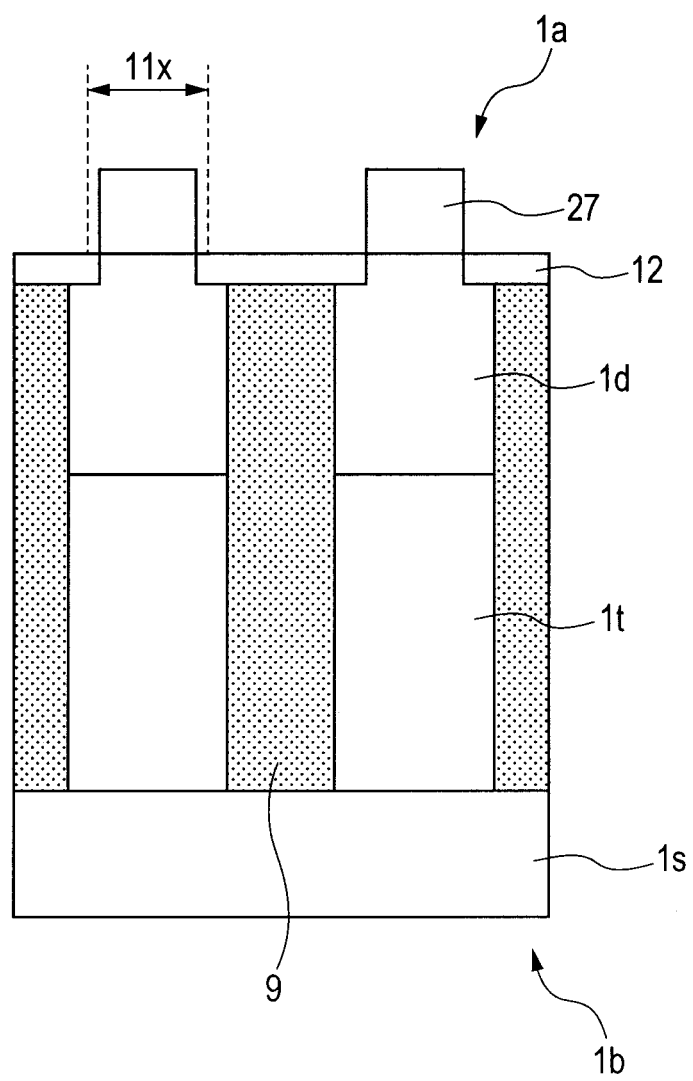
FIG. 26 is a device cross-sectional view (a step of introducing a P-body region) illustrating the process flow corresponding to the device cross-section illustrated in FIG. 5.
Figure 27:
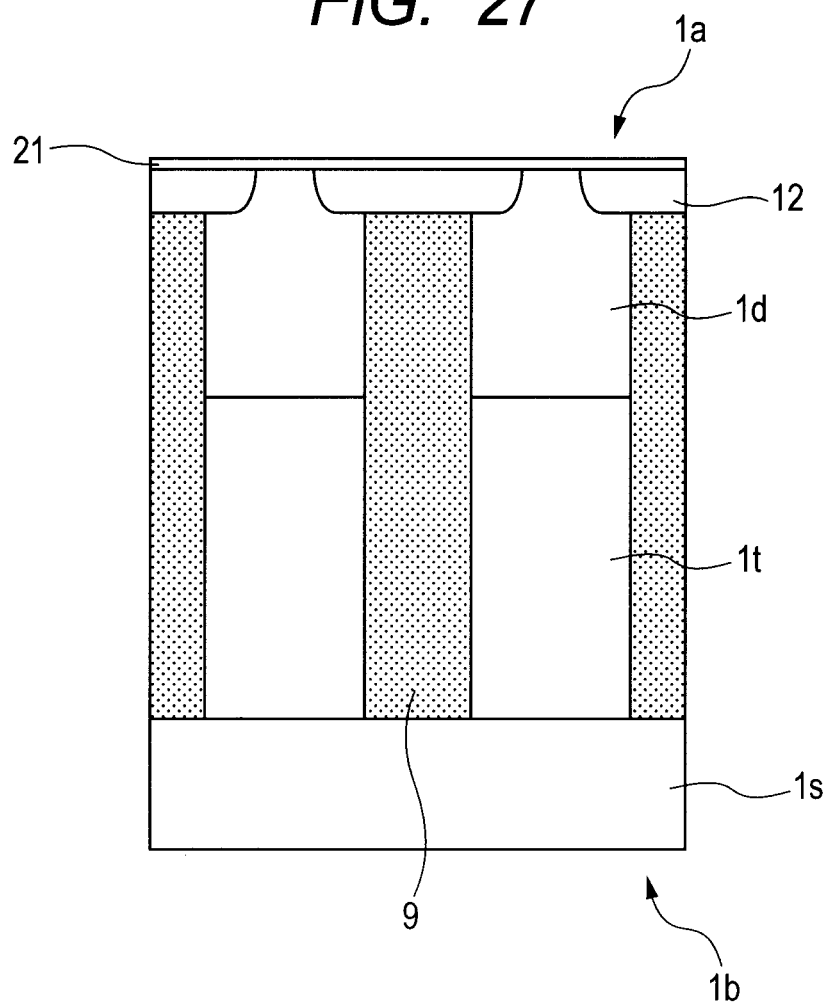
FIG. 27 is a device cross-sectional view (a gate oxidation step) illustrating the process flow corresponding to the device cross-section illustrated in FIG. 5.
Figure 28:
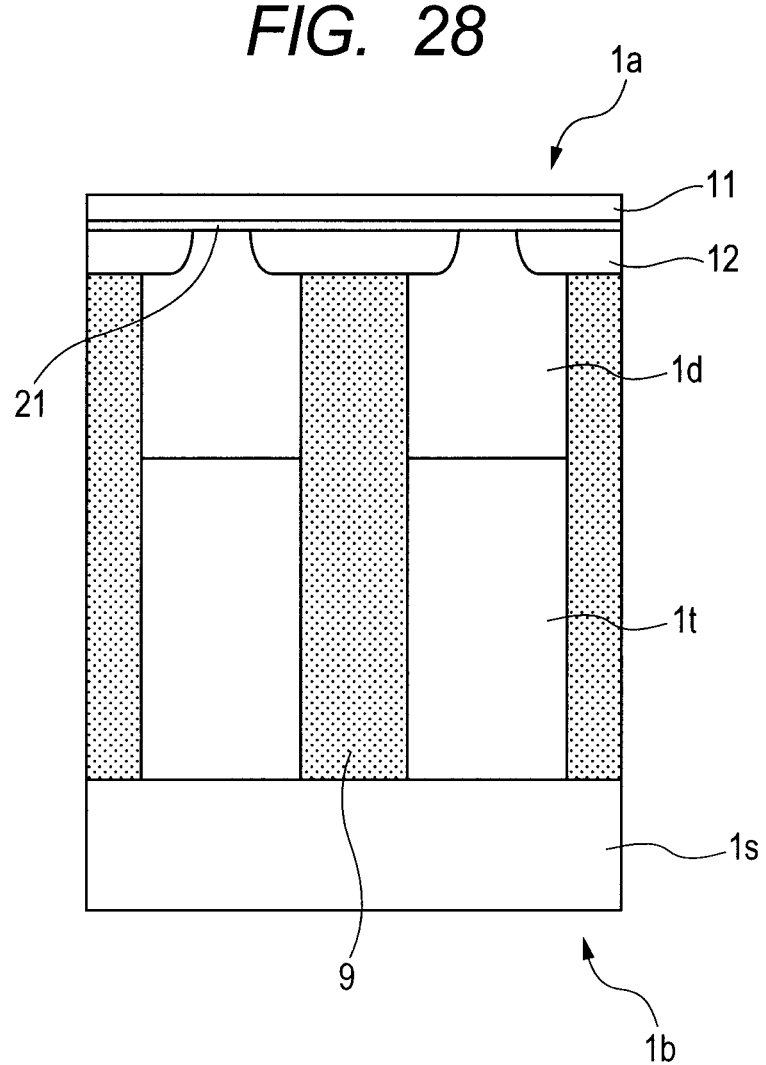
FIG. 28 is a device cross-sectional view (a step of forming a gate polysilicon film) illustrating the process flow corresponding to the device cross-section illustrated in FIG. 5.
Figure 29:
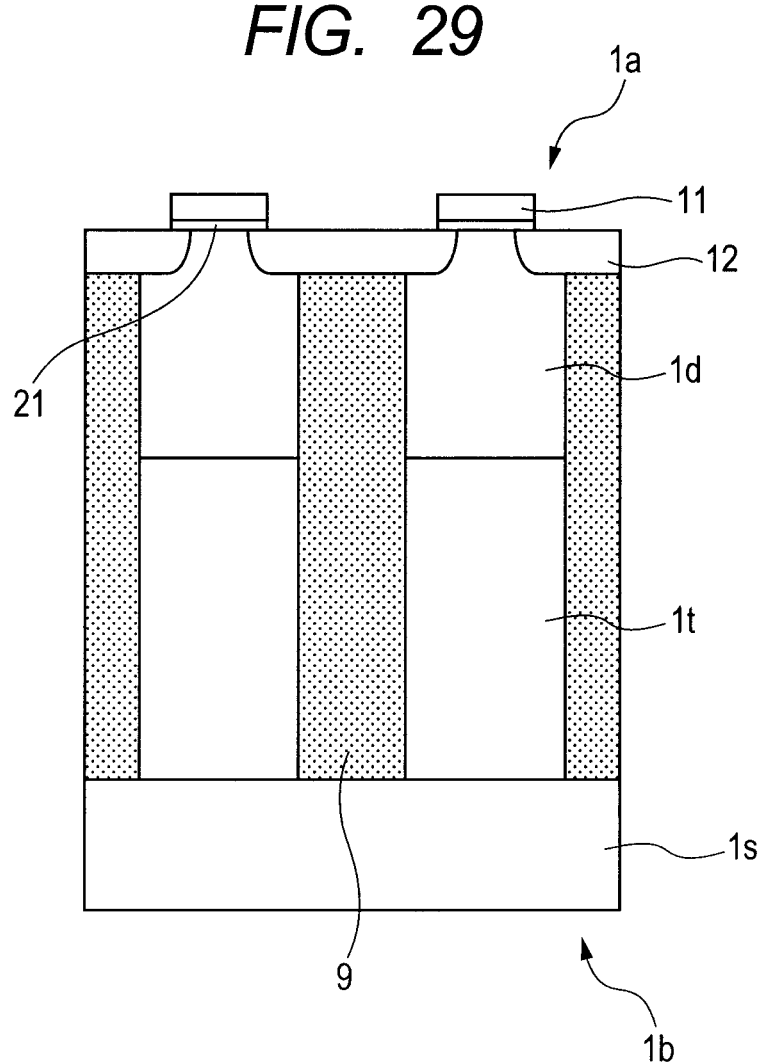
FIG. 29 is a device cross-sectional view (a step of patterning the gate polysilicon film) illustrating the process flow corresponding to the device cross-section illustrated in FIG. 5.
Figure 30:
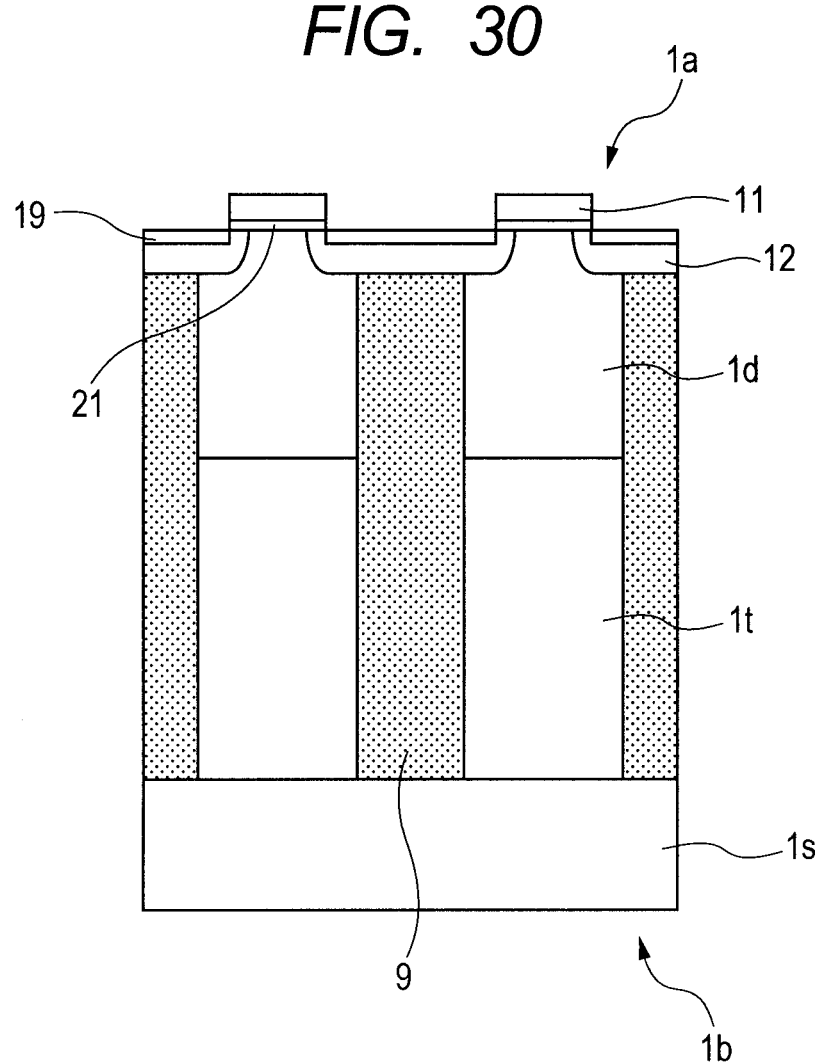
FIG. 30 is a device cross-sectional view (a step of introducing an N+ source region) illustrating the process flow corresponding to the device cross-section illustrated in FIG. 5.
Figure 31:
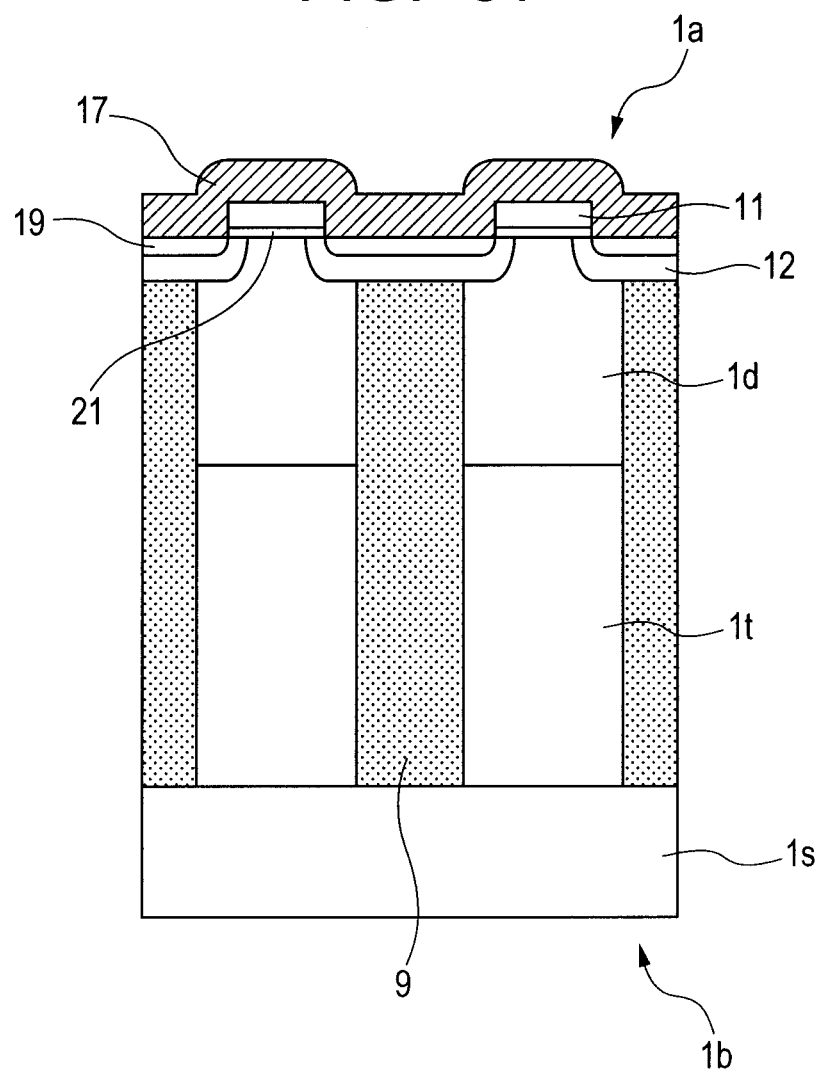
FIG. 31 is a device cross-sectional view (a step of forming an interlayer insulating film) illustrating the process flow corresponding to the device cross-section illustrated in FIG. 5.
Figure 32:
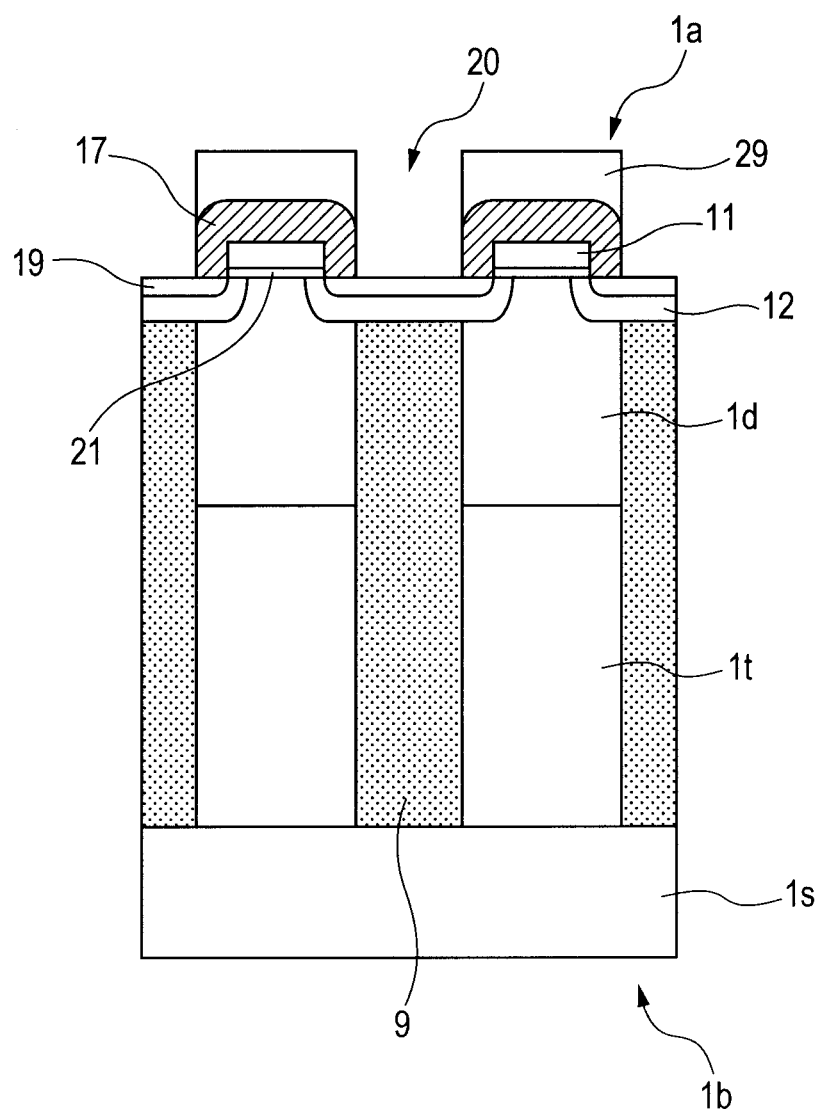
FIG. 32 is a device cross-sectional view (a step of forming a contact hole) illustrating the process flow corresponding to the device cross-section illustrated in FIG. 5.
Figure 33:
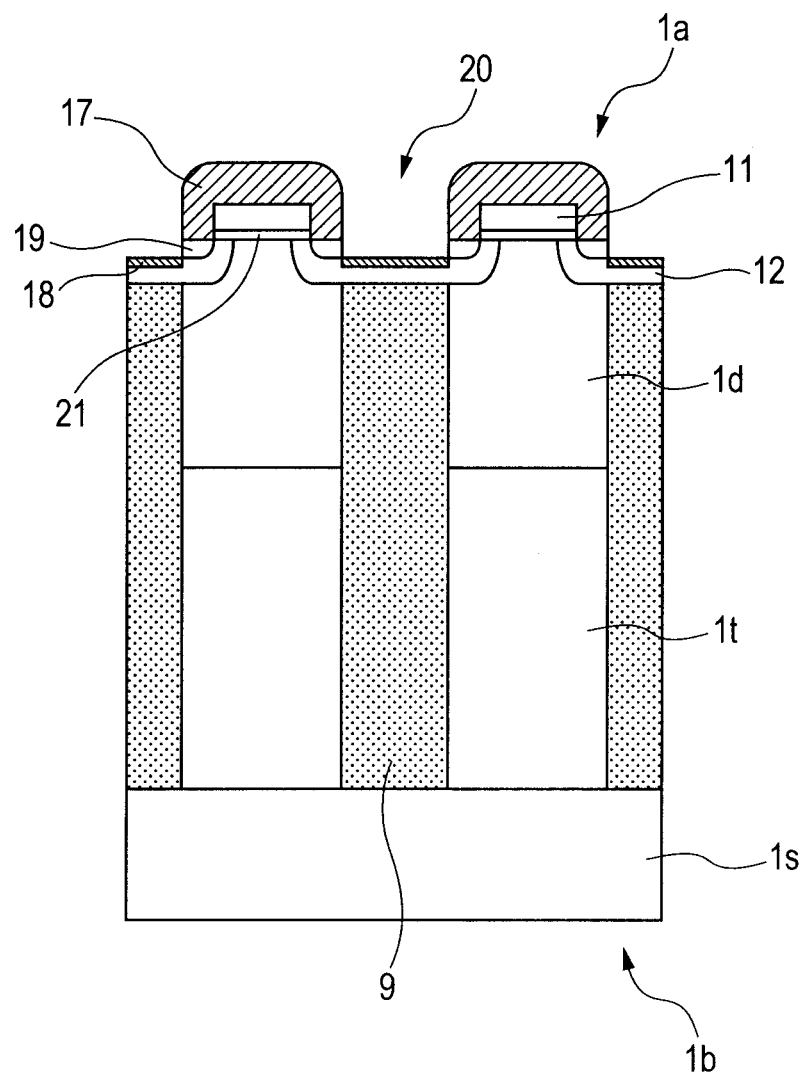
FIG. 33 is a device cross-sectional view (a step of introducing a P+ body contact region) illustrating the process flow corresponding to the device cross-section illustrated in FIG. 5.
Figure 34:
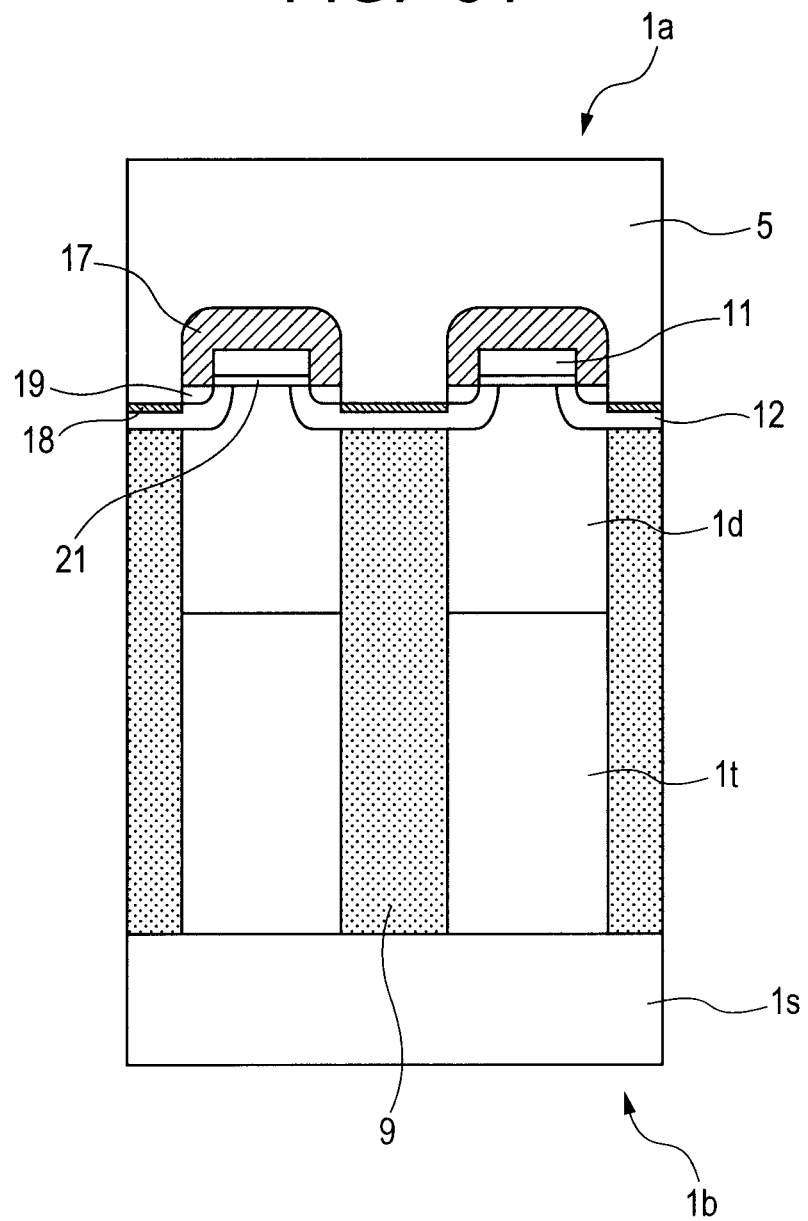
FIG. 34 is a device cross-sectional view (a step of forming an aluminum-based metal electrode) illustrating the process flow corresponding to the device cross-section illustrated in FIG. 5.

FIG. 7 is a device cross-sectional view (a step of patterning a hard mask film for opening a P-column trench) illustrating a process flow corresponding to the device cross-section illustrated in FIG. 3. FIG. 8 is a device cross-sectional view (a step of opening the P-column trench) illustrating the process flow corresponding to the device cross-section illustrated in FIG. 3. FIG. 9 is a device cross-sectional view (an epitaxy trench filling step) illustrating the process flow corresponding to the device cross-section illustrated in FIG. 3. FIG. 10 is a device cross-sectional view (a planarization step) illustrating the process flow corresponding to the device cross-section illustrated in FIG. 3. FIG. 11 is a device cross-sectional view (a step of introducing a P-resurf region) illustrating the process flow corresponding to the device cross-section illustrated in FIG. 3. FIG. 12 is a device cross-sectional view (a step of etching a field insulating film) illustrating the process flow corresponding to the device cross-section illustrated in FIG. 3. FIG. 13 is a device cross-sectional view (a step of introducing a P-body region) illustrating the process flow corresponding to the device cross-section illustrated in FIG. 3. FIG. 14 is a device cross-sectional view (a gate oxidation step) illustrating the process flow corresponding to the device cross-section illustrated in FIG. 3. FIG. 15 is a device cross-sectional view (a step of forming a gate polysilicon film) illustrating the process flow corresponding to the device cross-section illustrated in FIG. 3. FIG. 16 is a device cross-sectional view (a step of patterning the gate polysilicon film) illustrating the process flow corresponding to the device cross-section illustrated in FIG. 3. FIG. 17 is a device cross-sectional view (a step of introducing an N+ source region) illustrating the process flow corresponding to the device cross-section illustrated in FIG. 3. FIG. 18 is a device cross-sectional view (a step of forming an interlayer insulating film) illustrating the process flow corresponding to the device cross-section illustrated in FIG. 3. FIG. 19 is a device cross-sectional view (a step of forming a contact hole) illustrating the process flow corresponding to the device cross-section illustrated in FIG. 3. FIG. 20 is a device cross-sectional view (a step of introducing a P+body contact region) illustrating the process flow corresponding to the device cross-section illustrated in FIG. 3. FIG. 21 is a device cross-sectional view (a step of forming an aluminum-based metal electrode) illustrating the process flow corresponding to the device cross-section illustrated in FIG. 3. FIG. 22 is a device cross-sectional view (a step of patterning a hard mask film for opening a P-column trench) illustrating a process flow corresponding to the device cross-section illustrated in FIG. 5. FIG. 23 is a device cross-sectional view (a step of opening the P-column trench) illustrating the process flow corresponding to the device cross-section illustrated in FIG. 5. FIG. 24 is a device cross-sectional view (an epitaxy trench filling step) illustrating the process flow corresponding to the device cross-section illustrated in FIG. 5. FIG. 25 is a device cross-sectional view (a planarization step) illustrating the process flow corresponding to the device cross-section illustrated in FIG. 5. FIG. 26 is a device cross-sectional view (a step of introducing a P-body region) illustrating the process flow corresponding to the device cross-section illustrated in FIG. 5. FIG. 27 is a device cross-sectional view (a gate oxidation step) illustrating the process flow corresponding to the device cross-section illustrated in FIG. 5. FIG. 28 is a device cross-sectional view (a step of forming a gate polysilicon film) illustrating the process flow corresponding to the device cross-section illustrated in FIG. 5. FIG. 29 is a device cross-sectional view (a step of patterning the gate polysilicon film) illustrating the process flow corresponding to the device cross-section illustrated in FIG. 5. FIG. 30 is a device cross-sectional view (a step of introducing an N+ source region) illustrating the process flow corresponding to the device cross-section illustrated in FIG. 5. FIG. 31 is a device cross-sectional view (a step of forming an interlayer insulating film) illustrating the process flow corresponding to the device cross-section illustrated in FIG. 5. FIG. 32 is a device cross-sectional view (a step of forming a contact hole) illustrating the process flow corresponding to the device cross-section illustrated in FIG. 5. FIG. 33 is a device cross-sectional view (a step of introducing a P+ body contact region) illustrating the process flow corresponding to the device cross-section illustrated in FIG. 5. FIG. 34 is a device cross-sectional view (a step of forming an aluminum-based metal electrode) illustrating the process flow corresponding to the device cross-section illustrated in FIG. 5. Referring to these drawings, the major part of the wafer process in the manufacturing method of the semiconductor device according to the first embodiment of the present application will be described.

As illustrated in FIGS. 7 to 22, prepared is a semiconductor wafer 1 having, over an N+ silicon single crystal substrate is (used herein is, for example, a 200φ wafer, but the wafer diameter is not limited thereto but may be 150φ, 300φ, or 450φ) doped with, for example, antimony (for example, at a concentration of order from about $10^{18}$ to $10^{18}$/cm$^3$), a phosphorus-doped N epitaxial layer 1n having, for example, a thickness of about 50 micrometer (this layer is a region to be a drift region in the device and has a concentration of the order of, for example, $10^{15}$/cm$^3$, in other words, supposing that the N type lower-layer silicon epitaxial layer 1t has a thickness of about 30 micrometer and a phosphorus concentration of about $3\times10^{15}$/cm$^3$, the N type upper-layer silicon epitaxial layer 1d is adjusted to have a thickness of about 20 micrometer and a phosphorus concentration of about $4\times10^{15}$/cm$^3$). A hard mask film 22 for forming a P-column trench composed of, for example, P-TEOS (plasma tetraethyl orthosilicate) or the like is formed over a device surface 1a (main surface opposite to a backside surface 1b) of the semiconductor wafer 1. When patterning is conducted, the width Wn of the N-column region is, for example, about 6 micrometer and the width Wp of the P-column region is, for example, about 4 micrometer (meaning that the pitch of a super junction is about 10 micrometer).

As illustrated in FIG. 8 and FIG. 23, with the hard mask film 22 for forming a P-column trench (for example, a plasma TEOS film or a silicon nitride film, or a film stack thereof having a thickness of, for example, about 1.5 micrometer) as a mask, the N epitaxial layer 1n is anisotropically dry etched (for example at an etching depth of, for example, about 50 micrometer in a gas atmosphere, for example, a mixed gas atmosphere of Ar, $SF_6$, and $O_2$) to form a P-column trench 23. Then, the hard mask 22 which becomes unnecessary is removed.

As illustrated in FIGS. 9 and 24, the P-column trench 23 is then subjected to trench filling epitaxial growth to form a P type buried epitaxial layer 24 (having a boron concentration of, for example, about $5\times10^{15}$/cm$^3$). Examples of a raw material gas usable for this trench filling epitaxial growth include silicon tetrachloride, trichlorosilane, dichlorosilane, and monosilane. The preferable atmospheric pressure for this operation is, for example, in a range of from about 10 kPa to 110 kPa.

As illustrated in FIGS. 10 and 25, a planarization step using, for example, CMP (chemical mechanical polishing) is then performed to remove the P type buried epitaxial layer 24 outside the P-column trench 23 and at the same time, planarize the surface 1a of the semiconductor wafer 1.

As illustrated in FIG. 11, almost the entirety of the surface 1a of the semiconductor wafer 1 is then thermally oxidized to form a silicon oxide film 16 (which is a field oxide film and has a thickness of for example about 350 nm), followed by lithography to form a resist film 25 for introducing a P-resurf region over the silicon oxide film. With the resist film 25 for introducing the P-resurf region as a mask, ion implantation (with, for example, boron as a dopant at a dose of, for example, from about $1 \times 10^{11}$ to $1 \times 10^{12}/cm^2$ at an implantation energy of, for example, about 200 keV) is then conducted to introduce a P type surface resurf region 14. The resist film 25 which becomes unnecessary is then removed from the whole surface.

As illustrated in FIG. 12, a resist film 26 for processing the field insulating film is then formed over the field oxide film 16 by using lithography. With the film as a mask, the edge portion, the active cell region 6, and the like are exposed from the chip. The resist film 26 which becomes unnecessary is then removed from the whole surface.

As illustrated in FIGS. 13 and 26, a resist film 27 for introducing a P-body region is formed over the surface 1a of the semiconductor wafer 1a by using lithography. With the resist film as a mask, ion implantation (with boron as a dopant) is performed to introduce a P-body region 12. This ion implantation is performed in two steps as described below. The implantation in the first step is performed for example at an energy of the order of 200 keV and a dose of the order of $10^{13}/cm^2$. Then, ion implantation for example at an energy of the order of 75 keV and a dose of the order of $10^{12}/cm^2$ is performed as a second step.

As is apparent from the width and position 11x of the gate electrode illustrated in FIG. 26, the P-body region has already entered by about 1 micrometer into a portion which will be a gate electrode at the time of doping according to the introduction process of a non-self-alignment P-body region used herein so that a burden of the heat treatment performed later can be reduced. This leads to a reduction in an undesirable change of an impurity distribution of the super junction. Due to a side effect, however, the depth of the P-body region 12 decreases, which may result in a reduction in breakdown voltage. Such a problem is avoided by carrying out the ion implantation in two steps as described above to form the P-body region 12.

Thus, introduction of the P-body region 12 having the second conductivity type prior to the formation of a gate polysilicon film enables the introduction of it at the optimal position because the portion to be introduced is not limited by the width and the position of the gate. This contributes to a reduction in the burden of the heat treatment performed later and in addition, the subsequent heat treatment (including that for forming a gate polysilicon film) can be employed commonly. This non-self-alignment introduction process of a P-body region can similarly be applied to not only the case where a conventional epitaxial layer which will be a base for forming a super junction is a multiple layer but also the case where it is a single layer.

As illustrated in FIGS. 14 and 27, the surface 1a of the semiconductor wafer 1 is then thermally oxidized (for example, wet oxidized at a temperature of 950° C.) to form a gate oxide film 21 (having a film thickness of, for example, from about 50 to 200 nm).

As illustrated in FIGS. 15 and 28, a gate polysilicon film 11 (having a film thickness of, for example, from about 200 to 800 nm) is then formed over the gate oxide film 21 by using low-pressure CVD (chemical vapor deposition). Prior to the gate oxidation, wafer may be subjected to wet washing, for example, with a first washing liquid, that is, a 1:1:5 (volume ratio) mixture of ammonia, hydrogen peroxide, and pure water and a second washing liquid, that is, a 1:1:6 (volume ratio) mixture of hydrochloric acid, hydrogen peroxide, and pure water.

As illustrated in FIGS. 16 and 29, the gate polysilicon film is then patterned by dry etching to form a gate electrode 11.

As illustrated in FIGS. 17 and 30, lithography is then performed to form an N+ source region introducing resist film 28. With the film as a mask, ion implantation (for example, with arsenic) is performed to introduce an N+ source region 19, an N+ channel stopper region 8 at the chip edge, and the like (implantation is performed, for example, with arsenic as a dopant at a dose of, for example, the order of $10^{15}/cm^2$ and an ion implantation energy of, for example, about 40 keV). Then, the resist film 28 which becomes unnecessary is removed from the whole surface.

As illustrated in FIGS. 18 and 31, a PSG (phospho-silicate-glass) film 17 (interlayer insulating film) is then formed over almost the entirety of the surface 1a of the semiconductor wafer 1 by using CVD or the like (it may be planarized by laying an SOG film over the interlayer insulating film). As the interlayer insulating film 17, in addition to the PSG film, a BPSG film, a TEOS film, an SiN film, or the like film or a composite film thereof is usable. The total thickness of the interlayer insulating film 17 is, for example, about 900 nm.

As illustrated in FIGS. 19 and 32, a source contact hole opening resist film 29 is formed over the surface 1a of the semiconductor wafer 1 and with the resist film as a mask, dry etching is performed to open a source contact hole 20, a chip edge opening, and the like. The resist film 29, which becomes unnecessary, is then removed from the whole surface.

As illustrated in FIGS. 20 and 33, with the patterned interlayer insulating film 17 as a mask, the substrate surface is then anisotropically dry etched (for example, by a depth of about 0.3 micrometer) to form a recess region. Ion implantation into the recess region is then performed to form a P+ body contact region 18 and an outermost P+ region 7. This ion implantation is performed, for example, under the following conditions: dopant: $BF_2$, implantation energy: about 30 keV, and dose: on the order of $10^{15}/cm^2$.

As illustrated in FIGS. 21 and 34, an aluminum-based metal layer is formed via a barrier metal film such as TiW by using sputtering, followed by patterning to form a metal source electrode 5, a guard ring electrode 3, and the like.

Then, if necessary, a final passivation film such as inorganic final passivation film or organic final passivation film is formed thereover and a pad opening and a gate opening are made therein. As the final passivation film, not only a single-layer film of an inorganic final passivation film or organic final passivation film but also a film stack obtained by stacking an organic final passivation film over an inorganic finial passivation film may be used.

3. Description of a device structure (N/N-two-stage conventional epitaxy system) of a planar power MOSFET, which is an example of a semiconductor device according to a second embodiment of the present application (mainly FIGS. 35 and 36) The following example is a modification example (having the N type upper-layer silicon epitaxial layer 1d thicker than the N type lower-layer silicon epitaxial layer 1t) of the N type silicon epitaxial structure in the active cell structure (FIG. 5) and in the whole region (the N type lower-layer silicon epitaxial layer 1t and the N type upper-layer silicon epitaxial layer 1d illustrated in FIG. 3) described in Sections 1 and 2 (having the N type upper-layer silicon epitaxial layer 1d thinner than the N type lower-layer silicon epitaxial layer 1t). In the active cell region, the modification appears in the drift region 30, while in a region other than the active cell region, modification appears only in the N type silicon epitaxial layer 1n so that only the active cell region 6 (FIG. 35) will be described in the following example (which will equally apply to the other sections).

Figure 35:
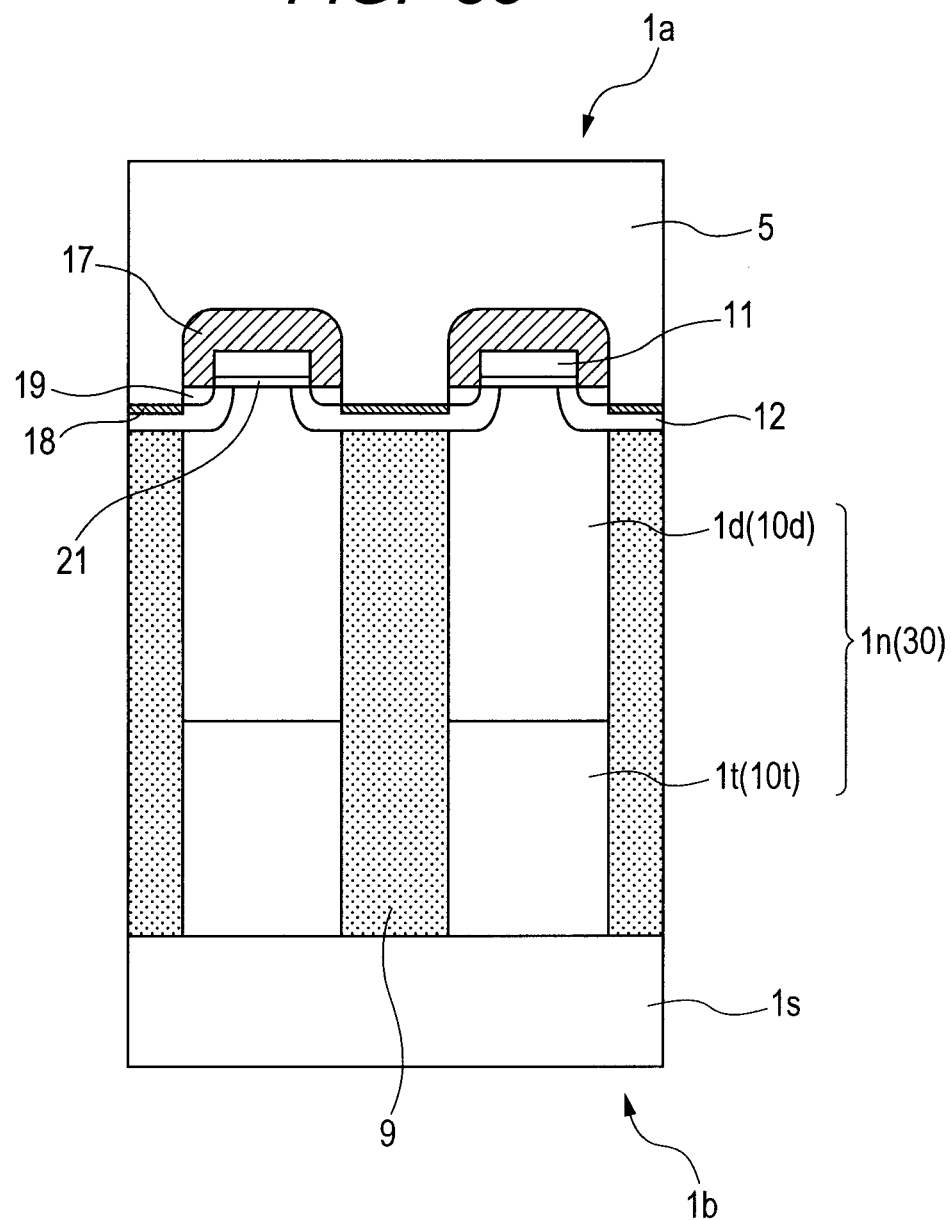
FIG. 35 is a device cross-sectional view (a second embodiment) corresponding to the B-B' cross-section of FIG. 1 and FIG. 2.
Figure 36:
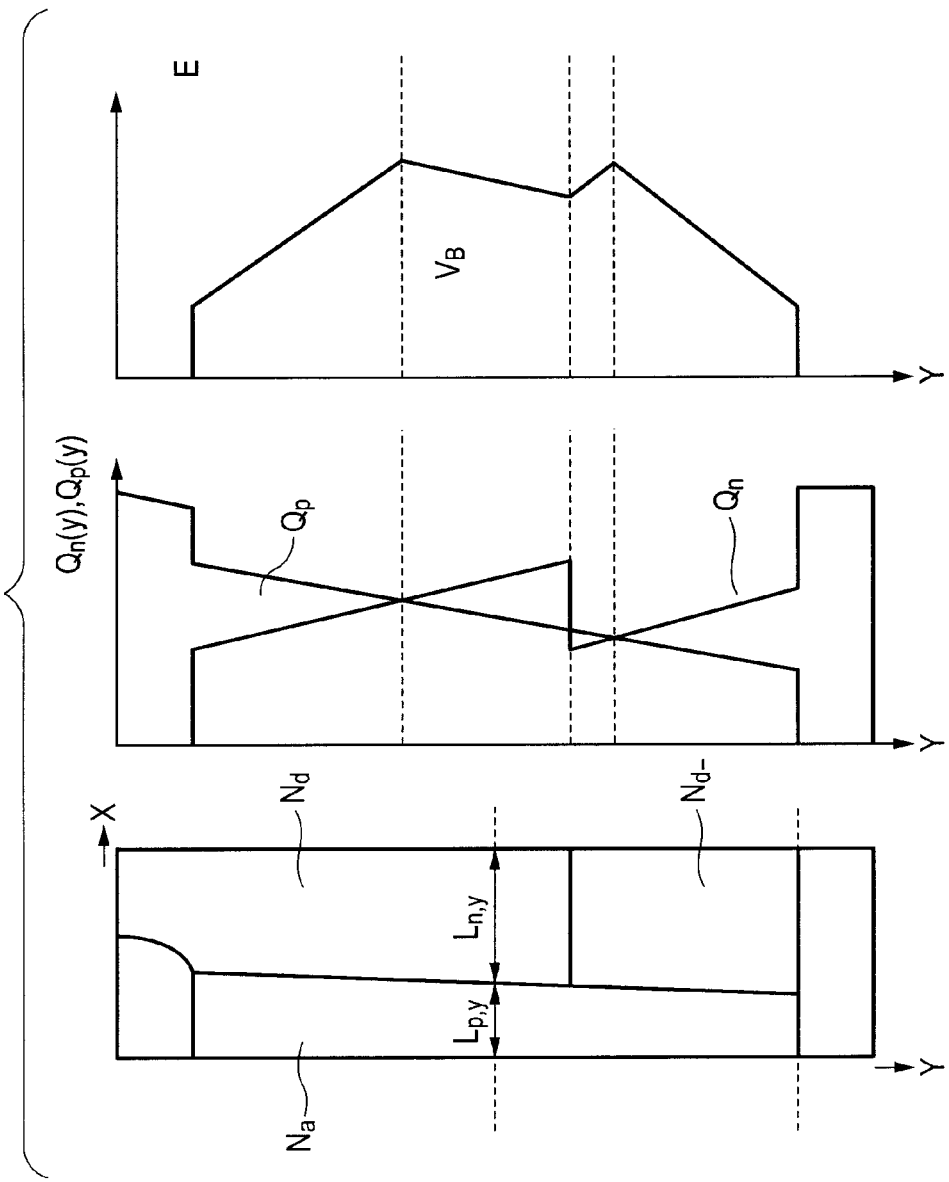
FIG. 36 is an explanatory view (an impurity region structure in the semiconductor substrate is illustrated on the left side, each charge distribution in the direction y is illustrated in the center, and the distribution of an absolute value of an electric field strength in the direction y is illustrated on the right side) of a charge distribution or the like of a super junction structure, corresponding to a half pitch portion thereof, of a drift region in the active cell region illustrated in FIG. 35.

FIG. 35 is a device cross-sectional view (the second embodiment) corresponding to the B-B' cross-section of FIGS. 1 and 2. FIG. 36 is an explanatory view (an impurity region structure in the semiconductor substrate is illustrated on the left side, each charge distribution in the direction y is illustrated in the center, and the distribution of an absolute value of an electric field strength in the direction y is illustrated on the right side) of a charge distribution or the like of a super junction structure, corresponding to a half pitch portion thereof, of a drift region in the active cell region illustrated in FIG. 35. Referring to these drawings, a description is made on the device structure (N/N-two-stage conventional epitaxy system) of a planar power MOSFET, which is an example of the semiconductor device according to the second embodiment of the present application.

The principal structure and object of this device are similar to those of the device illustrated in FIGS. 5 and 6. In this example, as illustrated in FIGS. 35 and 36, the impurity concentration of an N type upper-layer column region 10d (an N type upper-layer silicon epitaxial layer 1d) is set at a concentration (this donor concentration is represented by "Nd", which however does not apply to the concentration notation of members other than the column) at which a charge balance with the P-column region 9 can be maintained substantially. The impurity concentration of an N type lower-layer column region 10t (an N type lower-layer silicon epitaxial layer 1t) is on the other hand set at a donor concentration (this donor concentration is represented by "Nd-", which however does not apply to the concentration notation of members other than the column) a little lower than the impurity concentration of the N type upper-layer column region 10d. In this example, the N type upper-layer silicon epitaxial layer 1d has a thickness of, for example, about 30 micrometer and the N type lower-layer silicon epitaxial layer 1t has a thickness of, for example, about 20 micrometer.

Figure 37:
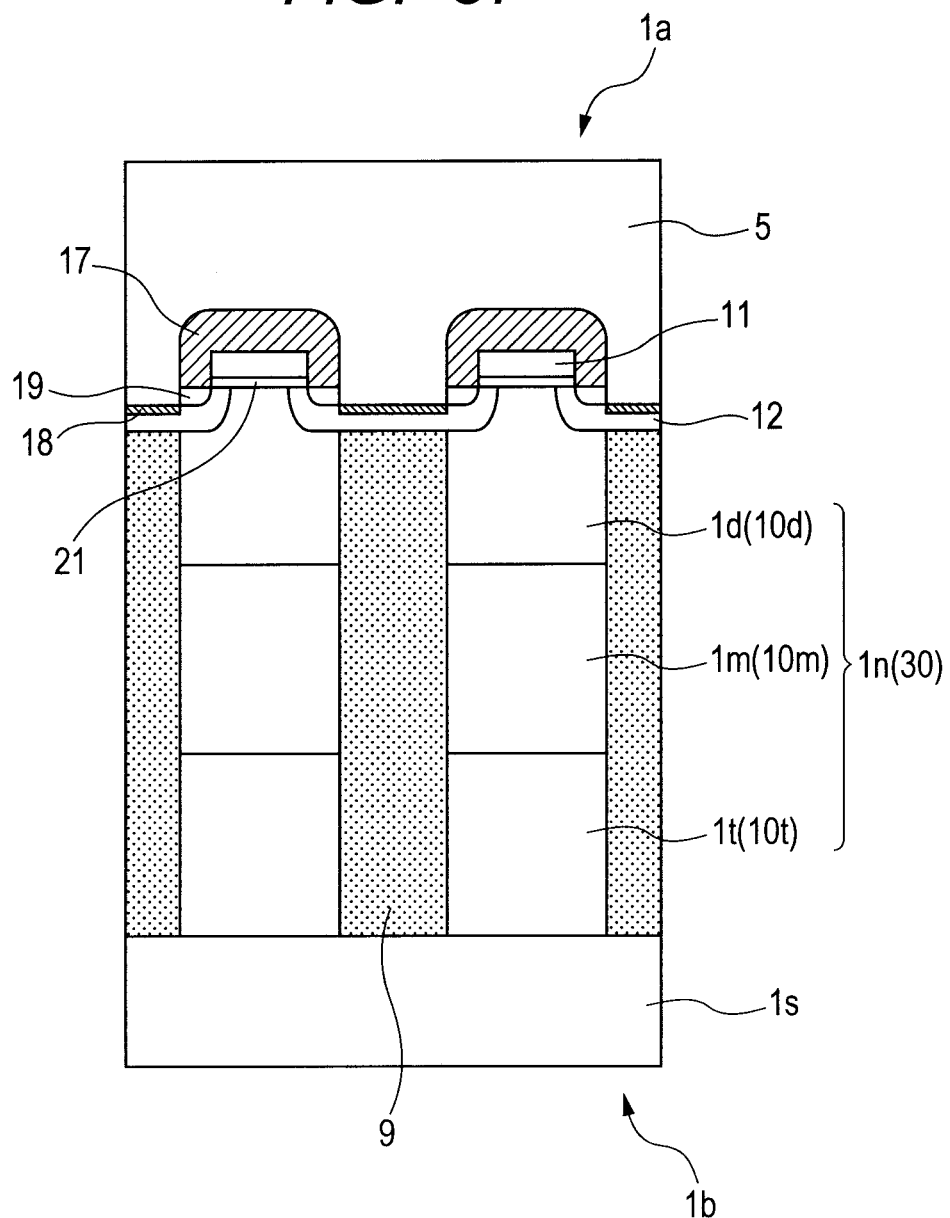
FIG. 37 is a device cross-sectional view (a third embodiment) corresponding to the B-B' cross-section of FIG. 1 and FIG. 2.
Figure 38:
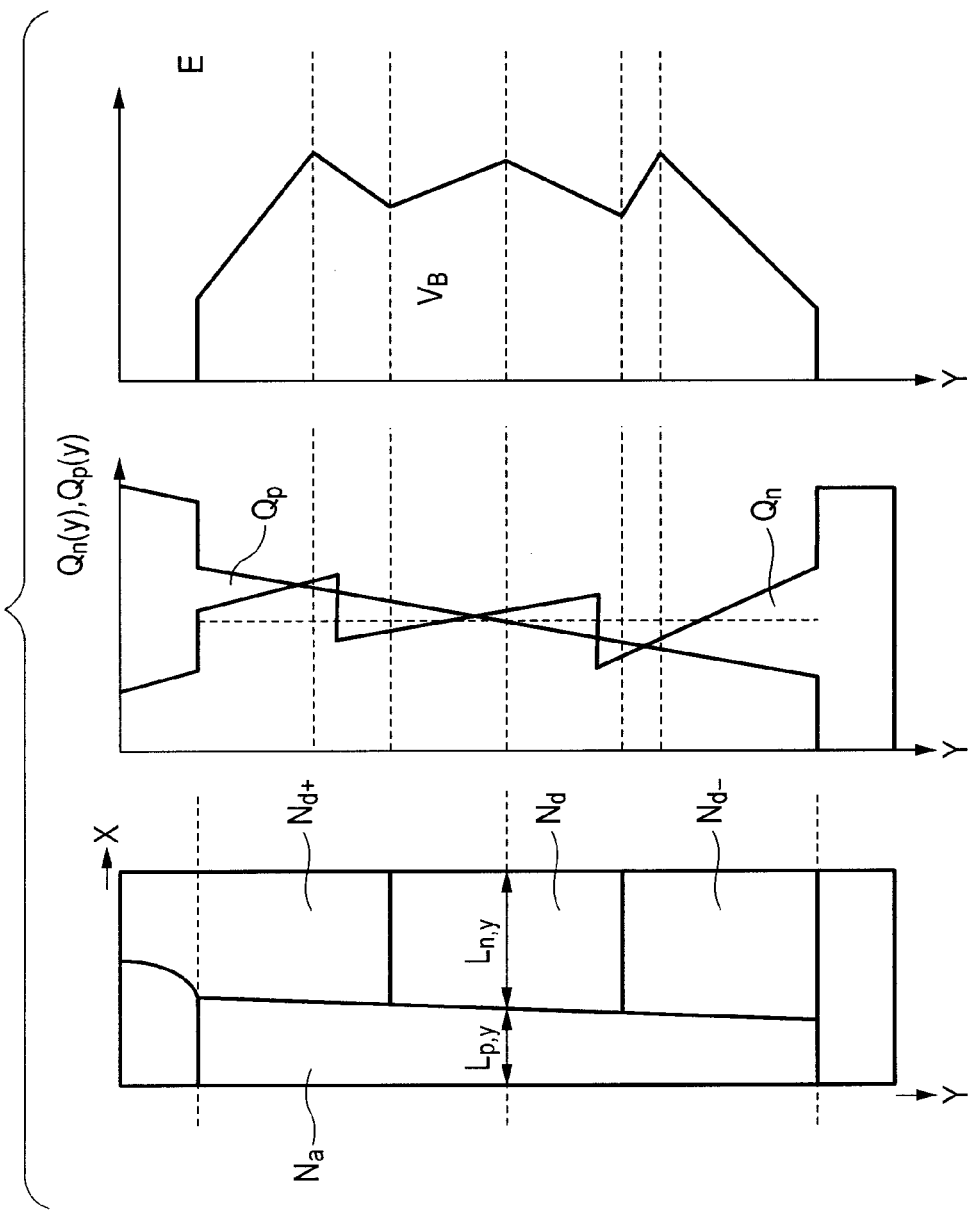
FIG. 38 is an explanatory view (an impurity region structure in the semiconductor substrate is illustrated on the left side, each charge distribution in the direction y is illustrated in the center, and the distribution of an absolute value of an electric field strength in the direction y is illustrated on the right side) of a charge distribution or the like of a super junction structure, corresponding to a half pitch portion thereof, of a drift region in the active cell region illustrated in FIG. 37.

4. Description of a device structure (N+/N/N− three-stage conventional epitaxy system) of a planar power MOSFET, which is an example of a semiconductor device according to a third embodiment of the present application (referring mainly to FIGS. 38 and 38). FIG. 37 is a device cross-sectional view (the third embodiment) corresponding to the B-B' cross-section of FIG. 1 and FIG. 2. FIG. 38 is an explanatory view (an impurity region structure in the semiconductor substrate is illustrated on the left side, each charge distribution in the direction y is illustrated in the center, and the distribution of an absolute value of an electric field strength in the direction y is illustrated on the right side) of a charge distribution or the like of a super junction structure, corresponding to a half pitch portion, of a drift region in the active cell region illustrated in FIG. 37. Based on these drawings, the device structure (N+/N/N− three-stage conventional epitaxial system) of a planar power MOSFET, which is an example of the semiconductor device according to the third embodiment of the present application) will be described.

The principal structure and object of this device are similar to those of the device illustrated in FIGS. 5 and 6. In this example, as illustrated in FIGS. 37 and 38, the N type silicon epitaxial layer 1n (the N-column region 10) has a three-layer structure. Described specifically, it has an N type middle-layer silicon epitaxial layer 1m (an N type middle-layer column region 10m), an N type upper-layer silicon epitaxial layer 1d (an N type upper-layer column region 10d) thereover, and an N type lower-layer silicon epitaxial layer 1t (an N type lower-layer column region 10t) serving as a bottom layer. These epitaxial layers have, for example, a thickness of about 16 micrometer, about 17 micrometer, and about 17 micrometer, respectively, in order from top.

In this example, the impurity concentration of the N type middle-layer column region 10m is set at a concentration (this donor concentration is represented by "Nd", which however does not apply to the concentration notation of members other than the column) at which a charge balance with the P-column region 9 can be maintained substantially. The impurity concentration of the N type lower-layer column region 10t is set at a donor concentration (this donor concentration is represented by "Nd-", which however does not apply to the concentration notation of members other than the column) a little lower than the impurity concentration of the N type middle-layer column region 10m. On the other hand, the impurity concentration of the N type upper-layer column region 10d is set at a donor concentration (this donor concentration is represented by "Nd+", which however does not apply to the concentration notation of members other than the column) a little higher than the impurity concentration of the N type middle-layer column region 10m.

In the case of this example, as illustrated on the left side of FIG. 38, there exist three peak points or maximum points of an electric field strength so that a higher breakdown voltage can be secured compared with the case where there exist two points.

Figure 39:
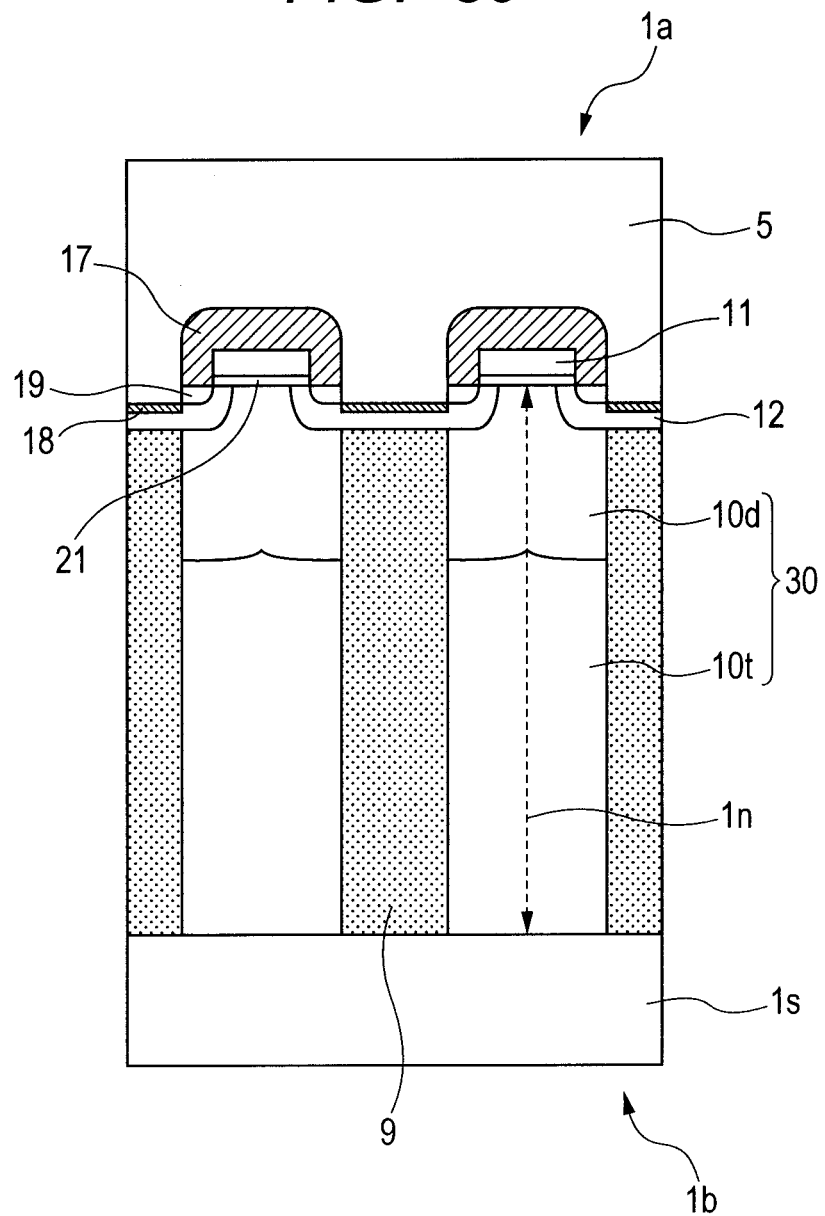
FIG. 39 is a device cross-sectional view (fourth embodiment) corresponding to the B-B' cross-section of FIG. 1 and FIG. 2.
Figure 40:
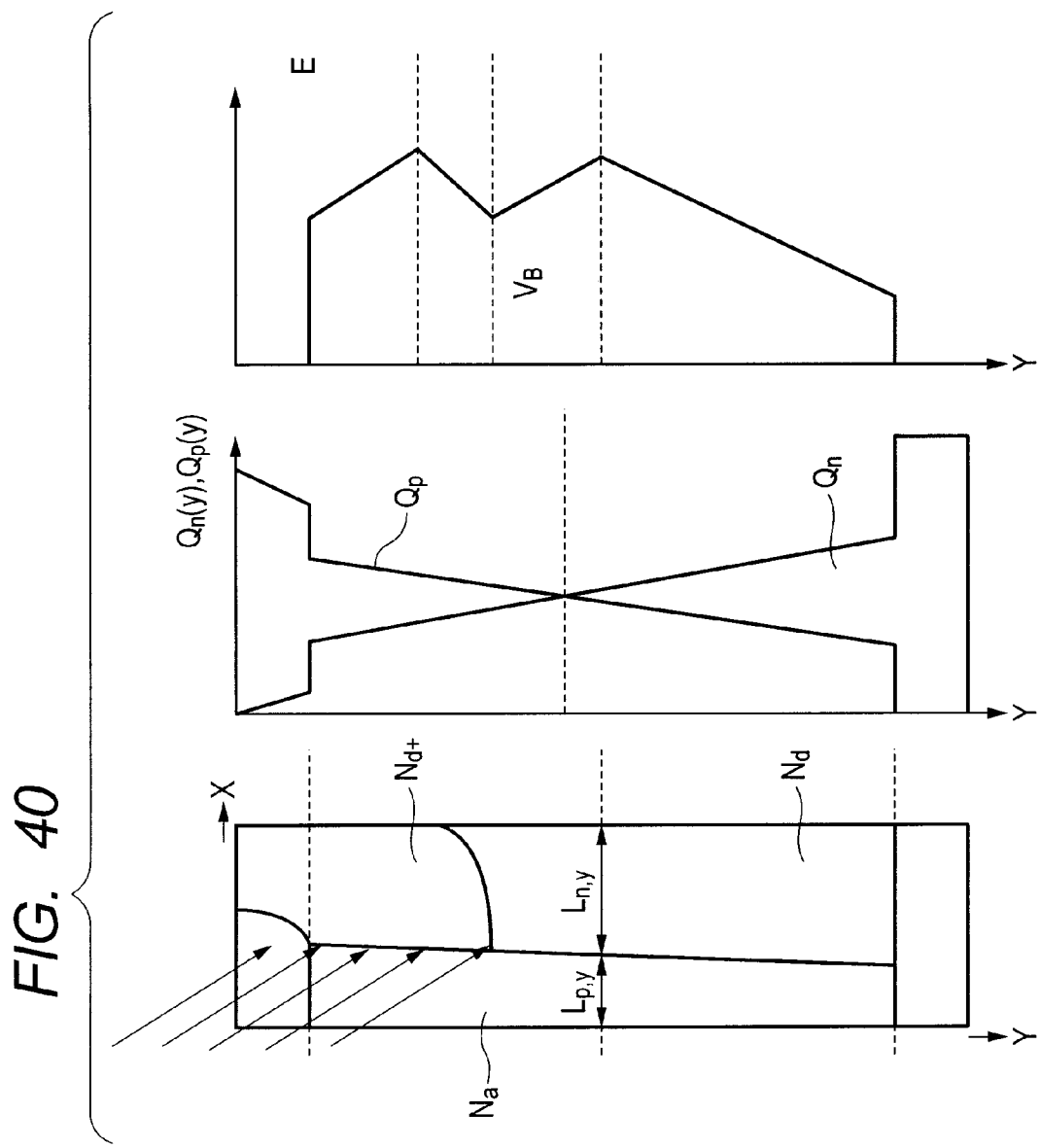
FIG. 40 is an explanatory view (an impurity region structure in the semiconductor substrate is illustrated on the left side, each charge distribution in the direction y is illustrated in the center, and the distribution of an absolute value of an electric field strength in the direction y is illustrated on the right side) of a charge distribution or the like of a super junction structure, corresponding to a half pitch portion thereof, of a drift region in the active cell region illustrated in FIG. 39.

5. Description of a device structure (upper-portion ion implantation N+/N conventional single epitaxy system) of a planar power MOSFET, which is an example of a semiconductor device according to a fourth embodiment of the present application (referring mainly to FIGS. 39 and 40). FIG. 39 is a device cross-sectional view (the fourth embodiment) corresponding to the B-B' cross-section of FIG. 1 and FIG. 2. FIG. 40 is an explanatory view (an impurity region structure in the semiconductor substrate is illustrated on the left side, each charge distribution in the direction y is illustrated in the center, and the distribution of an absolute value of an electric field strength in the direction y is illustrated on the right side) of a charge distribution or the like of a super junction structure, corresponding to a half pitch portion, of a drift region in the active cell region illustrated in FIG. 39. Based on these drawings, the device structure (upper-portion ion implantation N+/N conventional single epitaxy system) of a planar power MOSFET, which is an example of the semiconductor device according to the fourth embodiment of the present application, will be described.

This example is structurally similar to that described in Section 1 (FIG. 5), but different in that the high-concentration portion of the N type upper-layer column region 10d is formed by ion implantation not into the upper layer of a multilayer epitaxial layer but into the upper half portion of an N type silicon epitaxial layer 1n which is a single layer. In a region free of a super junction structure, therefore, the N type silicon epitaxial layer 1n remains as a single layer. Here, similar to Section 1, the impurity concentration of the N type lower-layer column region 10t is set at a concentration (this donor concentration is represented by "Nd", which however does not apply to the concentration notation of members other than the column) at which a charge balance with the P-column region 9 is maintained substantially. On the other hand, the impurity concentration of the N type upper-layer column region 10d is set at a donor concentration (this donor concentration is represented by "Nd+", which however does not apply to the concentration notation of members other than the column) a little higher than the impurity concentration of the N type lower-layer column region 10t. In the case of this example, as illustrated in FIG. 40, the breakdown voltage is almost similar to that in the case as illustrated in FIG. 6. In this example, the N type upper-layer column region 10d has a thickness (depth) of, for example, about 16 micrometer.

It is also possible, as in Section 3, to set the impurity concentration of the N type upper-layer column region 10d (the N type upper-layer silicon epitaxial layer 1d) at a concentration (this donor concentration is represented by "Nd", but it does not apply to the concentration notation of members other than the column) at which a charge balance with the P-column region 9 can be maintained substantially, while setting the impurity concentration of the N type lower-layer column region 10t (the N type lower-layer silicon epitaxial layer 1t) at a donor concentration (this donor concentration is represented by "Nd−", but it does not apply to the concentration notation of members other than the column) a little lower than the impurity concentration of the N type upper-layer column region 10d. In this case, the breakdown voltage becomes almost similar to that in FIG. 36.

6. Description of the major part of a wafer process in the manufacturing method of a semiconductor device according to a fourth embodiment of the present application (referring mainly to FIGS. 41 to 44). In this section, the major part of the process corresponding to the active cell region described in Section 5 will be described. The fundamental portions are similar to those described in Section 2 so that only a different portion will next be described.

Figure 41:
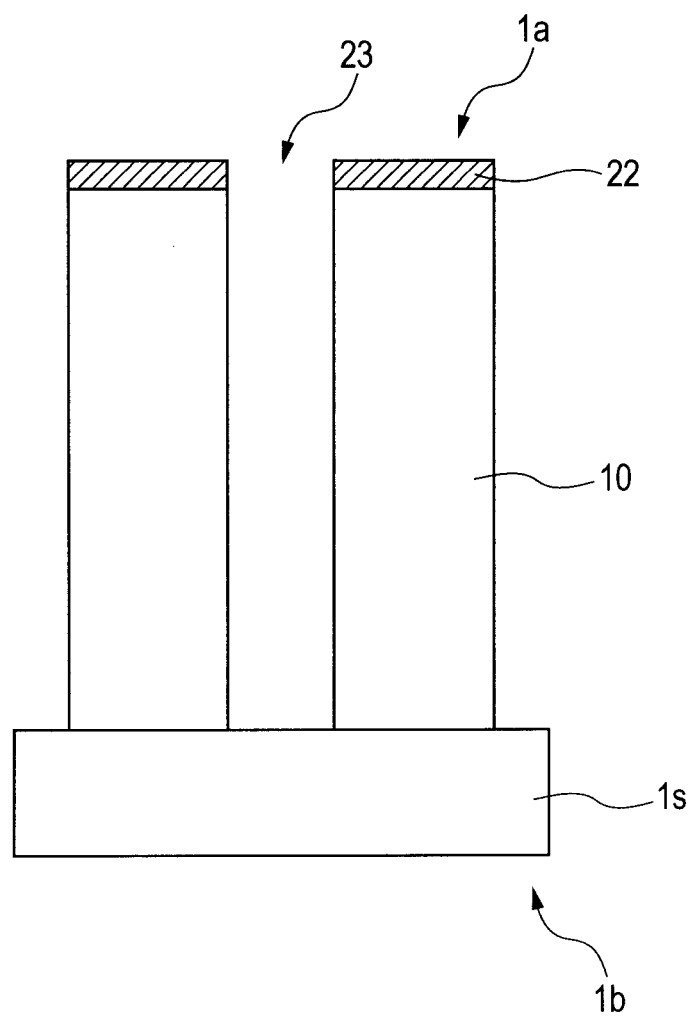
FIG. 41 is a device cross-sectional view (a step of patterning a hard mask film for opening a P-column trench) illustrating a process flow (the fourth embodiment) corresponding to the device cross-section illustrated in FIG. 39.
Figure 42:
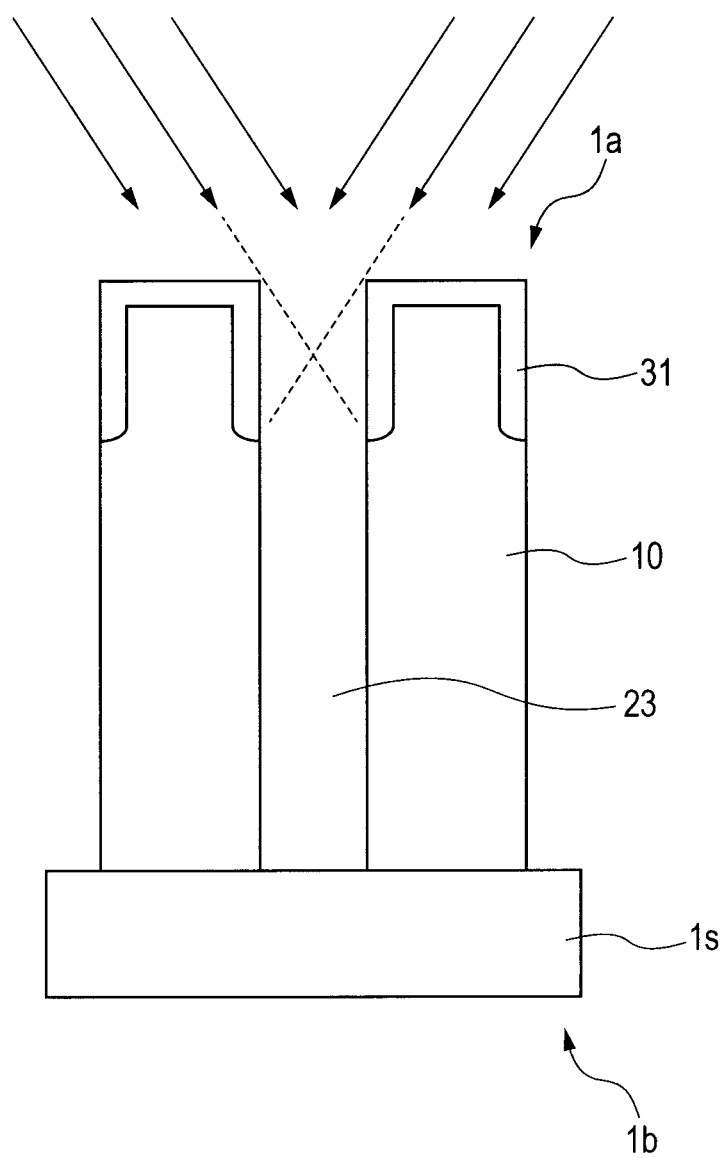
FIG. 42 is a device cross-sectional view (a step of obliquely implanting ions into an N-column region) illustrating the process flow (the fourth embodiment) corresponding to the device cross-section illustrated in FIG. 39.
Figure 43:
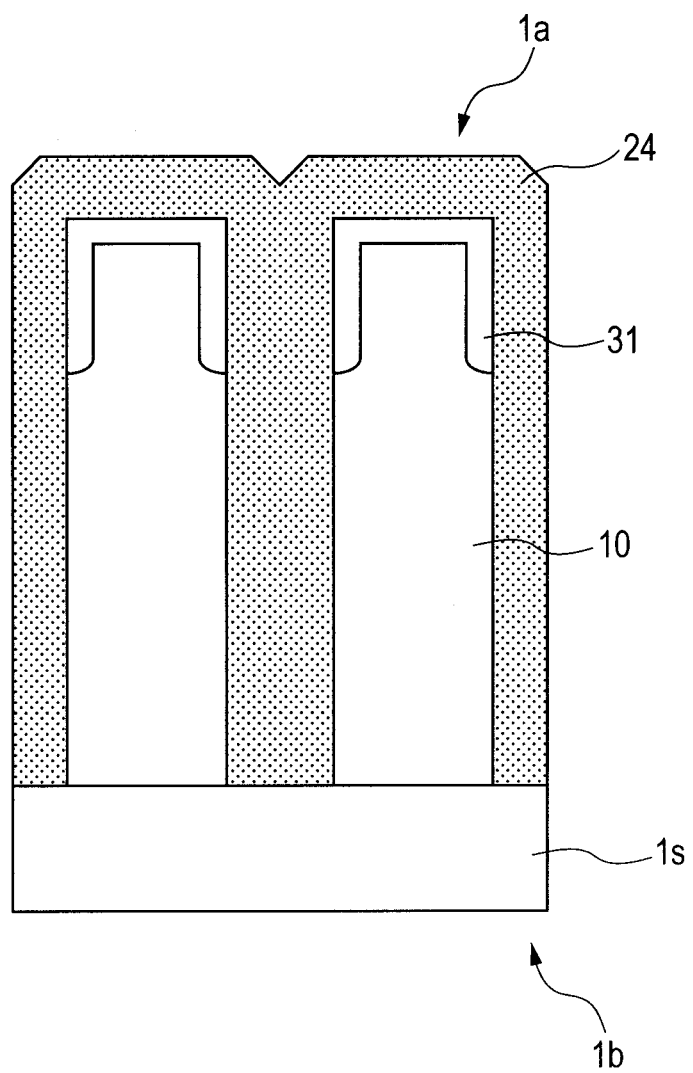
FIG. 43 is a device cross-sectional view (an epitaxy trench filling step) illustrating the process flow (the fourth embodiment) corresponding to the device cross-section illustrated in FIG. 39.
Figure 44:
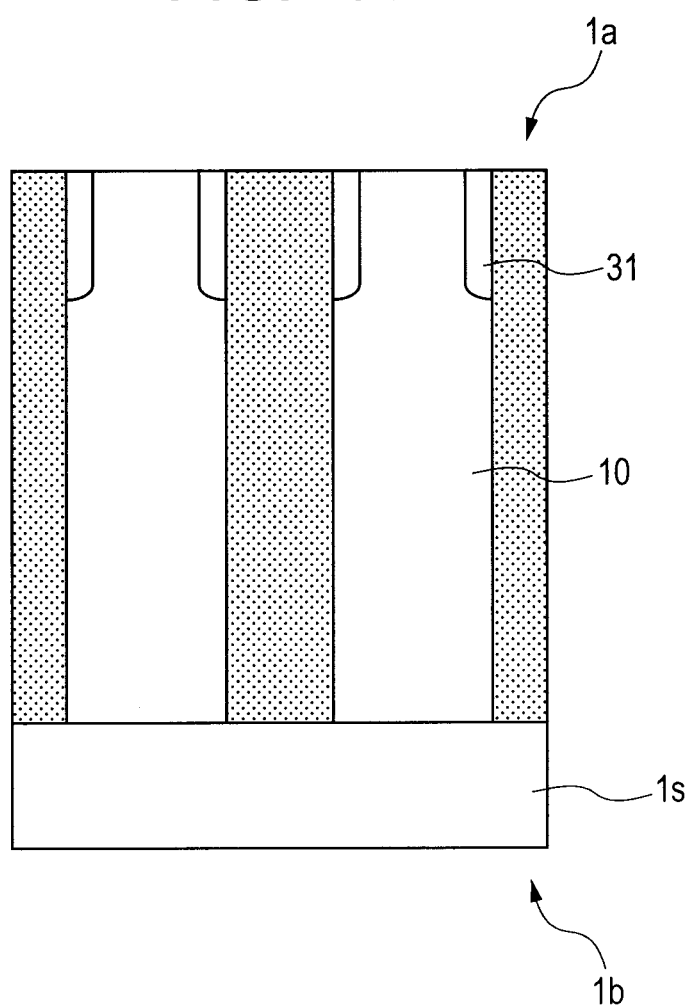
FIG. 44 is a device cross-sectional view (a planarization step) illustrating the process flow (the fourth embodiment) corresponding to the device cross-section illustrated in FIG. 39.

FIG. 41 is a device cross-sectional view (a step of patterning a hard mask film for opening a P-column trench) illustrating a process flow (the fourth embodiment) corresponding to the device cross-section illustrated in FIG. 39. FIG. 42 is a device cross-sectional view (a step of obliquely implanting ions into an N-column region) illustrating the process flow (the fourth embodiment) corresponding to the device cross-section illustrated in FIG. 39. FIG. 43 is a device cross-sectional view (an epitaxy trench filling step) illustrating the process flow (the fourth embodiment) corresponding to the device cross-section illustrated in FIG. 39. FIG. 44 is a device cross-sectional view (a planarization step) illustrating the process flow (the fourth embodiment) corresponding to the device cross-section illustrated in FIG. 39. Based on these drawings, the major part of the wafer process in the manufacturing method of the semiconductor device according to the fourth embodiment of the present application will be described.

As illustrated in FIG. 41, with a P-column trench forming hard mask film 22 as a mask, an N epitaxial layer 1n (having a thickness of, for example, about 50 micrometer) is dry etched to form a P-column trench 23. The hard mask 22 which becomes unnecessary is then removed.

As illustrated in FIG. 42, ion implantation is then performed from a plurality of oblique directions (for example, with phosphorus as a dopant at an ion implantation energy of about 30 keV and a dose of the order of $10^{15}/cm^2$) to form an N type impurity ion implantation region 31.

As illustrated in FIG. 43, the P-column trench 23 is then subjected to trench filling epitaxial growth to form a p type buried epitaxial layer 24 (having a boron concentration of, for example, $5\times10^{15}/cm^3$).

As illustrated in FIG. 44, a planarization step, for example, CMP is conducted to remove the P type buried epitaxial layer 24 outside the P-column trench 23 and at the same time planarize the surface 1a of the semiconductor wafer 1.

Steps after that are almost similar to those after the step illustrated in FIG. 26 in Section 2 (after the step illustrated in FIG. 11 when the other regions are included).

7. Description of a device structure (N+/N two-stage conventional epitaxy system) of a trench power MOSFET, which is a modification example of the semiconductor device of the first embodiment of the present application (referring mainly to FIG. 45) In this section, the active cell structure illustrated in FIG. 5 but having a trench gate will be described. A trench type vertical power MOSFET having a super junction is considered to be mainly effective for actualizing a source-drain breakdown voltage of from about 100 V to 300 V. Accordingly, a description will be made with a device having a source-drain breakdown voltage of about 200 V as an example (which will equally apply to other sections described below).

Figure 45:
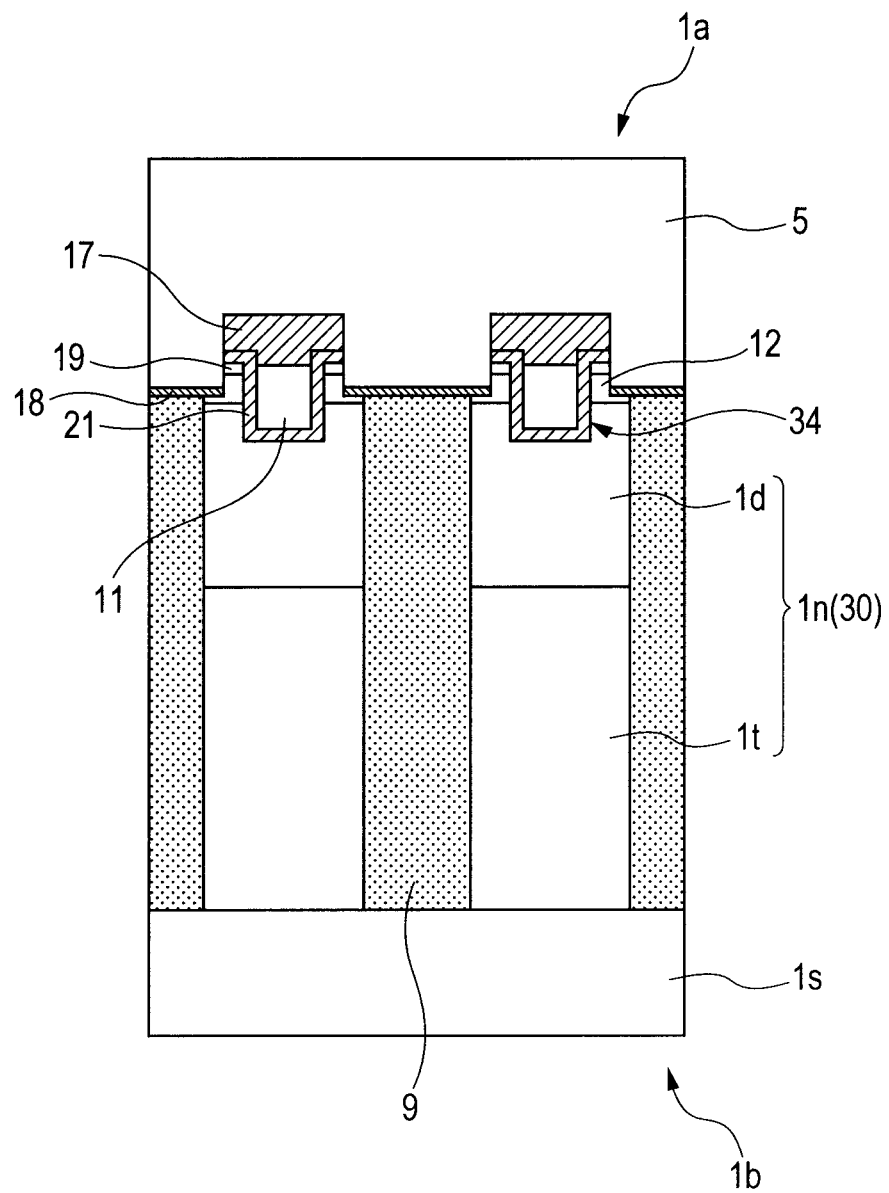
FIG. 45 is a device cross-sectional view (a trench power MOSFET which is a modification example of the first embodiment) corresponding to the B-B' cross-section illustrated in FIGS. 1 and 2.

FIG. 45 is a device cross-sectional view (a planarization step) showing a process flow (the fourth embodiment) corresponding to the device cross-section of FIG. 5. Based on this drawing, a description will next be made on the device structure (N+/N two-stage conventional epitaxy system) of a trench-type power MOSFET, which is a modification example of the semiconductor device according to the first embodiment of the present application.

As illustrated in FIG. 45, a linear polysilicon gate electrode 11 is buried in a gate trench 34 (a linear trench for gate) via a gate insulating film 21. This trench gate structure facilitates realization of low ON resistance compared with the planar type (examples described in the sections before Section 6). On the other hand, it is disadvantageous over the planar type from the standpoint of realizing a source-drain breakdown voltage in a range of from 500 to 600 volt.

8. Description of the major part of a wafer process in the manufacturing method of a semiconductor device according to the modification example of the first embodiment of the present application (referring mainly to FIGS. 46 to 61). Although the semiconductor device has a trench gate structure, the device, as a whole, is fundamentally the same as that described in Section 2, with only a difference in the manufacturing method attributable to a difference in the structure of the active cell. A description will therefore be made mainly on the different portions.

Figure 46:
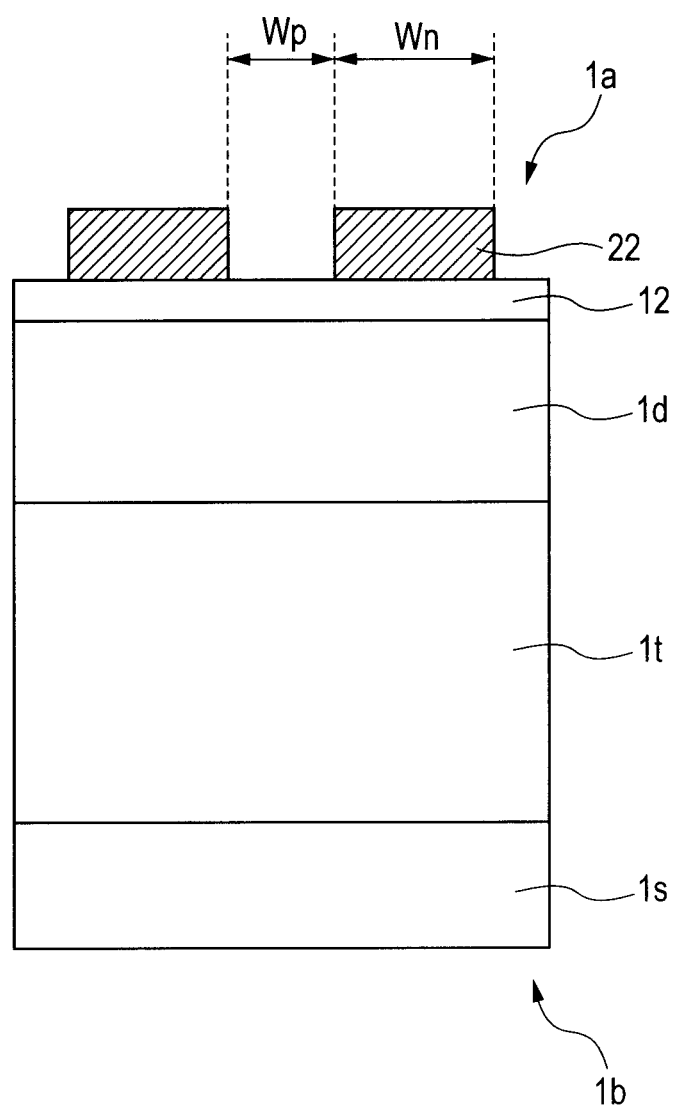
FIG. 46 is a device cross-sectional view (a step of patterning a hard mask film for opening a P-column trench) illustrating a process flow (a trench power MOSFET which is a modification example of the first embodiment) corresponding to the device cross-section illustrated in FIG. 45.
Figure 47:
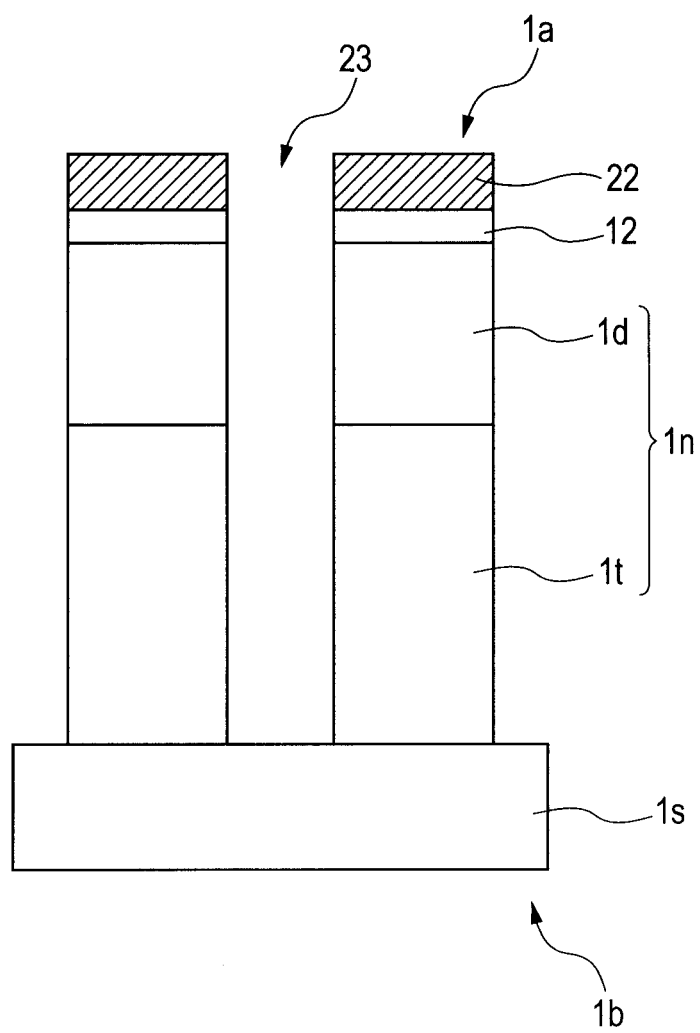
FIG. 47 is a device cross-sectional view (a step of opening a P-column trench) illustrating the process flow (the trench power MOSFET which is a modification example of the first embodiment) corresponding to the device cross-section illustrated in FIG. 45.
Figure 48:
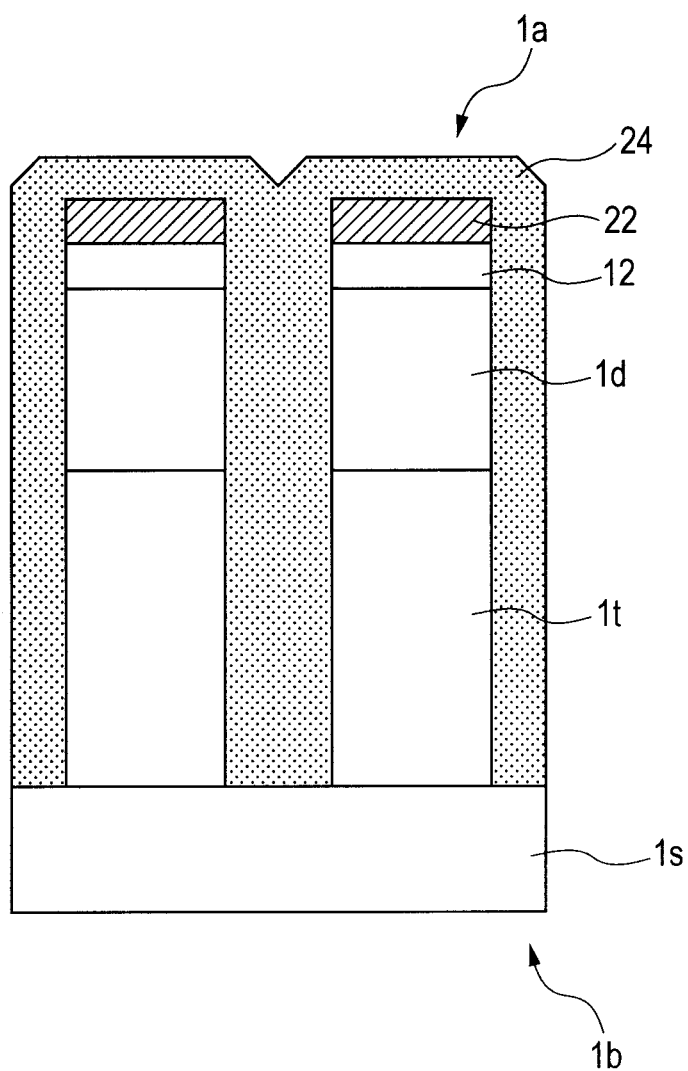
FIG. 48 is a device cross-sectional view (an epitaxy trench filling step) illustrating the process flow (the trench power MOSFET which is a modification example of the first embodiment) corresponding to the device cross-section illustrated in FIG. 45.
Figure 49:
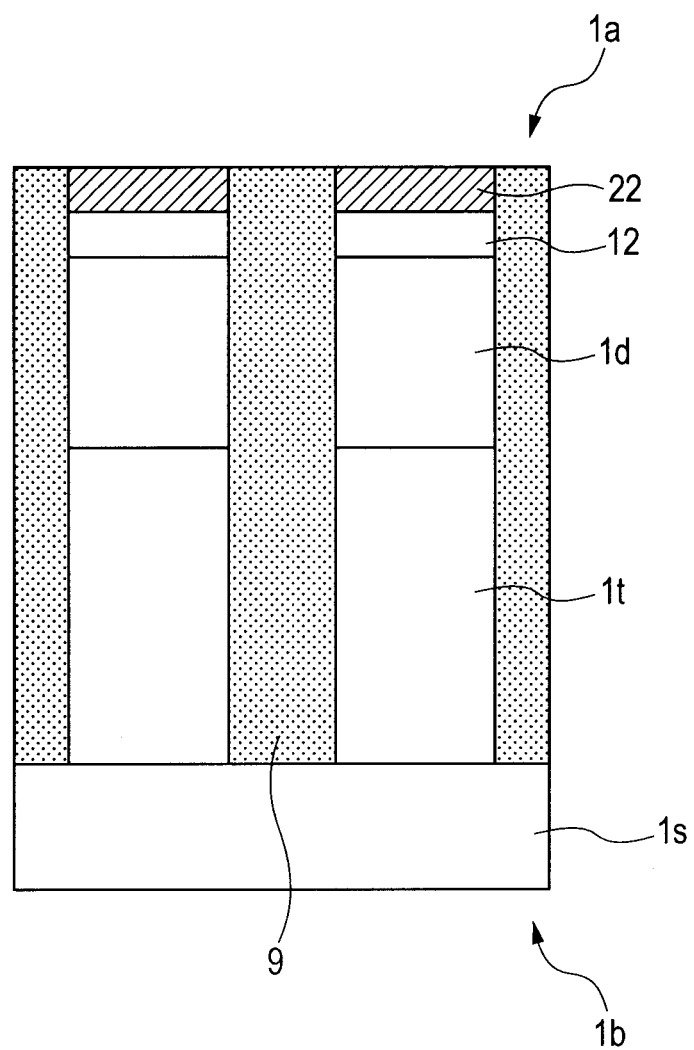
FIG. 49 is a device cross-sectional view (a planarization step) illustrating the process flow (the trench power MOSFET which is a modification example of the first embodiment) corresponding to the device cross-section illustrated in FIG. 45.
Figure 50:
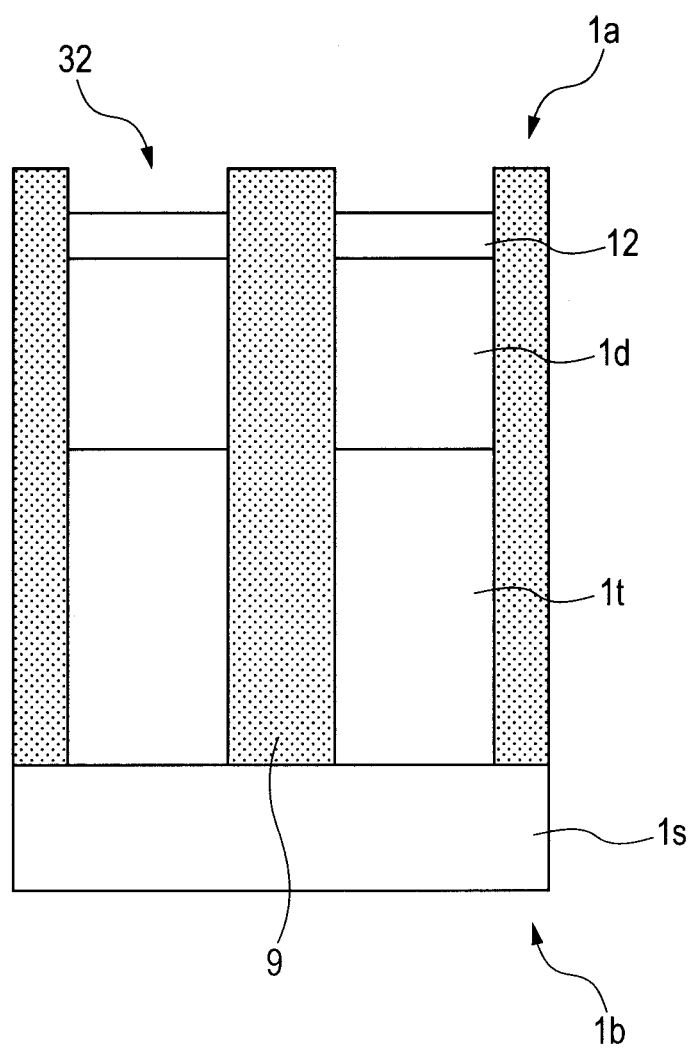
FIG. 50 is a device cross-sectional view (a step of removing an insulating film hard mask) illustrating the process flow (the trench power MOSFET which is a modification example of the first embodiment) corresponding to the device cross-section illustrated in FIG. 45.
Figure 51:
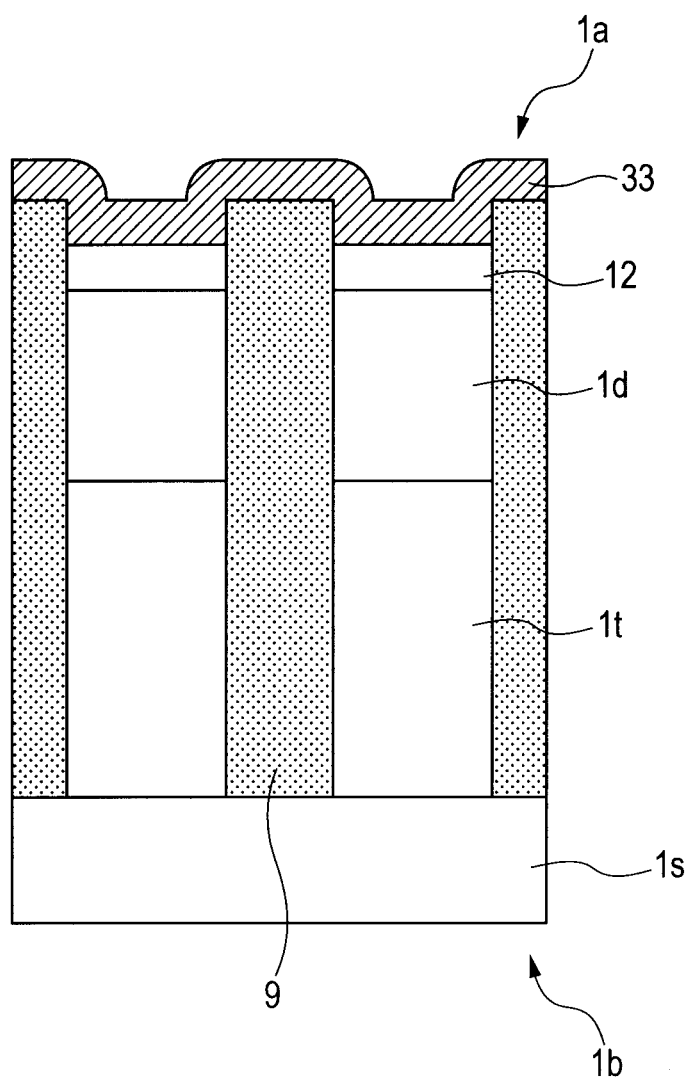
FIG. 51 is a device cross-sectional view (a step of forming an insulating film for trench etching) illustrating the process flow (the trench power MOSFET which is a modification example of the first embodiment) corresponding to the device cross-section illustrated in FIG. 45.
Figure 52:
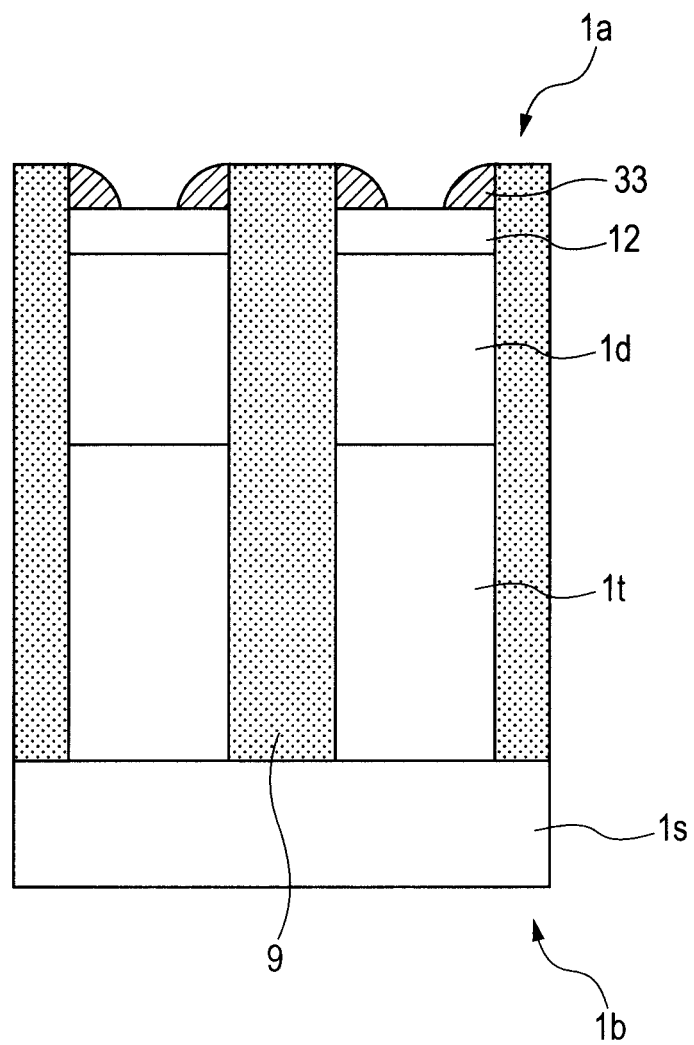
FIG. 52 is a device cross-sectional view (a step of anisotropically etching back the insulating film for trench etching) illustrating the process flow (the trench power MOSFET which is a modification example of the first embodiment) corresponding to the device cross-section illustrated in FIG. 45.
Figure 53:
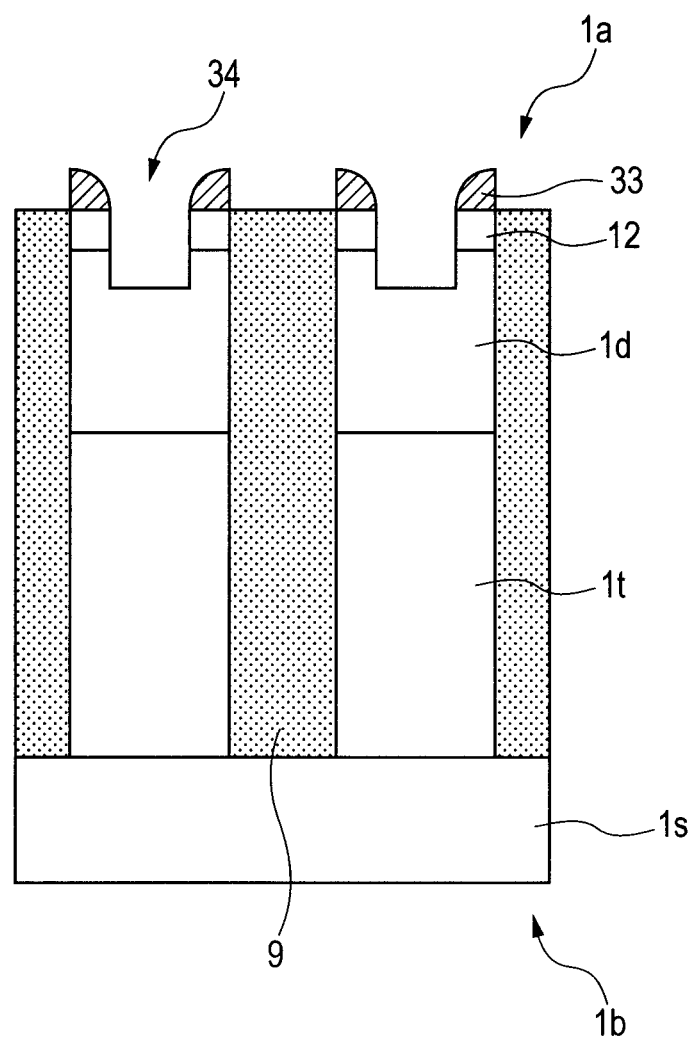
FIG. 53 is a device cross-sectional view (a gate trench etching step) illustrating the process flow (the trench power MOSFET which is a modification example of the first embodiment) corresponding to the device cross-section illustrated in FIG. 45.
Figure 54:
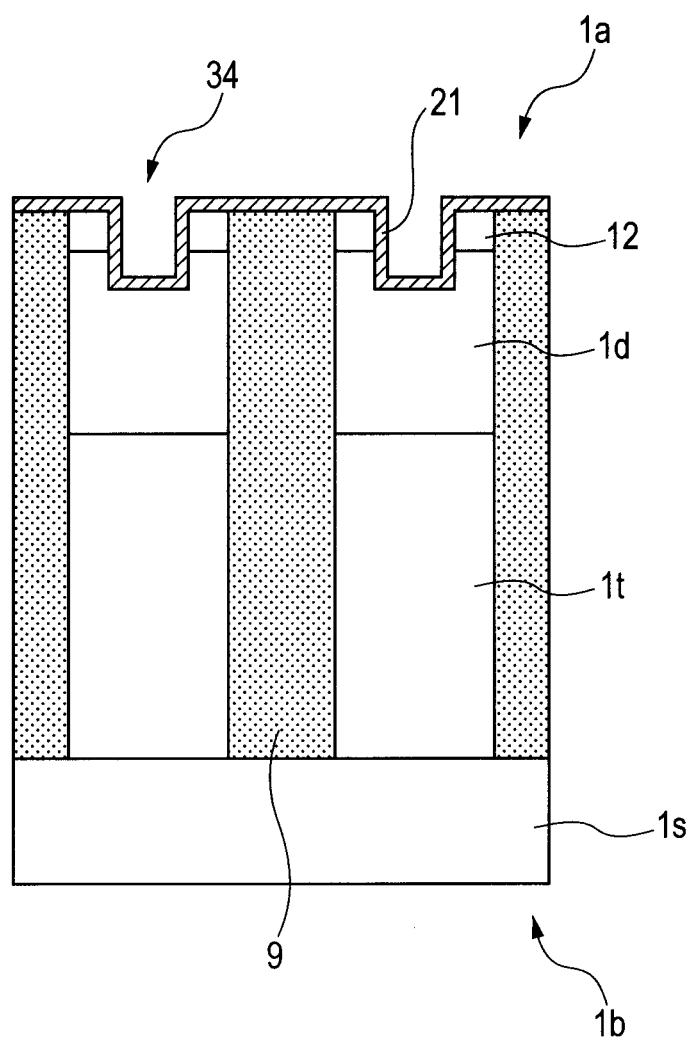
FIG. 54 is a device cross-sectional view (a gate oxidation step) illustrating the process flow (the trench power MOSFET which is a modification example of the first embodiment) corresponding to the device cross-section illustrated in FIG. 45.
Figure 55:
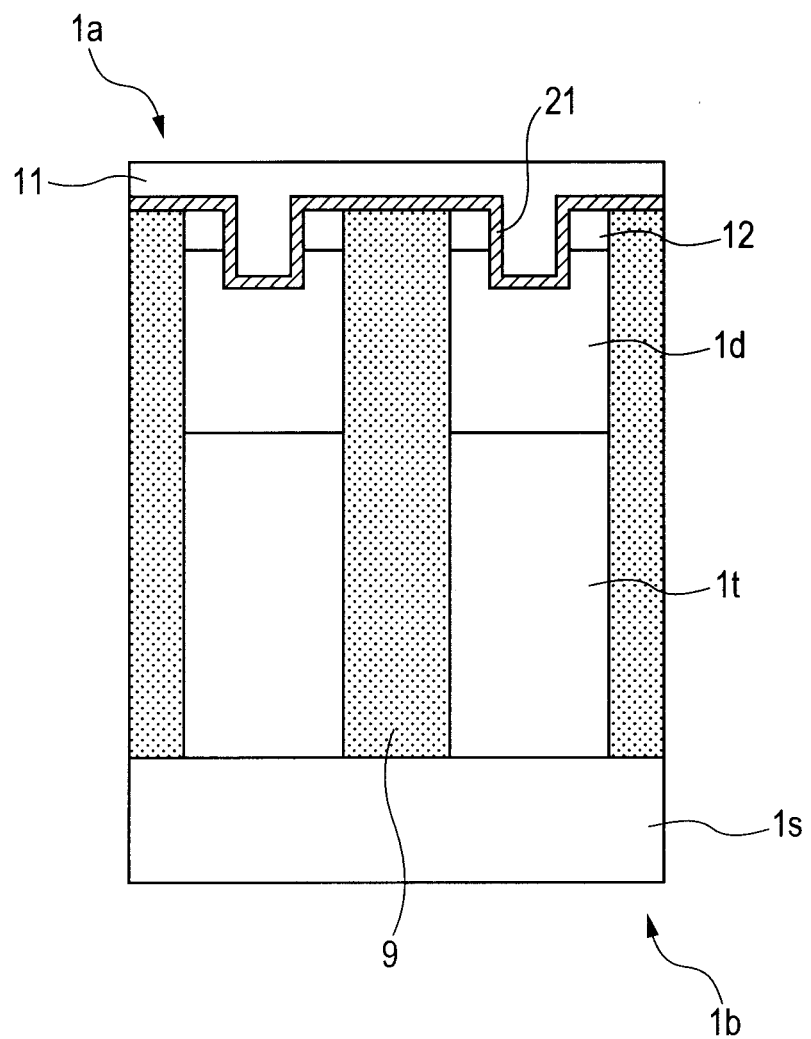
FIG. 55 is a device cross-sectional view (a step of forming a gate polysilicon film) illustrating the process flow (the trench power MOSFET which is a modification example of the first embodiment) corresponding to the device cross-section illustrated in FIG. 45.
Figure 56:
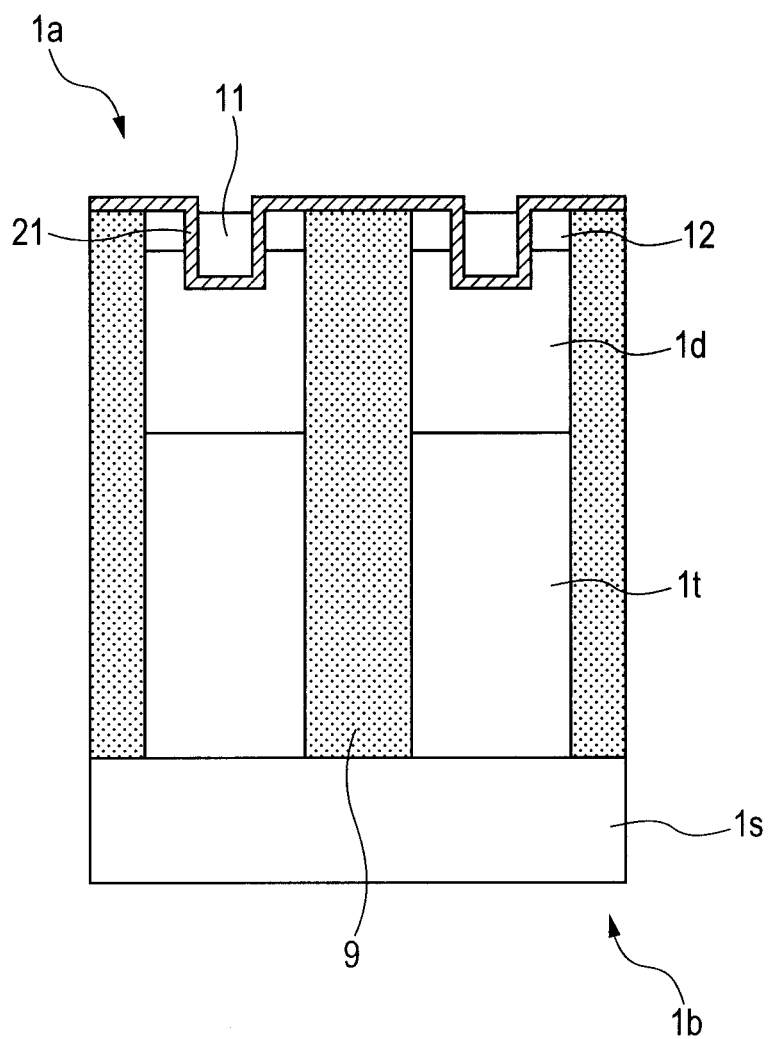
FIG. 56 is a device cross-sectional view (a step of patterning the gate polysilicon film) illustrating the process flow (the trench power MOSFET which is a modification example of the first embodiment) corresponding to the device cross-section illustrated in FIG. 45.
Figure 57:
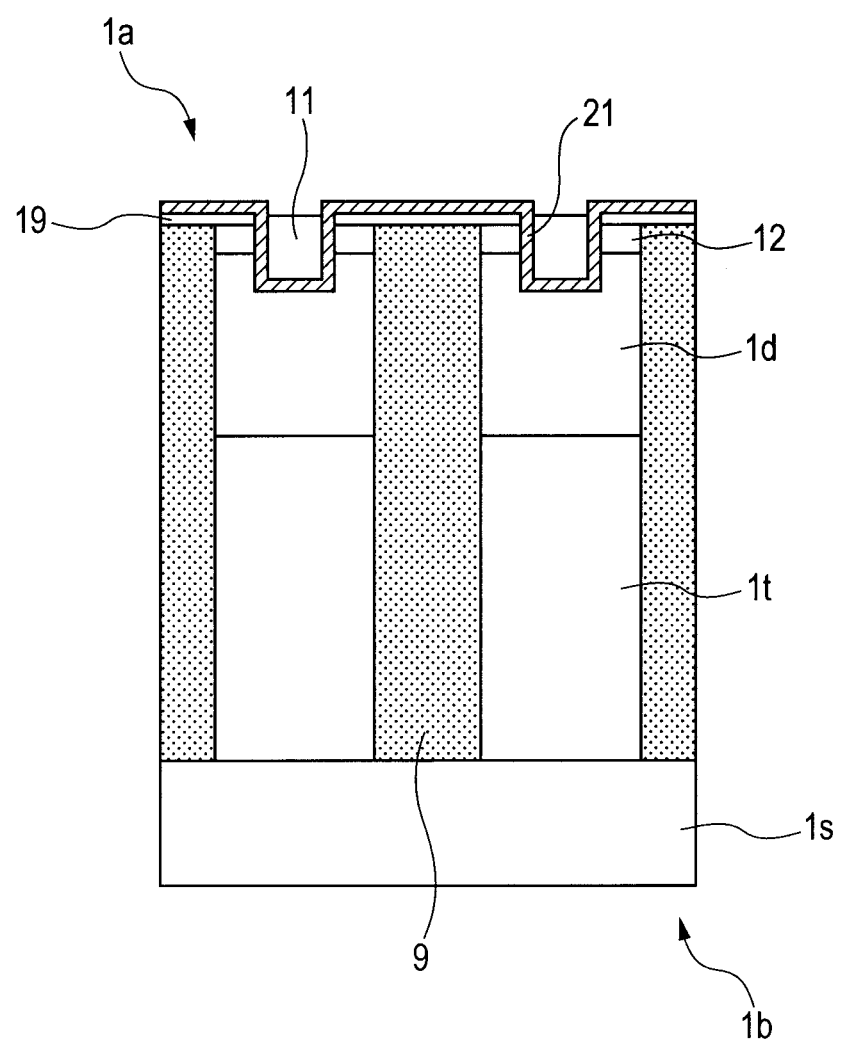
FIG. 57 is a device cross-sectional view (a step of introducing an N+ source region) illustrating the process flow (the trench power MOSFET which is a modification example of the first embodiment) corresponding to the device cross-section illustrated in FIG. 45.
Figure 58:
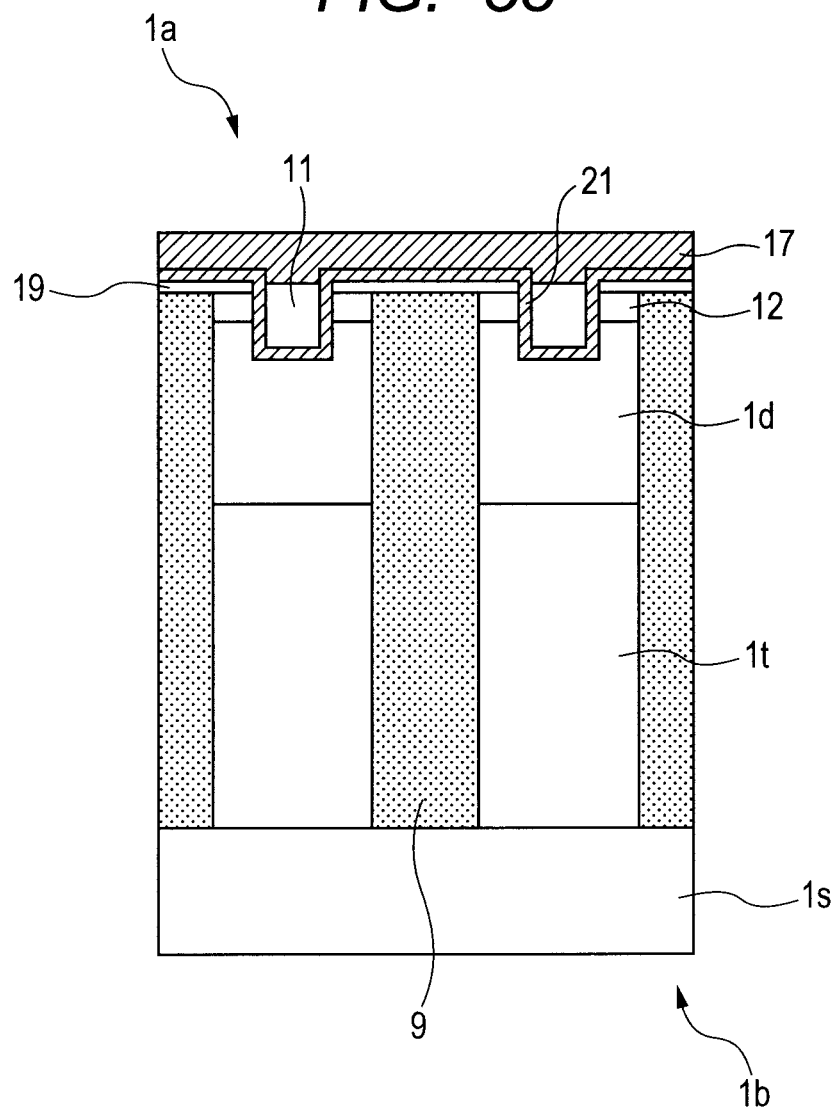
FIG. 58 is a device cross-sectional view (a step of forming an interlayer insulating film) illustrating the process flow (the trench power MOSFET which is a modification example of the first embodiment) corresponding to the device cross-section illustrated in FIG. 45.
Figure 59:
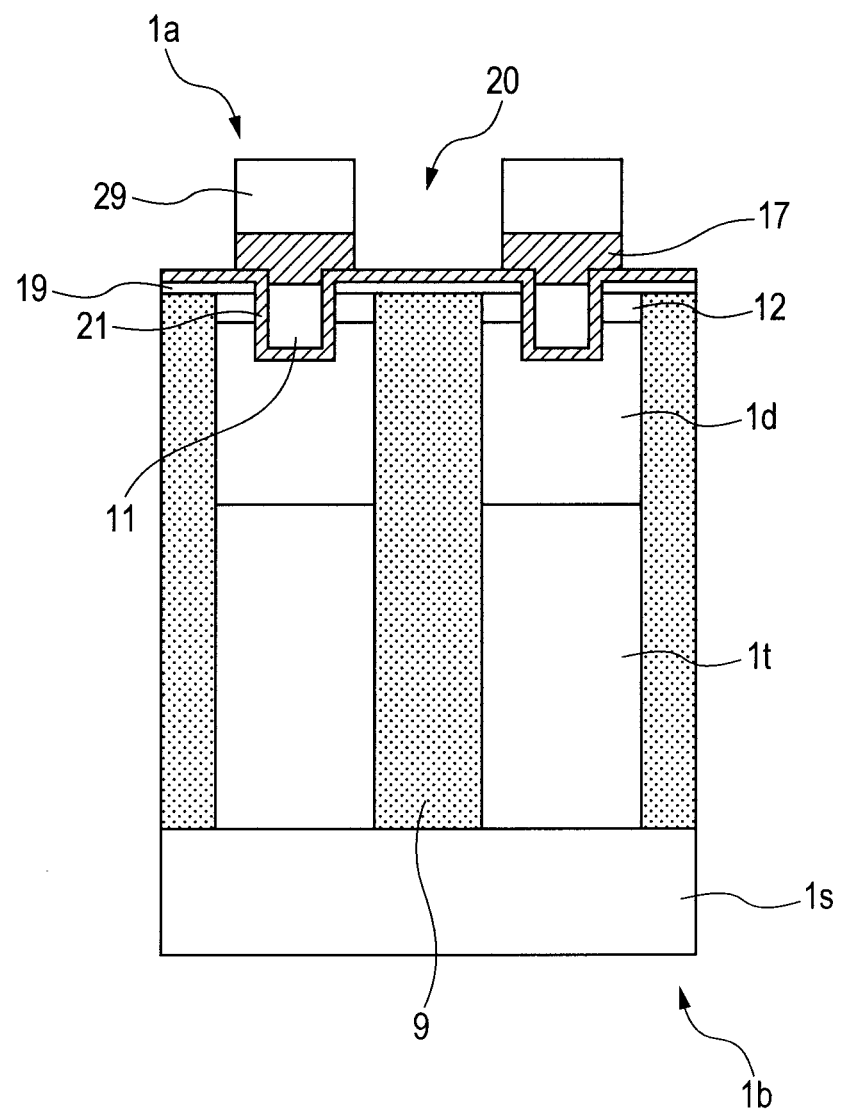
FIG. 59 is a device cross-sectional view (a step of forming a contact hole) illustrating the process flow (the trench power MOSFET which is a modification example of the first embodiment) corresponding to the device cross-section illustrated in FIG. 45.
Figure 60:
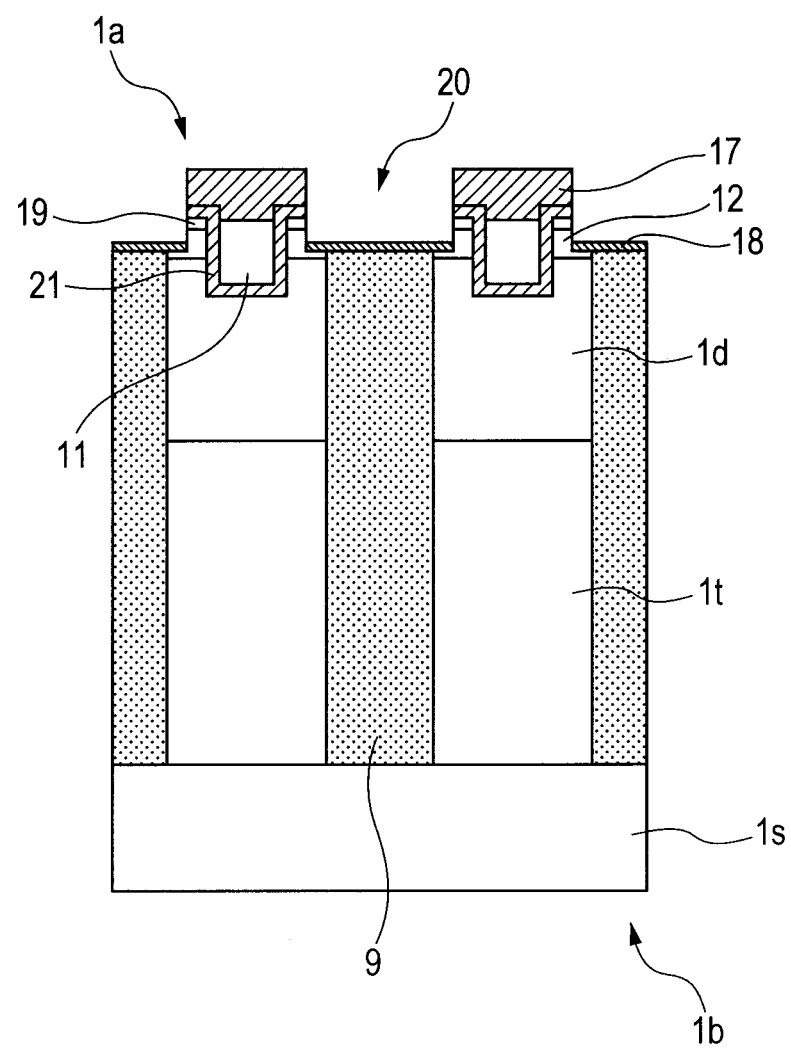
FIG. 60 is a device cross-sectional view (a step of introducing a P+ body contact region) illustrating the process flow (the trench power MOSFET which is a modification example of the first embodiment) corresponding to the device cross-section illustrated in FIG. 45.
Figure 61:
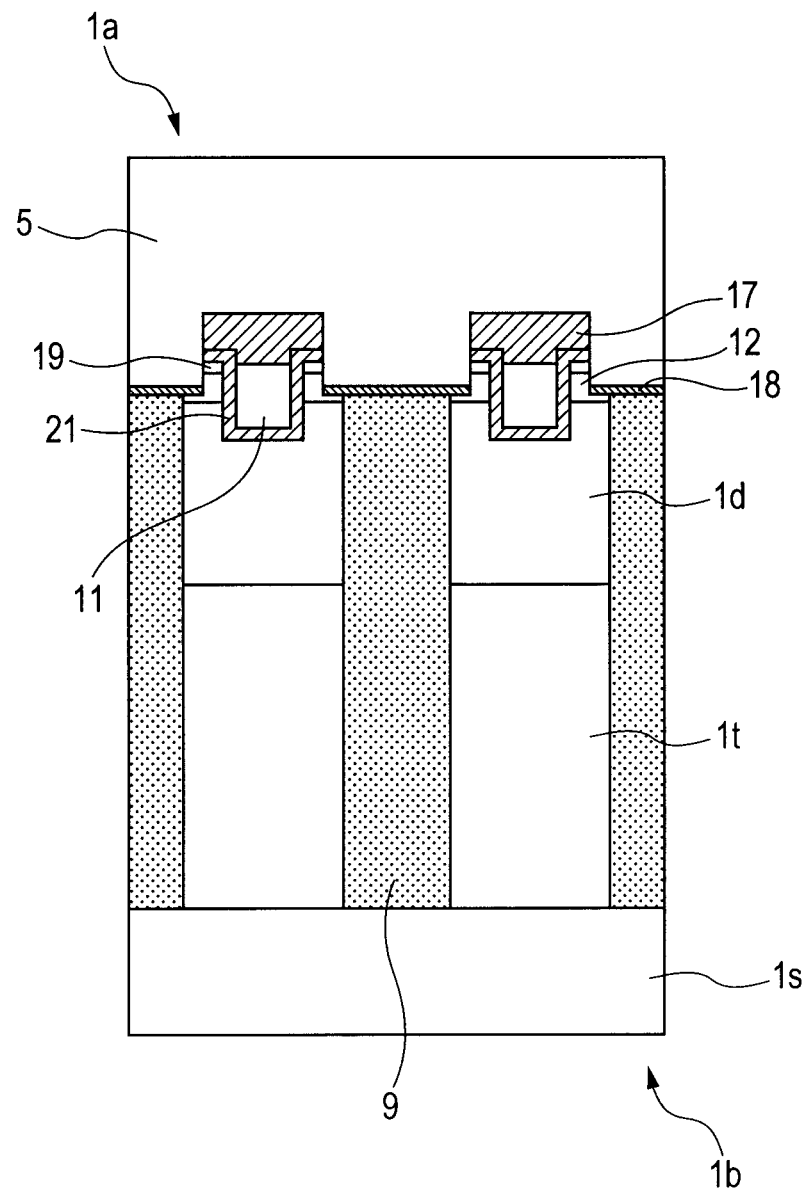
FIG. 61 is a device cross-sectional view (a step of forming an aluminum-based metal electrode) illustrating the process flow (the trench power MOSFET which is a modification example of the first embodiment) corresponding to the device cross-section illustrated in FIG. 45.

FIG. 46 is a device cross-sectional view (a step of patterning a hard mask film for opening a P-column trench) illustrating a process flow (a trench power MOSFET which is a modification example of the first embodiment) corresponding to the device cross-section illustrated in FIG. 45. FIG. 47 is a device cross-sectional view (a step of opening a P-column trench) illustrating a process flow (a trench power MOSFET which is a modification example of the first embodiment) corresponding to the device cross-section illustrated in FIG. 45. FIG. 48 is a device cross-sectional view (an epitaxy trench filling step) illustrating the process flow (the trench power MOSFET which is a modification example of the first embodiment) corresponding to the device cross-section illustrated in FIG. 45. FIG. 49 is a device cross-sectional view (a planarization step) illustrating the process flow (the trench power MOSFET which is a modification example of the first embodiment) corresponding to the device cross-section illustrated in FIG. 45. FIG. 50 is a device cross-sectional view (a step of removing an insulating film hard mask) illustrating the process flow (the trench power MOSFET which is a modification example of the first embodiment) corresponding to the device cross-section illustrated in FIG. 45. FIG. 51 is a device cross-sectional view (a step of forming an insulating film for trench etching) illustrating the process flow (the trench power MOSFET which is a modification example of the first embodiment) corresponding to the device cross-section illustrated in FIG. 45. FIG. 52 is a device cross-sectional view (a step of anisotropically etching back the insulating film for trench etching) illustrating the process flow (the trench power MOSFET which is a modification example of the first embodiment) corresponding to the device cross-section illustrated in FIG. 45. FIG. 53 is a device cross-sectional view (a gate trench etching step) illustrating the process flow (the trench power MOSFET which is a modification example of the first embodiment) corresponding to the device cross-section illustrated in FIG. 45. FIG. 54 is a device cross-sectional view (a gate oxidation step) illustrating the process flow (the trench power MOSFET which is a modification example of the first embodiment) corresponding to the device cross-section illustrated in FIG. 45. FIG. 55 is a device cross-sectional view (a step of forming a gate polysilicon film) illustrating the process flow (the trench power MOSFET which is a modification example of the first embodiment) corresponding to the device cross-section illustrated in FIG. 45. FIG. 56 is a device cross-sectional view (a step of patterning the gate polysilicon film) illustrating the process flow (the trench power MOSFET which is a modification example of the first embodiment) corresponding to the device cross-section illustrated in FIG. 45. FIG. 57 is a device cross-sectional view (a step of introducing an N+ source region) illustrating the process flow (the trench power MOSFET which is a modification example of the first embodiment) corresponding to the device cross-section illustrated in FIG. 45. FIG. 58 is a device cross-sectional view (a step of forming an interlayer insulating film) illustrating the process flow (the trench power MOSFET which is a modification example of the first embodiment) corresponding to the device cross-section illustrated in FIG. 45. FIG. 59 is a device cross-sectional view (a step of forming a contact hole) illustrating the process flow (the trench power MOSFET which is a modification example of the first embodiment) corresponding to the device cross-section illustrated in FIG. 45. FIG. 60 is a device cross-sectional view (a step of introducing a P+ body contact region) illustrating the process flow (the trench power MOSFET which is a modification example of the first embodiment) corresponding to the device cross-section illustrated in FIG. 45. FIG. 61 is a device cross-sectional view (a step of forming an aluminum-based metal electrode) illustrating the process flow (the trench power MOSFET which is a modification example of the first embodiment) corresponding to the device cross-section illustrated in FIG. 45. Based on these drawings, a description will next be made on the major part of the wafer process in the manufacturing method of the semiconductor device according to the first embodiment (modification example) of the present application.

As illustrated in FIG. 46, similar to FIGS. 7 and 22, a semiconductor wafer 1 is prepared by forming a phosphorus-doped N epitaxial layer 1$n$ (a region which will be a drift region in the device and has a concentration of the order of $10^{15}$/cm$^3$, more specifically, supposing that the N type lower-layer silicon epitaxial layer 1$t$ has a thickness of about 9 micrometer and a phosphorus concentration of about $3 \times 10^{15}$/cm$^3$, the N type upper-layer silicon epitaxial layer 1$d$ has a thickness of about 6 micrometer and a phosphorus concentration of about $4 \times 10^{15}$/cm$^3$) over an N+ silicon single crystal substrate is (for example, a 200ϕ wafer, but a wafer diameter may be any of 150ϕ, 300ϕ, or 450ϕ instead) having, for example, a thickness of about 15 micrometer and doped with antimony (for example, on the order of from $10^{18}$ to $10^{19}$/cm$^3$). Then, over the device surface 1$a$ (main surface opposite to the backside surface 1$b$) of the semiconductor wafer 1, a P-column trench forming hard mask film 22 made of, for example, P-TEOS (plasma-tetraethyl orthosilicate) is formed. The width Wn of the N-column region is, for example, about 2 micrometer, whilst the width Wp of the P-column region is for example about 1 micrometer (this means that the pitch of the super junction is about 3 micrometer).

As illustrated in FIG. 46, in the trench gate process, since the size of each member is smaller than that of the planar device, an introduction step of the P-body region 12 which imposes a heavy thermal burden is performed in the first stage. Ion implantation for introducing the P-body region 12 includes, for example, the following two steps. The first step is conducted for example at 200 keV and on the order of $10^{13}$/cm$^2$ and then, the second step is conducted, for example, at 75 keV and on the order of $10^{12}$/cm$^2$.

As illustrated in FIG. 47, the N epitaxial layer 1$n$ and the like are then subjected to anisotropic dry etching (in a gas atmosphere, for example, a mixed atmosphere of Ar, SF$_6$, O$_2$ and the like at an etching depth of, for example, about 18 micrometer) with the P-column trench forming hard mask 22 (for example, a CVD silicon oxide film having a thickness of about 1 micrometer) to form a P-column trench 23.

As illustrated in FIG. 48, trench filling epitaxial growth of the P-column trench 23 is then carried out to form a P type buried epitaxial layer 24 (having a boron concentration of, for example, about $5 \times 10^{15}$/cm$^3$). Examples of a raw material gas used for this trench filling epitaxial growth include silicon tetrachloride, trichlorosilane, dichlorosilane, and monosilane. A preferable range of the atmospheric pressure of this treatment is, for example, from 10 kPa to 110 kPa.

As illustrated in FIG. 49, a planarization step, for example, CMP (chemical mechanical polishing) with the P-column trench forming hard mask film 22 is performed to remove the P type buried epitaxial layer 24 outside the P-column trench 23 and at the same time, planarize the surface 1$a$ of the semiconductor wafer 1.

As illustrated in FIG. 50, the P-column trench forming hard mask 22 which becomes unnecessary is then removed by wet etching.

As illustrated in FIG. 51, a trench etch hard mask film 33 (for example, CVD silicon oxide film) is formed almost all over the main surface 1$a$ of the wafer 1.

As illustrated in FIG. 52, the trench etch hard mask film 33 is then subjected to anisotropic dry etching.

As illustrated in FIG. 53, anisotropic dry etching (in a mixed gas atmosphere for etching such as a mixture of argon, oxygen, SF$_6$, and the like) is performed to etch back the silicon substrate region of the main surface 1$a$ of the wafer 1 and at the same time, form a gate trench 34 (a linear trench for gate).

As illustrated in FIG. 54, the surface 1$a$ of the semiconductor wafer 1 is then thermally oxidized (for example, wet oxidized at 950° C.) to form a gate oxide film 21 (having a thickness of, for example, from about 20 to 100 nm).

As illustrated in FIG. 55, a gate polysilicon film 11 (having a thickness of, for example, about 800 nm) is formed over the gate oxide film 21, for example, by low-pressure CVD. Incidentally, as wafer washing prior to the gate oxidation, wet washing may be conducted by using, for example, a first washing liquid, that is, a 1:1:5 (volume ratio) mixture of ammonia, hydrogen peroxide, and pure water and a second washing liquid, that is, a 1:1:6 (volume ratio) mixture of hydrochloric acid, hydrogen peroxide, and pure water.

As illustrated in FIG. 56, patterning is then conducted by using anisotropic dry etching to obtain the gate electrode 11.

As illustrated in FIG. 57, an N+ source region introducing resist film is then formed by lithography as in Section 2 and with this film as a mask, ion implantation (for example, arsenic) is conducted to introduce an N+ source region 19, an N+ channel stopper region 8 in the chip edge portion (refer to FIG. 30 and the like), and the like (with a dopant, for example, arsenic at a dose of, for example, the order of $10^{15}/cm^2$ and an implantation energy of, for example, about 40 keV). The resist film which becomes unnecessary is then removed from the whole surface.

As illustrated in FIG. 58, a PSG (phospho-silicate-glass) film 17 (interlayer insulating film) is formed by CVD or the like over almost the entirety of the surface 1a of the semiconductor wafer 1 (an SOG film may be laid thereover to planarize the PSG film). Examples of a film usable as the interlayer insulating film 17 include, in addition to the PSG film, a BPSG film, a TEOS film, an SiN film, and the like, and a composite film thereof. The interlayer insulating film 17 has a total thickness of, for example, about 900 nm.

As illustrated in FIG. 59, a source-contact-hole opening resist film 29 is formed over the surface 1a of the semiconductor wafer 1 and with this film as a mask, dry etching is performed to make a source contact hole 20, a chip edge opening (refer to, for example, FIG. 32), and the like. Then the resist film 29 which becomes unnecessary is removed from the whole surface.

As illustrated in FIG. 60, with the patterned interlayer insulating film 17 as a mask, anisotropic dry etching of the substrate surface is then performed (for example, to a depth of about 0.3 micrometer) to form a recess region. A P+ body contact region 18 and an outermost P+ region 7 (refer to, for example, FIG. 33) are formed by ion implantation into this recess region. This ion implantation is performed, for example, under the following conditions: use of $BF_2$ as a dopant, implantation energy of about 30 keV, and a dose of the order of $10^5/cm^2$.

As illustrated in FIG. 61, an aluminum-based metal layer is formed via a barrier metal film such as TiW by sputtering, followed by patterning to form a metal-source electrode 5, a guard-ring electrode 3 (refer to, for example, FIG. 34), and the like.

If necessary, a final passivation film such as inorganic final passivation film or organic final passivation film is then overlaid and a pad opening and a gate opening are made therein. Examples of the final passivation film include a single-layer film such as inorganic final passivation film and an organic final passivation film, and a film stack obtained by stacking an organic final passivation film or the like over an inorganic final passivation film.

9. Description of a device structure (N/N− two-stage conventional epitaxy system) of a trench power MOSFET, which is a modification example of the semiconductor device according to the second embodiment of the present application (mainly FIG. 62). In this section, the active cell structure illustrated in FIG. 35 but having a trench gate will be described.

Figure 62:
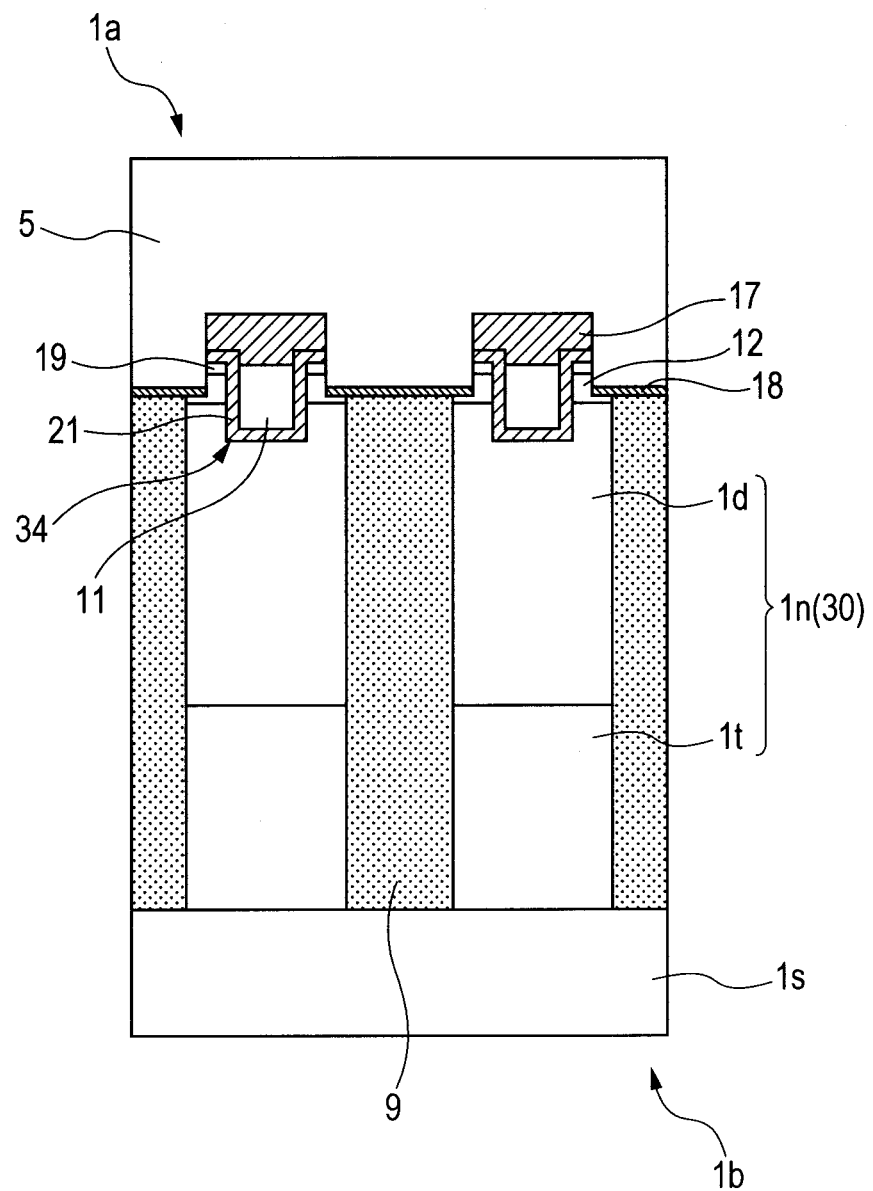
FIG. 62 is a device cross-sectional view (a trench power MOSFET which is a modification example of the second embodiment) corresponding to the B-B' cross-section of FIG. 1 and FIG. 2.

FIG. 62 is a device cross-sectional view (a trench power MOSFET which is a modification example of the second embodiment) corresponding to the B-B' cross-section of FIGS. 1 and 2. Based on this drawing, the device structure (N/N− two-stage conventional epitaxy system) of a trench power MOSFET, which is a modification example of the semiconductor device according to the second embodiment of the present application, will next be described.

In this example, as illustrated in FIG. 62, a linear polysilicon gate electrode 11 is embedded in a gate trench 34 (a linear trench for gate) via a gate insulating film 21. This trench gate structure is advantageous over the planar type (examples in the sections before Section 6) because it can easily realize low ON resistance. It is, on the other hand, disadvantageous in realizing a source-drain breakdown voltage in a range of from 500 to 600 V which is realized by the planar type.

10. Description of a device structure (N+/N/N− three-stage conventional epitaxy system) which is a modification example of the semiconductor device according to the third embodiment of the present application (mainly, FIG. 63). In this section, the active cell structure illustrated in FIG. 37 but having a trench gate will be described.

Figure 63:
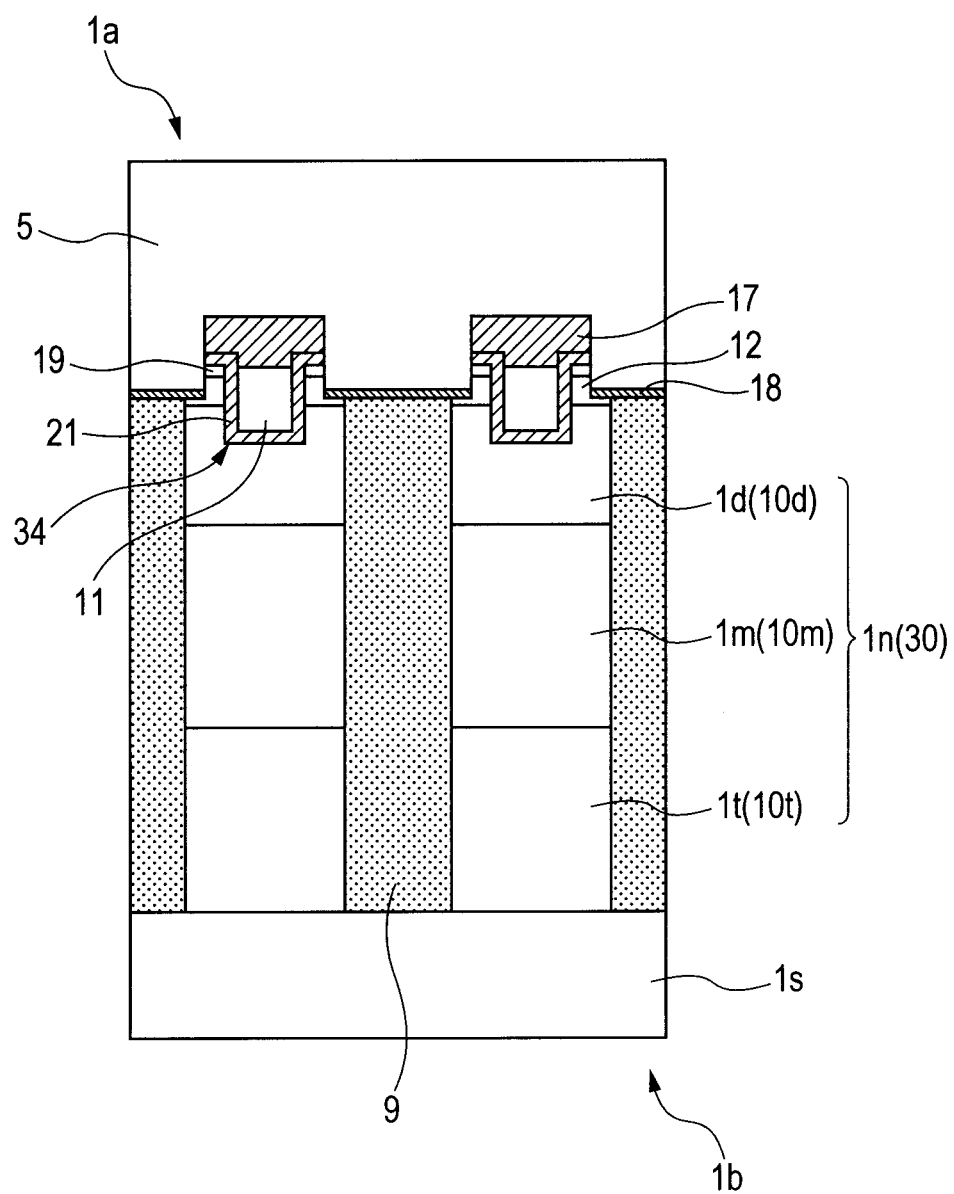
FIG. 63 is a device cross-sectional view (a trench power MOSFET which is a modification example of the third embodiment) corresponding to the B-B' cross-section of FIG. 1 and FIG. 2.

FIG. 63 is a device cross-sectional view (a trench power MOSFET which is a modification example of the third embodiment) corresponding to the B-B' cross-section of FIGS. 1 and 2. Based on this drawing, the device structure (N+/N/N− three-stage conventional epitaxy, system) which is a modification example of the semiconductor device according to the third embodiment of the present application will be described.

As illustrated in FIG. 63, in this example, a linear polysilicon gate electrode 11 is embedded in a gate trench 34 (a linear trench for gate) via a gate insulating film 21. This trench gate structure is advantageous over the planar type (examples described in the sections before Section 6) because it can easily realize low ON resistance. It is, on the other hand, disadvantageous in realizing a source-drain breakdown voltage in a range of from 500 to 600 V which is realized by the planar type.

11. Description of a device structure (upper-portion ion implanted N+/N conventional single epitaxy system) of a trench power MOSFET which is a modification example of the semiconductor device according to the fourth embodiment of the present application (mainly, FIG. 64). In this section, the active cell structure illustrated in FIG. 39 but having a trench gate will be described.

Figure 64:
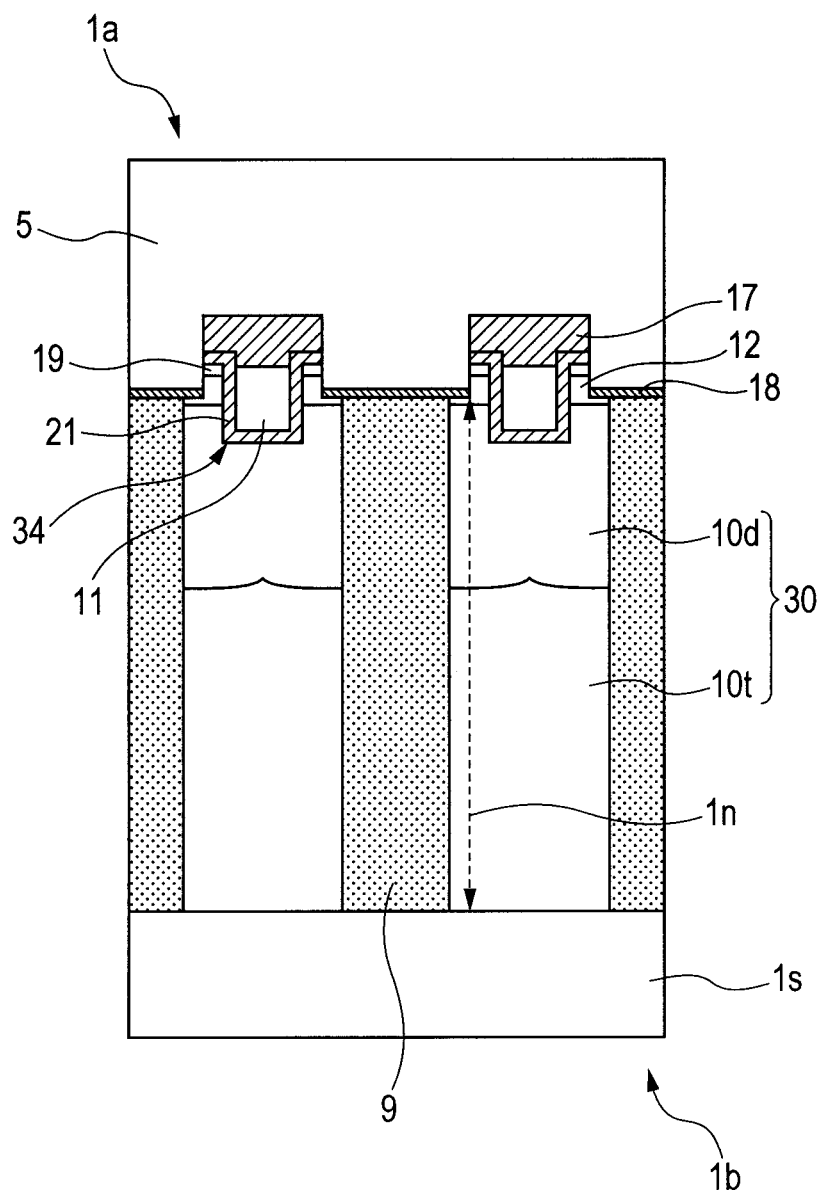
FIG. 64 is a device cross-sectional view (a trench power MOSFET which is a modification example of the fourth embodiment) corresponding to the B-B' cross-section of FIG. 1 and FIG. 2.

FIG. 64 is a device cross-sectional view (a trench power MOSFET which is a modification example of the fourth embodiment) corresponding to the B-B' cross-section of FIGS. 1 and 2. Based on this drawing, the device structure (upper-portion ion implanted N+/N conventional single epitaxy system) of a trench power MOSFET which is a modification example of the semiconductor device according to the fourth embodiment of the present application will be described.

As illustrated in FIG. 64, a linear polysilicon gate electrode 11 is embedded in a gate trench 34 (a linear trench for gate) via a gate insulating film 21. This trench gate structure is advantageous over the planar type (examples in the sections before Section 6) because it can easily realize low ON resistance. It is, on the other hand, disadvantageous in realizing a source-drain breakdown voltage in a range of from 500 to 600 V which is realized by the planar type.

12. Summary: The present invention made by the present inventors was described specifically based on embodiments. However, it is needless to say that the present invention is not limited to them, but can be changed without departing from the scope of the present invention.

In the above embodiments, MOSFETs are placed in the form of stripes parallel to pn columns, but they may be placed in the direction perpendicular to the pn columns or in the matrix form.

In the above embodiments, an N channel device mainly formed over the upper surface of an N epitaxial layer over an N+ silicon single crystal substrate was described specifically. The present invention is not limited thereto, but may be a P channel device formed over the upper surface of an N epitaxial layer over a P+ silicon single crystal substrate.

In the above embodiments, a specific description was made with a power MOSFET as an example. Needless to say that the present invention is not limited thereto but can be applied to an IBGT (insulated gate bipolar transistor) power device having a super junction structure, that is, diode, bipolar transistor, or the like. It is also needless to say that the present invention can be applied to a semiconductor integrated circuit device or the like having such a power MOSFET, diode, bipolar transistor or the like.

Further, in the above embodiments, a trench filling system was mainly described specifically as a formation method of a super junction structure. It is however needless to say that the present invention is not limited thereto but a multi-epitaxial system can also be employed therefor.

The invention claimed is:

1. A semiconductor device comprising:
   (a) a semiconductor chip having a first main surface and a second main surface and including a power MOSFET;
   (b) a source electrode of the power MOSFET provided on the side of the first main surface of the semiconductor chip;
   (c) a drift region of the power MOSFET provided in the surface of the semiconductor chip on the first main surface side and having a first conductivity type;
   (d) a plurality of trenches penetrating through the drift region from the first main surface side of the semiconductor chip;
   (e) a plurality of second conductivity type column regions embedded in the trenches by epitaxial growth, respectively, and having a second conductivity type opposite to the first conductivity type; and
   (f) a plurality of first conductivity type column regions provided between the second conductivity type column regions, constituting a super junction structure together with the second conductivity type column regions, and having the first conductivity type;
   wherein each of the first conductivity type column regions comprises:
   (f1) a lower layer region having a first impurity concentration;
   (f2) an upper layer region present between the lower layer region and the first main surface and having a second impurity concentration higher than the first impurity concentration; and
   (f3) a middle layer region present between the lower layer region and the upper layer region and having a third impurity concentration between the first impurity concentration and the second impurity concentration, and wherein the drift region is a conventional epitaxial layer.

2. The semiconductor device according to claim 1, wherein supposing that the first conductivity type column region is a single region, the first impurity concentration is a concentration at which the second conductivity type column region and the first conductivity type column region keep a charge balance.

3. The semiconductor device according to claim 2, wherein the thickness of the lower layer region is greater than the thickness of the upper layer region.

4. The semiconductor device according to claim 1, wherein supposing that the first conductivity type column region is a single region, the first impurity concentration is lower than a concentration at which the second conductivity type column region and the first conductivity type column region keep a charge balance.

5. The semiconductor device according to claim 4, wherein the thickness of the lower layer region is smaller than the thickness of the upper layer region.

6. The semiconductor device according to claim 1, wherein the concentration of the upper layer region is increased by implanting therein impurity ions having the first conductivity type.

7. The semiconductor device according to claim 1, wherein the semiconductor chip has a silicon-based member as a principal constituent.

8. The semiconductor device according to claim 7, wherein the first conductivity type is an N type.

9. The semiconductor device according to claim 8, wherein the semiconductor chip constitutes a simple or composite power active device.

10. The semiconductor device according to claim 9, wherein the semiconductor chip constitutes a simple power MOSFET device.

11. The semiconductor device according to claim 10, wherein the power MOSFET is a planar type.

12. The semiconductor device according to claim 11, further comprising:
    (g) a second conductivity type body region formed in the surface region of the drift region on the first main surface side of the semiconductor chip, having the second conductivity type, and constituting a channel region of the power MOSFET;
    (h) a gate insulating film formed over the surface of the second conductivity type body region on the first main surface side of the semiconductor chip; and
    (i) a gate electrode formed on a side opposite to the second conductivity body region with the gate insulating film therebetween and having a polysilicon film as a main constituent.

13. The semiconductor device according to claim 12, wherein the second conductivity type column region has an inverted trapezoidal shape wider on the first main surface side.

14. The semiconductor device according to claim 10, wherein the power MOSFET is a trench type.

15. The semiconductor device according to claim 14, wherein the second conductivity type body region is introduced prior to the formation of the polysilicon film.

16. A semiconductor device comprising:
    (a) a semiconductor chip having a first main surface and a second main surface and including a power MOSFET;
    (b) a source electrode of the power MOSFET provided on the first main surface side of the semiconductor chip;
    (c) a drift region of the power MOSFET provided in the surface on the first main surface side of the semiconductor chip and having a first conductivity type;
    (d) a plurality of second conductivity type column regions penetrating through the drift region from the first main surface side of the semiconductor chip and having a second conductivity type opposite to the first conductivity type;
    (e) a plurality of first conductivity type column regions provided between the second conductivity type column regions, constituting a super junction structure together with the second conductivity type column regions, and having the first conductivity type;
    (f) a second conductivity type body region formed in the surface region of the drift region on the first main surface side of the semiconductor chip, having the second conductivity type, and constituting a channel region of the power MOSFET;
    (g) a gate insulating film formed over the surface of the second conductivity type body region on the first main surface side of the semiconductor chip; and (h) a gate electrode formed on a side opposite to the second conductivity type body region with the gate insulating film therebetween and having a polysilicon film as a main constituent, wherein the second conductivity type body region is introduced prior to the formation of the polysilicon film, Wherein the second conductivity type body region is introduced prior to the formation of the polysilicon film, and the first conductivity type column regions each comprising:

(e1) a lower layer region having a first impurity concentration;

(e2) an upper layer region present between the lower layer region and the first main surface and having a second impurity concentration higher than the first impurity concentration; and (e3) a middle layer region present between the lower layer region and the upper layer region and having a third impurity concentration between the first impurity concentration and the second impurity concentration.

17. The semiconductor device according to claim 16, wherein the drift region is a conventional epitaxial layer

* * * * *